(12) United States Patent
Rawlins et al.

(10) Patent No.: US 9,705,540 B2
(45) Date of Patent: Jul. 11, 2017

(54) CONTROL OF MISO NODE

(71) Applicant: ParkerVision, Inc., Jacksonville, FL (US)

(72) Inventors: Gregory S. Rawlins, Chuluota, FL (US); David F. Sorrells, Middleburg, FL (US)

(73) Assignee: PARKER VISION, INC., Jacksonville, FL (US)

( * ) Notice: Subject to any disclaimer, the term of this patent is extended or adjusted under 35 U.S.C. 154(b) by 192 days.

(21) Appl. No.: 14/753,470

(22) Filed: Jun. 29, 2015

(65) Prior Publication Data

US 2015/0326259 A1 Nov. 12, 2015

Related U.S. Application Data

(63) Continuation of application No. 13/891,316, filed on May 10, 2013, now Pat. No. 9,094,085, which is a continuation of application No. 12/628,510, filed on Dec. 1, 2009, now Pat. No. 8,461,924, which is a continuation of application No. 12/142,521, filed on Jun. 19, 2008, now Pat. No. 8,013,675.

(60) Provisional application No. 60/929,239, filed on Jun. 19, 2007, provisional application No. 60/929,584, filed on Jul. 3, 2007.

(51) Int. Cl.
*H04B 1/04* (2006.01)
*H03F 1/02* (2006.01)
*H03F 3/60* (2006.01)
*H04B 1/16* (2006.01)

(52) U.S. Cl.
CPC ......... *H04B 1/0475* (2013.01); *H03F 1/0294* (2013.01); *H03F 3/602* (2013.01); *H04B 1/16* (2013.01)

(58) Field of Classification Search
CPC .............................. H04B 1/0475; H03F 3/602
USPC ..................................................... 330/147, 10
See application file for complete search history.

(56) References Cited

U.S. PATENT DOCUMENTS 1,882,119 A 10/1932 Chireix
1,946,308 A 2/1934 Chireix
(Continued)

FOREIGN PATENT DOCUMENTS

EP 0 011 464 A2 5/1980
EP 0 471 346 A1 8/1990
(Continued)

OTHER PUBLICATIONS

"Ampliphase AM transmission system," *ABU Technical Review*, No. 33, p. 10-18 (Jul. 1974).
(Continued)

*Primary Examiner* — Patricia T Nguyen
(74) *Attorney, Agent, or Firm* — Thomas F. Presson

(57) ABSTRACT

A method for generating a radio frequency (RF) signal is disclosed herein. The method includes generating, with a plurality of analog-to-digital converters, analog control signals. A modulated control signal is generated, using a modulator, based on the analog control signals. A biased modulated control signal is generated, using an amplifier, based on the modulated control signal and a first bias control signal. Further, the RF signal is generated, using a multiple-input-single-output (MISO) device, based on the biased modulated control signal and a second bias control signal.

20 Claims, 42 Drawing Sheets

(56) References Cited

U.S. PATENT DOCUMENTS

| | | |
|---|---|---|
| 2,116,667 A | 5/1938 | Chireix |
| 2,210,028 A | 8/1940 | Doherty |
| 2,220,201 A | 11/1940 | Bliss |
| 2,269,518 A | 1/1942 | Chireix et al. |
| 2,282,706 A | 5/1942 | Chireix et al. |
| 2,282,714 A | 5/1942 | Fagot |
| 2,294,800 A | 9/1942 | Price |
| 2,508,524 A | 5/1950 | Lang |
| 2,529,073 A | 11/1950 | Chireix |
| 2,555,039 A | 5/1951 | Bissonette |
| 2,591,749 A | 4/1952 | Villemagne |
| 2,670,404 A | 2/1954 | Chireix |
| 2,677,806 A | 5/1954 | Chireix |
| 2,714,634 A | 8/1955 | Hall |
| 2,734,100 A | 2/1956 | Kendall |
| 2,857,591 A | 10/1958 | Nagel |
| 2,890,280 A | 6/1959 | Feyzeau |
| 2,908,753 A | 10/1959 | Ernyei et al. |
| 2,938,945 A | 5/1960 | France |
| 2,963,933 A | 12/1960 | Bereskin |
| 2,964,622 A | 12/1960 | Fire |
| 2,968,697 A | 1/1961 | Rager, Jr. |
| 3,056,017 A | 9/1962 | Peras |
| 3,078,456 A | 2/1963 | Alpers |
| 3,121,198 A | 2/1964 | Potter |
| 3,154,782 A | 10/1964 | Kagawa et al. |
| 3,170,127 A | 2/1965 | Cramer |
| 3,176,060 A | 3/1965 | Bissonette et al. |
| 3,212,008 A | 10/1965 | Kahn |
| 3,219,862 A | 11/1965 | Kieffert |
| 3,263,019 A | 7/1966 | Hurvitz |
| 3,341,697 A | 9/1967 | Kaufman et al. |
| 3,413,570 A | 11/1968 | Bruene et al. |
| 3,418,595 A | 12/1968 | Loewenstern, Jr. |
| 3,436,686 A | 4/1969 | Vackar |
| 3,437,945 A | 4/1969 | Duncan |
| 3,458,816 A | 7/1969 | O'Brien |
| 3,493,718 A | 2/1970 | Kestner et al. |
| 3,513,352 A | 5/1970 | Souillard |
| 3,525,941 A | 8/1970 | Smith |
| 3,544,697 A | 12/1970 | Munch, Jr. |
| 3,651,429 A | 3/1972 | Ruthroff |
| 3,697,692 A | 10/1972 | Hafler |
| 3,716,730 A | 2/1973 | Cerny, Jr. |
| 3,777,275 A | 12/1973 | Cox |
| 3,789,314 A | 1/1974 | Beurrier |
| 3,815,040 A | 6/1974 | Seidel |
| 3,852,530 A | 12/1974 | Shen |
| 3,852,669 A | 12/1974 | Bowman et al. |
| 3,895,304 A | 7/1975 | Klein |
| 3,896,395 A | 7/1975 | Cox |
| 3,906,390 A | 9/1975 | Rollett |
| 3,909,742 A | 9/1975 | Cox et al. |
| 3,927,379 A | 12/1975 | Cox et al. |
| 3,936,819 A | 2/1976 | Angelle et al. |
| 3,991,343 A | 11/1976 | Delpy |
| 4,090,147 A | 5/1978 | Seidel |
| 4,095,196 A | 6/1978 | Seidel |
| 4,104,946 A | 8/1978 | Peterson |
| 4,151,517 A | 4/1979 | Kelley |
| 4,178,557 A | 12/1979 | Henry |
| 4,229,715 A | 10/1980 | Henry |
| 4,301,490 A | 11/1981 | Nagel et al. |
| 4,346,354 A | 8/1982 | Hanna |
| 4,378,530 A | 3/1983 | Garde |
| 4,433,312 A | 2/1984 | Kahn |
| 4,439,744 A | 3/1984 | Kumar et al. |
| 4,441,080 A | 4/1984 | Saari |
| 4,446,440 A | 5/1984 | Bell |
| 4,485,357 A | 11/1984 | Voorman |
| 4,509,017 A | 4/1985 | Andren et al. |
| 4,511,813 A | 4/1985 | Pan |
| 4,580,111 A | 4/1986 | Swanson |
| 4,584,541 A | 4/1986 | Nossen |
| 4,605,902 A | 8/1986 | Harrington |
| 4,628,286 A | 12/1986 | Nossen |
| 4,682,119 A | 7/1987 | Michel |
| 4,682,149 A | 7/1987 | Larson |
| 4,686,448 A | 8/1987 | Jones et al. |
| 4,687,999 A | 8/1987 | Desperben et al. |
| 4,701,716 A | 10/1987 | Poole |
| 4,717,894 A | 1/1988 | Edwards et al. |
| 4,743,858 A | 5/1988 | Everard |
| 4,780,803 A | 10/1988 | Dede Garcia-Santamaria |
| 4,816,783 A | 3/1989 | Leitch |
| 4,817,116 A | 3/1989 | Akaiwa et al. |
| 4,873,492 A | 10/1989 | Myer |
| 4,951,303 A | 8/1990 | Larson |
| 4,974,236 A | 11/1990 | Gurcan et al. |
| 4,995,055 A | 2/1991 | Weinberger et al. |
| 5,005,419 A | 4/1991 | O'Donnell et al. |
| 5,012,200 A | 4/1991 | Meinzer |
| 5,017,888 A | 5/1991 | Meinzer |
| 5,077,539 A | 12/1991 | Howatt |
| 5,081,673 A | 1/1992 | Engelke et al. |
| 5,093,636 A | 3/1992 | Higgins, Jr. et al. |
| 5,115,203 A | 5/1992 | Krett et al. |
| 5,124,665 A | 6/1992 | McGann |
| 5,164,678 A | 11/1992 | Puri et al. |
| 5,214,670 A | 5/1993 | Ballatore |
| 5,229,735 A | 7/1993 | Quan |
| 5,239,275 A | 8/1993 | Leitch |
| 5,239,686 A | 8/1993 | Downey |
| 5,264,807 A | 11/1993 | Okubo et al. |
| 5,287,069 A | 2/1994 | Okubo et al. |
| 5,302,914 A | 4/1994 | Arntz et al. |
| 5,304,943 A | 4/1994 | Koontz |
| 5,307,069 A | 4/1994 | Evans |
| 5,345,189 A | 9/1994 | Hornak et al. |
| 5,351,288 A | 9/1994 | Engelke et al. |
| 5,365,187 A | 11/1994 | Hornak et al. |
| 5,365,190 A | 11/1994 | Yu et al. |
| 5,404,114 A | 4/1995 | Sager |
| 5,410,280 A | 4/1995 | Linguet et al. |
| 5,420,541 A | 5/1995 | Upton et al. |
| 5,426,641 A | 6/1995 | Afrashteh et al. |
| 5,432,473 A | 7/1995 | Mattila et al. |
| 5,438,591 A | 8/1995 | Oie et al. |
| 5,438,684 A | 8/1995 | Schwent et al. |
| 5,485,120 A | 1/1996 | Anvari |
| 5,490,172 A | 2/1996 | Komara |
| 5,495,500 A | 2/1996 | Jovanovich et al. |
| 5,508,657 A | 4/1996 | Behan |
| 5,515,068 A | 5/1996 | Uragami et al. |
| 5,530,722 A | 6/1996 | Dent |
| 5,532,592 A * | 7/1996 | Colclough ......... G01R 33/0356 324/248 |
| 5,541,554 A | 7/1996 | Stengel et al. |
| 5,554,865 A | 9/1996 | Larson |
| 5,559,471 A | 9/1996 | Black |
| 5,568,088 A | 10/1996 | Dent et al. |
| 5,574,967 A | 11/1996 | Dent et al. |
| 5,574,992 A | 11/1996 | Cygan et al. |
| 5,612,651 A | 3/1997 | Chethik |
| 5,621,351 A | 4/1997 | Puri et al. |
| 5,631,604 A | 5/1997 | Dent et al. |
| RE35,536 E | 6/1997 | Irissou et al. |
| 5,638,024 A | 6/1997 | Dent et al. |
| 5,678,208 A | 10/1997 | Kowalewski et al. |
| 5,694,433 A | 12/1997 | Dent |
| 5,697,074 A | 12/1997 | Makikallio et al. |
| 5,710,520 A | 1/1998 | Frey |
| 5,719,527 A | 2/1998 | Bateman et al. |
| 5,724,005 A | 3/1998 | Chen et al. |
| 5,732,334 A | 3/1998 | Miyake |
| 5,739,723 A | 4/1998 | Sigmon et al. |
| 5,757,229 A | 5/1998 | Mitzlaff |
| 5,764,704 A | 6/1998 | Shenoi |
| 5,767,750 A | 6/1998 | Yamaji |
| 5,770,971 A | 6/1998 | McNicol |
| 5,784,412 A | 7/1998 | Ichihara |
| 5,784,689 A | 7/1998 | Kobayashi |
| 5,786,727 A | 7/1998 | Sigmon |
| 5,792,956 A | 8/1998 | Li |

(56) References Cited

U.S. PATENT DOCUMENTS

| | | |
|---|---|---|
| 5,805,640 A | 9/1998 | O'Dea et al. |
| 5,815,531 A | 9/1998 | Dent |
| 5,835,128 A | 11/1998 | Macdonald et al. |
| 5,841,876 A | 11/1998 | Gifford et al. |
| 5,854,571 A | 12/1998 | Pinckley et al. |
| 5,862,460 A | 1/1999 | Rich |
| 5,872,481 A | 2/1999 | Sevic et al. |
| 5,877,643 A | 3/1999 | Drogi |
| 5,880,633 A | 3/1999 | Leizerovich et al. |
| 5,886,573 A | 3/1999 | Kolanek |
| 5,886,575 A | 3/1999 | Long |
| 5,890,051 A | 3/1999 | Schlang et al. |
| 5,892,394 A | 4/1999 | Wu |
| 5,892,395 A | 4/1999 | Stengel et al. |
| 5,901,346 A | 5/1999 | Stengel et al. |
| 5,903,854 A | 5/1999 | Abe et al. |
| 5,933,766 A | 8/1999 | Dent |
| 5,949,283 A | 9/1999 | Proctor et al. |
| 5,952,947 A | 9/1999 | Nussbaum et al. |
| 5,956,097 A | 9/1999 | Nguyen et al. |
| 5,963,091 A | 10/1999 | Chen et al. |
| 5,973,559 A | 10/1999 | Alberty |
| 5,973,568 A | 10/1999 | Shapiro et al. |
| 5,974,041 A | 10/1999 | Kornfeld et al. |
| 5,990,734 A | 11/1999 | Wright et al. |
| 5,990,738 A | 11/1999 | Wright et al. |
| 5,999,046 A | 12/1999 | Kotzamanis |
| 6,011,830 A | 1/2000 | Sasin et al. |
| 6,026,286 A | 2/2000 | Long |
| 6,028,485 A | 2/2000 | Sigmon et al. |
| 6,043,707 A | 3/2000 | Budnik |
| 6,054,894 A | 4/2000 | Wright et al. |
| 6,054,896 A | 4/2000 | Wright et al. |
| 6,057,798 A | 5/2000 | Burrier et al. |
| 6,069,525 A | 5/2000 | Sevic et al. |
| 6,072,361 A | 6/2000 | Myers et al. |
| 6,085,074 A | 7/2000 | Cygan |
| 6,097,252 A | 8/2000 | Sigmon et al. |
| 6,104,991 A | 8/2000 | Newland et al. |
| 6,111,461 A | 8/2000 | Matsuno |
| 6,111,462 A | 8/2000 | Mucenieks et al. |
| 6,115,368 A | 9/2000 | Schilling |
| 6,125,266 A | 9/2000 | Matero et al. |
| 6,130,910 A | 10/2000 | Anderson et al. |
| 6,130,916 A | 10/2000 | Thomson |
| 6,133,788 A | 10/2000 | Dent |
| 6,133,789 A | 10/2000 | Braithwaite |
| 6,137,355 A | 10/2000 | Sevic et al. |
| 6,147,553 A | 11/2000 | Kolanek |
| 6,154,093 A | 11/2000 | Chen et al. |
| 6,157,253 A | 12/2000 | Sigmon et al. |
| 6,169,455 B1 | 1/2001 | Yamaguchi |
| 6,175,747 B1 | 1/2001 | Tanishima et al. |
| 6,181,199 B1 | 1/2001 | Camp, Jr. et al. |
| 6,188,277 B1 | 2/2001 | Borodulin et al. |
| 6,198,416 B1 | 3/2001 | Velazquez |
| 6,201,452 B1 | 3/2001 | Dent et al. |
| 6,204,735 B1 | 3/2001 | Cairns |
| 6,215,354 B1 | 4/2001 | Kolanek et al. |
| 6,232,835 B1 | 5/2001 | Braithwaite |
| 6,232,838 B1 | 5/2001 | Sugimoto |
| 6,236,688 B1 | 5/2001 | Ohta et al. |
| 6,242,975 B1 | 6/2001 | Eidson et al. |
| 6,246,286 B1 | 6/2001 | Persson |
| 6,246,599 B1 | 6/2001 | Jang et al. |
| 6,252,461 B1 | 6/2001 | Raab |
| 6,256,482 B1 | 7/2001 | Raab |
| 6,259,320 B1 | 7/2001 | Valk et al. |
| 6,285,251 B1 | 9/2001 | Dent et al. |
| 6,292,054 B1 | 9/2001 | Ma et al. |
| 6,295,442 B1 | 9/2001 | Camp, Jr. et al. |
| 6,300,828 B1 | 10/2001 | McInnis |
| 6,304,545 B1 | 10/2001 | Armbruster et al. |
| 6,307,894 B2 | 10/2001 | Eidson et al. |
| 6,311,045 B1 | 10/2001 | Domokos |
| 6,311,046 B1 | 10/2001 | Dent |
| 6,313,703 B1 | 11/2001 | Wright et al. |
| 6,337,599 B2 | 1/2002 | Lee |
| 6,342,812 B1 | 1/2002 | Abdollahian et al. |
| 6,349,216 B1 | 2/2002 | Alberth, Jr. et al. |
| 6,351,189 B1 | 2/2002 | Hirvilampi |
| 6,359,506 B1 | 3/2002 | Camp, Jr. et al. |
| 6,359,508 B1 | 3/2002 | Mucenieks |
| 6,359,513 B1 | 3/2002 | Kuo et al. |
| 6,366,177 B1 | 4/2002 | McCune et al. |
| 6,369,651 B1 | 4/2002 | Dent |
| 6,373,901 B1 | 4/2002 | O'Dea et al. |
| 6,373,902 B1 | 4/2002 | Park et al. |
| 6,374,092 B1 | 4/2002 | Leizerovich et al. |
| 6,380,802 B1 | 4/2002 | Pehike et al. |
| 6,384,680 B1 | 5/2002 | Takei et al. |
| 6,384,681 B1 | 5/2002 | Bonds |
| 6,385,439 B1 | 5/2002 | Hellberg |
| 6,388,513 B1 | 5/2002 | Wright et al. |
| 6,392,483 B2 | 5/2002 | Suzuki et al. |
| 6,396,341 B1 | 5/2002 | Pehlke |
| 6,396,347 B1 | 5/2002 | Lie et al. |
| 6,404,823 B1 | 6/2002 | Grange et al. |
| 6,407,635 B2 | 6/2002 | Mucenieks et al. |
| 6,411,655 B1 | 6/2002 | Holden et al. |
| 6,421,389 B1 | 7/2002 | Jett et al. |
| 6,424,216 B2 | 7/2002 | Mu et al. |
| 6,434,122 B2 | 8/2002 | Barabash et al. |
| 6,437,644 B1 | 8/2002 | Kenington |
| 6,449,465 B1 | 9/2002 | Gailus et al. |
| 6,452,446 B1 | 9/2002 | Eisenberg et al. |
| 6,459,334 B2 | 10/2002 | Wright et al. |
| 6,459,337 B1 | 10/2002 | Goren et al. |
| 6,462,617 B1 | 10/2002 | Kim |
| 6,469,581 B1 | 10/2002 | Kobayashi |
| 6,470,431 B2 | 10/2002 | Nicosia et al. |
| 6,472,934 B1 | 10/2002 | Pehlke |
| 6,472,937 B1 | 10/2002 | Gerard et al. |
| 6,476,670 B1 | 11/2002 | Wright et al. |
| 6,496,062 B1 | 12/2002 | Nitz et al. |
| 6,501,331 B2 | 12/2002 | Adar |
| 6,504,428 B2 | 1/2003 | Cova et al. |
| 6,504,447 B1 | 1/2003 | Laney et al. |
| 6,507,731 B1 | 1/2003 | Hasegawa |
| 6,510,309 B1 | 1/2003 | Thompson et al. |
| 6,510,310 B1 | 1/2003 | Muralidharan |
| 6,512,416 B2 | 1/2003 | Burns et al. |
| 6,522,194 B1 | 2/2003 | Pehlke |
| 6,522,198 B2 | 2/2003 | Ahn |
| 6,522,201 B1 | 2/2003 | Hsiao et al. |
| 6,525,605 B2 | 2/2003 | Hu et al. |
| 6,529,773 B1 | 3/2003 | Dewan |
| 6,531,935 B1 | 3/2003 | Russat et al. |
| 6,535,060 B2 | 3/2003 | Goren et al. |
| 6,538,509 B2 | 3/2003 | Ren |
| 6,538,793 B2 | 3/2003 | Rosenberg et al. |
| 6,545,535 B2 | 4/2003 | Andre |
| 6,552,634 B1 | 4/2003 | Raab |
| 6,566,944 B1 | 5/2003 | Pehlke et al. |
| 6,577,199 B2 | 6/2003 | Dent |
| 6,577,691 B2 | 6/2003 | Richards et al. |
| 6,583,679 B1 | 6/2003 | Cox et al. |
| 6,583,739 B1 | 6/2003 | Kenington |
| 6,586,995 B1 | 7/2003 | Tachibana |
| 6,587,010 B2 | 7/2003 | Wagh et al. |
| 6,587,511 B2 | 7/2003 | Barak et al. |
| 6,587,514 B1 | 7/2003 | Wright et al. |
| 6,587,913 B2 | 7/2003 | Campanale et al. |
| 6,593,806 B1 | 7/2003 | Melanson |
| 6,600,368 B2 | 7/2003 | Kim |
| 6,603,352 B2 | 8/2003 | Wight |
| 6,606,483 B1 | 8/2003 | Baker et al. |
| 6,614,854 B1 | 9/2003 | Chow et al. |
| 6,622,198 B2 | 9/2003 | Jones, Jr. |
| 6,624,694 B2 | 9/2003 | Ma et al. |
| 6,633,200 B2 | 10/2003 | Kolanek |
| 6,636,112 B1 | 10/2003 | McCune |
| 6,637,030 B1 | 10/2003 | Klein |
| 6,646,505 B2 | 11/2003 | Anderson |

(56) References Cited

U.S. PATENT DOCUMENTS

| | | |
|---|---|---|
| 6,647,073 B2 | 11/2003 | Tapio |
| 6,653,896 B2 | 11/2003 | Sevic et al. |
| 6,672,167 B2 | 1/2004 | Buell et al. |
| 6,674,326 B1 | 1/2004 | Hiramoto et al. |
| 6,678,041 B2 | 1/2004 | Kimura et al. |
| 6,681,101 B1 | 1/2004 | Eidson et al. |
| 6,683,918 B2 | 1/2004 | Jackson et al. |
| 6,690,232 B2 | 2/2004 | Ueno et al. |
| 6,690,233 B2 | 2/2004 | Sander |
| 6,697,436 B1 | 2/2004 | Wright et al. |
| 6,697,603 B1 | 2/2004 | Lovinggood et al. |
| 6,700,440 B2 | 3/2004 | Hareyama |
| 6,700,441 B1 | 3/2004 | Zhang et al. |
| 6,700,453 B2 | 3/2004 | Heiskala et al. |
| 6,701,419 B2 | 3/2004 | Tomaiuolo et al. |
| 6,707,338 B2 | 3/2004 | Kenington et al. |
| 6,714,776 B1 | 3/2004 | Birleson |
| 6,724,252 B2 | 4/2004 | Ngo et al. |
| 6,735,424 B1 | 5/2004 | Larson et al. |
| 6,737,914 B2 | 5/2004 | Gu |
| 6,737,916 B2 | 5/2004 | Luu |
| 6,741,840 B2 | 5/2004 | Nagode et al. |
| 6,741,867 B1 | 5/2004 | Tetsuya |
| 6,750,707 B2 | 6/2004 | Takei et al. |
| 6,751,265 B1 | 6/2004 | Schell et al. |
| 6,757,526 B1 | 6/2004 | Sharp et al. |
| 6,763,062 B1 | 7/2004 | Kohno et al. |
| 6,765,519 B2 | 7/2004 | Karlquist |
| 6,781,534 B2 | 8/2004 | Karlquist |
| 6,784,732 B2 | 8/2004 | Hajimiri et al. |
| 6,784,837 B2 | 8/2004 | Revankar et al. |
| 6,785,342 B1 | 8/2004 | Isaksen et al. |
| 6,791,408 B2 | 9/2004 | Goren et al. |
| 6,791,410 B2 | 9/2004 | Kim et al. |
| 6,794,934 B2 | 9/2004 | Betti-Berutto et al. |
| 6,794,938 B2 | 9/2004 | Weldon |
| 6,798,377 B1 | 9/2004 | Lupash et al. |
| 6,798,843 B1 | 9/2004 | Wright et al. |
| 6,801,086 B1 | 10/2004 | Chandrasekaran |
| 6,801,567 B1 | 10/2004 | Schmidl et al. |
| 6,806,767 B2 | 10/2004 | Dow |
| 6,806,789 B2 | 10/2004 | Bawell et al. |
| 6,819,171 B2 | 11/2004 | Kenington |
| 6,819,176 B1 | 11/2004 | Lee |
| 6,819,720 B1 | 11/2004 | Willetts |
| 6,825,719 B1 | 11/2004 | Barak et al. |
| 6,829,471 B2 | 12/2004 | White et al. |
| 6,831,491 B2 | 12/2004 | Karlquist |
| 6,834,183 B2 | 12/2004 | Black et al. |
| 6,836,183 B2 | 12/2004 | Wight |
| 6,838,942 B1 | 1/2005 | Somerville et al. |
| 6,842,070 B2 | 1/2005 | Nilsson |
| 6,847,266 B2 | 1/2005 | Laney et al. |
| 6,853,244 B2 | 2/2005 | Robinson et al. |
| 6,853,247 B2 | 2/2005 | Weldon |
| 6,853,248 B2 | 2/2005 | Weldon |
| 6,859,098 B2 | 2/2005 | Husseini |
| 6,864,742 B2 | 3/2005 | Kobayashi |
| 6,867,647 B2 | 3/2005 | Wouters |
| 6,873,211 B1 | 3/2005 | Thompson et al. |
| 6,879,209 B2 | 4/2005 | Grundlingh |
| 6,882,217 B1 | 4/2005 | Mueller |
| 6,882,711 B1 | 4/2005 | Nicol |
| 6,882,829 B2 | 4/2005 | Mostov et al. |
| 6,889,034 B1 | 5/2005 | Dent |
| 6,891,432 B2 | 5/2005 | Nagle et al. |
| 6,900,694 B2 | 5/2005 | Suzuki et al. |
| 6,906,585 B2 | 6/2005 | Weldon |
| 6,914,487 B1 | 7/2005 | Doyle et al. |
| 6,917,244 B2 | 7/2005 | Rosnell et al. |
| 6,917,389 B2 | 7/2005 | Lee |
| 6,924,699 B2 | 8/2005 | Ahmed |
| 6,928,272 B2 | 8/2005 | Doi |
| 6,930,547 B2 | 8/2005 | Chandrasekaran et al. |
| 6,937,096 B2 | 8/2005 | Wight et al. |
| 6,937,102 B2 | 8/2005 | Lopez et al. |
| 6,940,349 B2 | 9/2005 | Hellberg |
| 6,943,624 B2 | 9/2005 | Ohnishi et al. |
| 6,947,713 B2 | 9/2005 | Checoury et al. |
| 6,960,956 B2 | 11/2005 | Pehlke et al. |
| 6,970,040 B1 | 11/2005 | Dening |
| 6,975,177 B2 | 12/2005 | Varis et al. |
| 6,980,780 B2 | 12/2005 | Chen et al. |
| 6,987,954 B2 | 1/2006 | Nielsen |
| 6,990,323 B2 | 1/2006 | Prikhodko et al. |
| 6,993,301 B1 | 1/2006 | Kenington et al. |
| 7,010,276 B2 | 3/2006 | Sander et al. |
| 7,015,752 B2 | 3/2006 | Saed |
| 7,023,272 B2 | 4/2006 | Hung et al. |
| 7,026,871 B2 | 4/2006 | Saèd |
| 7,030,714 B2 | 4/2006 | Korol |
| 7,031,382 B2 | 4/2006 | Hessel et al. |
| 7,034,613 B2 | 4/2006 | Saèd |
| 7,035,607 B2 | 4/2006 | Lim et al. |
| 7,042,283 B2 | 5/2006 | Suzuki et al. |
| 7,042,286 B2 | 5/2006 | Meade et al. |
| 7,043,208 B2 | 5/2006 | Nigra |
| 7,043,213 B2 | 5/2006 | Robinson et al. |
| 7,054,296 B1 | 5/2006 | Sorrells et al. |
| 7,054,597 B2 | 5/2006 | Rosnell |
| 7,057,461 B1 | 6/2006 | Canilao et al. |
| 7,064,607 B2 | 6/2006 | Maclean et al. |
| 7,068,099 B2 | 6/2006 | Versteegen |
| 7,068,101 B2 | 6/2006 | Saèd et al. |
| 7,068,103 B2 | 6/2006 | Lind |
| 7,071,774 B2 | 7/2006 | Hellberg |
| 7,071,777 B2 | 7/2006 | McBeath et al. |
| 7,078,976 B2 | 7/2006 | Blednov |
| 7,081,795 B2 | 7/2006 | Matsuura et al. |
| 7,084,702 B1 | 8/2006 | Ichitsubo et al. |
| 7,088,970 B2 | 8/2006 | Williams |
| 7,091,775 B2 | 8/2006 | Ichitsubo et al. |
| 7,091,777 B2 | 8/2006 | Lynch |
| 7,092,675 B2 | 8/2006 | Lim et al. |
| 7,092,676 B2 | 8/2006 | Abdelgany et al. |
| 7,099,382 B2 | 8/2006 | Aronson et al. |
| 7,103,328 B2 | 9/2006 | Zelley |
| 7,132,900 B2 | 11/2006 | Yahagi et al. |
| 7,139,535 B2 | 11/2006 | Zschunke |
| 7,145,397 B2 | 12/2006 | Yamamoto et al. |
| 7,173,980 B2 | 2/2007 | Masenten et al. |
| 7,177,418 B2 | 2/2007 | Maclean et al. |
| 7,184,723 B2 | 2/2007 | Sorrells et al. |
| 7,193,459 B1 | 3/2007 | Epperson et al. |
| 7,197,284 B2 | 3/2007 | Brandt et al. |
| 7,200,369 B2 | 4/2007 | Kim et al. |
| 7,230,996 B2 | 6/2007 | Matsuura et al. |
| 7,242,245 B2 | 7/2007 | Burns et al. |
| 7,248,841 B2 | 7/2007 | Agee et al. |
| 7,260,368 B1 | 8/2007 | Blumer |
| 7,260,369 B2 | 8/2007 | Feher |
| 7,292,189 B2 | 11/2007 | Orr et al. |
| 7,327,803 B2 | 2/2008 | Sorrells et al. |
| 7,345,534 B2 | 3/2008 | Grebennikov |
| 7,345,629 B2 | 3/2008 | Dulmovits et al. |
| 7,349,673 B2 | 3/2008 | Moloudi et al. |
| 7,355,470 B2 | 4/2008 | Sorrells et al. |
| 7,378,902 B2 | 5/2008 | Sorrells et al. |
| 7,382,182 B2 | 6/2008 | Trocke et al. |
| 7,403,579 B2 | 7/2008 | Jaffe et al. |
| 7,414,469 B2 | 8/2008 | Sorrells et al. |
| 7,421,036 B2 | 9/2008 | Sorrells et al. |
| 7,423,477 B2 | 9/2008 | Sorrells et al. |
| 7,428,230 B2 | 9/2008 | Park |
| 7,436,894 B2 | 10/2008 | Norris |
| 7,440,733 B2 | 10/2008 | Maslennikov et al. |
| 7,459,893 B2 | 12/2008 | Jacobs |
| 7,460,612 B2 | 12/2008 | Eliezer et al. |
| 7,466,760 B2 | 12/2008 | Sorrells et al. |
| 7,474,695 B2 | 1/2009 | Liu et al. |
| 7,486,894 B2 | 2/2009 | Aronson et al. |
| 7,502,599 B2 | 3/2009 | Ben-Ayun et al. |
| 7,509,102 B2 | 3/2009 | Rofougaran et al. |
| 7,526,261 B2 | 4/2009 | Sorrells et al. |

(56) References Cited

U.S. PATENT DOCUMENTS

| | | |
|---|---|---|
| 7,560,984 B2 | 7/2009 | Akizuki et al. |
| 7,616,057 B2 | 11/2009 | Sutardja |
| 7,620,129 B2 | 11/2009 | Sorrells et al. |
| 7,639,072 B2 | 12/2009 | Sorrells et al. |
| 7,647,030 B2 | 1/2010 | Sorrells et al. |
| 7,672,648 B1 | 3/2010 | Groe et al. |
| 7,672,650 B2 | 3/2010 | Sorrells et al. |
| 7,738,853 B2 | 6/2010 | Eddy et al. |
| 7,750,733 B2 | 7/2010 | Sorrells et al. |
| RE41,582 E | 8/2010 | Larson et al. |
| 7,778,320 B2 | 8/2010 | Agazzi et al. |
| 7,835,709 B2 | 11/2010 | Sorrells et al. |
| 7,844,235 B2 | 11/2010 | Sorrells et al. |
| 7,885,682 B2 | 2/2011 | Sorrells et al. |
| 7,907,671 B2 | 3/2011 | Klomsdorf et al. |
| 7,911,272 B2 | 3/2011 | Sorrells et al. |
| 7,929,989 B2 | 4/2011 | Sorrells et al. |
| 7,932,776 B2 | 4/2011 | Sorrells et al. |
| 7,937,106 B2 | 5/2011 | Sorrells et al. |
| 7,945,224 B2 | 5/2011 | Sorrells et al. |
| 7,949,365 B2 | 5/2011 | Sorrells et al. |
| 7,978,390 B2 | 7/2011 | Kikuchi |
| 8,013,675 B2 | 9/2011 | Sorrells et al. |
| 8,026,764 B2 | 9/2011 | Sorrells et al. |
| 8,031,804 B2 | 10/2011 | Sorrells et al. |
| 8,036,306 B2 | 10/2011 | Sorrells et al. |
| 8,050,353 B2 | 11/2011 | Sorrells et al. |
| 8,059,749 B2 | 11/2011 | Sorrells et al. |
| 8,073,078 B2 | 12/2011 | Kaczman et al. |
| 8,170,081 B2 | 5/2012 | Forenza et al. |
| 8,223,885 B2 | 7/2012 | Zhu et al. |
| 8,233,858 B2 | 7/2012 | Sorrells et al. |
| 8,280,321 B2 | 10/2012 | Sorrells et al. |
| 8,315,336 B2 | 11/2012 | Sorrells et al. |
| 8,334,722 B2 | 12/2012 | Sorrells et al. |
| 8,351,870 B2 | 1/2013 | Sorrells et al. |
| 8,355,466 B2 | 1/2013 | Kleider et al. |
| 8,369,807 B2 | 2/2013 | Mikhemar et al. |
| 8,384,484 B2 | 2/2013 | Winslow et al. |
| 8,406,711 B2 | 3/2013 | Sorrells et al. |
| 8,410,849 B2 | 4/2013 | Sorrells et al. |
| 8,428,527 B2 | 4/2013 | Sorrells et al. |
| 8,433,264 B2 | 4/2013 | Sorrells et al. |
| 8,433,745 B2 | 4/2013 | Roger |
| 8,447,248 B2 | 5/2013 | Sorrells et al. |
| 8,461,924 B2 | 6/2013 | Rawlins et al. |
| 8,502,600 B2 | 8/2013 | Rawlins et al. |
| 8,548,093 B2 | 10/2013 | Sorrells et al. |
| 8,577,313 B2 | 11/2013 | Sorrells et al. |
| 8,626,093 B2 | 1/2014 | Sorrells et al. |
| 8,639,196 B2 | 1/2014 | Sorrells et al. |
| 8,755,454 B2 | 6/2014 | Sorrells et al. |
| 8,766,717 B2 | 7/2014 | Sorrells et al. |
| 8,781,418 B2 | 7/2014 | Sorrells et al. |
| 8,884,694 B2 | 11/2014 | Sorrells et al. |
| 8,913,691 B2 | 12/2014 | Sorrells et al. |
| 8,913,974 B2 | 12/2014 | Sorrells et al. |
| 9,537,456 B2 * | 1/2017 | Briffa .................. H03F 3/19 |
| 2001/0001008 A1 | 5/2001 | Dent |
| 2001/0004373 A1 | 6/2001 | Hirata |
| 2001/0006354 A1 | 7/2001 | Lee |
| 2001/0006359 A1 | 7/2001 | Suzuki et al. |
| 2001/0011961 A1 | 8/2001 | Rexberg et al. |
| 2001/0030581 A1 | 10/2001 | Dent |
| 2001/0052816 A1 | 12/2001 | Ahn |
| 2002/0008577 A1 | 1/2002 | Cova et al. |
| 2002/0027958 A1 | 3/2002 | Kolanek |
| 2002/0042253 A1 | 4/2002 | Dartois |
| 2002/0047745 A1 | 4/2002 | Kolanek |
| 2002/0053973 A1 | 5/2002 | Ward, Jr. |
| 2002/0058486 A1 | 5/2002 | Persson |
| 2002/0071497 A1 | 6/2002 | Bengtsson et al. |
| 2002/0079962 A1 | 6/2002 | Sander |
| 2002/0084845 A1 | 7/2002 | Eisenberg et al. |
| 2002/0086707 A1 | 7/2002 | Struhsaker et al. |
| 2002/0094034 A1 | 7/2002 | Moriyama |
| 2002/0101907 A1 | 8/2002 | Dent et al. |
| 2002/0105378 A1 | 8/2002 | Tapio |
| 2002/0105384 A1 | 8/2002 | Dent |
| 2002/0125947 A1 | 9/2002 | Ren |
| 2002/0126769 A1 | 9/2002 | Jett et al. |
| 2002/0127986 A1 | 9/2002 | White et al. |
| 2002/0130716 A1 | 9/2002 | Larson et al. |
| 2002/0130727 A1 | 9/2002 | Nagasaka |
| 2002/0130729 A1 | 9/2002 | Larson et al. |
| 2002/0136275 A1 | 9/2002 | Wight |
| 2002/0136325 A1 | 9/2002 | Pehlke et al. |
| 2002/0146996 A1 | 10/2002 | Bachman, II et al. |
| 2002/0153950 A1 | 10/2002 | Kusunoki et al. |
| 2002/0159532 A1 | 10/2002 | Wight |
| 2002/0164965 A1 | 11/2002 | Chominski et al. |
| 2002/0168025 A1 | 11/2002 | Schwent et al. |
| 2002/0171478 A1 | 11/2002 | Wouters |
| 2002/0171485 A1 | 11/2002 | Cova |
| 2002/0172376 A1 | 11/2002 | Bizjak |
| 2002/0180547 A1 | 12/2002 | Staszewski et al. |
| 2002/0183021 A1 | 12/2002 | Brandt |
| 2002/0186079 A1 | 12/2002 | Kobayashi |
| 2002/0191638 A1 | 12/2002 | Wang et al. |
| 2002/0196864 A1 | 12/2002 | Booth et al. |
| 2003/0006845 A1 | 1/2003 | Lopez et al. |
| 2003/0031268 A1 | 2/2003 | Wight |
| 2003/0041667 A1 | 3/2003 | White |
| 2003/0083026 A1 | 5/2003 | Liu |
| 2003/0087625 A1 | 5/2003 | Conti |
| 2003/0098753 A1 | 5/2003 | Wagh et al. |
| 2003/0102910 A1 | 6/2003 | Sevic et al. |
| 2003/0102914 A1 | 6/2003 | Kenington et al. |
| 2003/0107435 A1 | 6/2003 | Gu |
| 2003/0114124 A1 | 6/2003 | Higuchi |
| 2003/0118121 A1 | 6/2003 | Makinen |
| 2003/0119526 A1 | 6/2003 | Edge |
| 2003/0123566 A1 | 7/2003 | Hasson |
| 2003/0125065 A1 | 7/2003 | Barak et al. |
| 2003/0132800 A1 | 7/2003 | Kenington |
| 2003/0143967 A1 | 7/2003 | Ciccarelli et al. |
| 2003/0179041 A1 | 9/2003 | Weldon |
| 2003/0190895 A1 | 10/2003 | Mostov et al. |
| 2003/0201835 A1 | 10/2003 | Dening et al. |
| 2003/0210096 A1 | 11/2003 | Pengelly et al. |
| 2003/0210746 A1 | 11/2003 | Asbeck et al. |
| 2003/0219067 A1 | 11/2003 | Birkett et al. |
| 2003/0220086 A1 | 11/2003 | Birkett |
| 2003/0228856 A1 | 12/2003 | Orihashi et al. |
| 2003/0231057 A1 | 12/2003 | Hiramoto et al. |
| 2004/0008081 A1 | 1/2004 | Friedel et al. |
| 2004/0021517 A1 | 2/2004 | Irvine et al. |
| 2004/0025104 A1 | 2/2004 | Amer |
| 2004/0027198 A1 | 2/2004 | Chandrasekaran et al. |
| 2004/0037363 A1 | 2/2004 | Norsworthy et al. |
| 2004/0037378 A1 | 2/2004 | Komori et al. |
| 2004/0046524 A1 | 3/2004 | Zschunke |
| 2004/0052312 A1 | 3/2004 | Matero |
| 2004/0056723 A1 | 3/2004 | Gotou |
| 2004/0062397 A1 | 4/2004 | Amer |
| 2004/0075492 A1 | 4/2004 | Wight |
| 2004/0076238 A1 | 4/2004 | Parker et al. |
| 2004/0085134 A1 | 5/2004 | Griffith et al. |
| 2004/0092281 A1 | 5/2004 | Burchfiel |
| 2004/0095192 A1 | 5/2004 | Krvavac |
| 2004/0101065 A1 | 5/2004 | Hagh et al. |
| 2004/0108896 A1 | 6/2004 | Midtgaard |
| 2004/0113698 A1 | 6/2004 | Kim et al. |
| 2004/0119477 A1 | 6/2004 | Kazemi-Nia |
| 2004/0119514 A1 | 6/2004 | Karlquist |
| 2004/0119622 A1 | 6/2004 | Karlquist |
| 2004/0119624 A1 | 6/2004 | Karlquist |
| 2004/0125006 A1 | 7/2004 | Tani et al. |
| 2004/0131131 A1 | 7/2004 | Peach et al. |
| 2004/0135630 A1 | 7/2004 | Hellberg |
| 2004/0142667 A1 | 7/2004 | Lochhead et al. |
| 2004/0146116 A1 | 7/2004 | Kang et al. |
| 2004/0166813 A1 | 8/2004 | Mann et al. |
| 2004/0169559 A1 | 9/2004 | Weldon |

(56) References Cited

U.S. PATENT DOCUMENTS

| | | |
|---|---|---|
| 2004/0172583 A1 | 9/2004 | Amer |
| 2004/0174213 A1 | 9/2004 | Thompson |
| 2004/0181745 A1 | 9/2004 | Amer |
| 2004/0184559 A1 | 9/2004 | Ballantyne |
| 2004/0185805 A1 | 9/2004 | Kim et al. |
| 2004/0189380 A1 | 9/2004 | Myer et al. |
| 2004/0189381 A1 | 9/2004 | Louis |
| 2004/0196899 A1 | 10/2004 | Zhou et al. |
| 2004/0198263 A1 | 10/2004 | Ode et al. |
| 2004/0222851 A1 | 11/2004 | Weldon |
| 2004/0224715 A1 | 11/2004 | Rosenlof et al. |
| 2004/0227570 A1 | 11/2004 | Jackson et al. |
| 2004/0233599 A1 | 11/2004 | Busking |
| 2004/0246060 A1 | 12/2004 | Varis et al. |
| 2004/0251962 A1 | 12/2004 | Rosnell et al. |
| 2004/0263242 A1 | 12/2004 | Hellberg |
| 2004/0263245 A1 | 12/2004 | Winter et al. |
| 2004/0263246 A1 | 12/2004 | Robinson et al. |
| 2004/0266059 A1 | 12/2004 | Wight et al. |
| 2004/0266365 A1 | 12/2004 | Hasson et al. |
| 2004/0266368 A1 | 12/2004 | Rosnell |
| 2004/0266374 A1 | 12/2004 | Saed et al. |
| 2004/0267399 A1 | 12/2004 | Funk |
| 2005/0001674 A1 | 1/2005 | Saed et al. |
| 2005/0001675 A1 | 1/2005 | Saed |
| 2005/0001676 A1 | 1/2005 | Saed |
| 2005/0001677 A1 | 1/2005 | Saed |
| 2005/0001678 A1 | 1/2005 | Saed |
| 2005/0001679 A1 | 1/2005 | Saed |
| 2005/0002470 A1 | 1/2005 | Saed et al. |
| 2005/0003770 A1 | 1/2005 | Saed |
| 2005/0007194 A1 | 1/2005 | Grundlingh |
| 2005/0012547 A1 | 1/2005 | Kwon et al. |
| 2005/0018787 A1 | 1/2005 | Saed |
| 2005/0024262 A1 | 2/2005 | Cantrell et al. |
| 2005/0025181 A1 | 2/2005 | Nazari |
| 2005/0047038 A1 | 3/2005 | Nakajima et al. |
| 2005/0058059 A1 | 3/2005 | Amer |
| 2005/0058193 A1 | 3/2005 | Saed |
| 2005/0058209 A1 | 3/2005 | Magrath |
| 2005/0058227 A1 | 3/2005 | Birkett et al. |
| 2005/0058228 A1 | 3/2005 | Birkett |
| 2005/0070325 A1* | 3/2005 | Bellaouar .............. H04B 1/30 455/550.1 |
| 2005/0073360 A1 | 4/2005 | Johnson et al. |
| 2005/0073374 A1 | 4/2005 | Korol |
| 2005/0088226 A1 | 4/2005 | Robinson et al. |
| 2005/0110590 A1 | 5/2005 | Korol |
| 2005/0111574 A1 | 5/2005 | Muller et al. |
| 2005/0118973 A1 | 6/2005 | Khlat |
| 2005/0129140 A1 | 6/2005 | Robinson |
| 2005/0129141 A1 | 6/2005 | Lee |
| 2005/0136864 A1 | 6/2005 | Zipper |
| 2005/0141640 A1 | 6/2005 | Maruyama |
| 2005/0181746 A1 | 8/2005 | Wight |
| 2005/0191976 A1 | 9/2005 | Shakeshaft et al. |
| 2005/0195031 A1 | 9/2005 | Grundlingh |
| 2005/0201483 A1 | 9/2005 | Coersmeier |
| 2005/0215206 A1 | 9/2005 | Granstrom et al. |
| 2005/0227646 A1 | 10/2005 | Yamazaki et al. |
| 2005/0242879 A1 | 11/2005 | Muller |
| 2005/0253652 A1 | 11/2005 | Song et al. |
| 2005/0253745 A1 | 11/2005 | Song et al. |
| 2005/0260956 A1 | 11/2005 | Loraine et al. |
| 2006/0006946 A1 | 1/2006 | Burns et al. |
| 2006/0017500 A1 | 1/2006 | Hellberg |
| 2006/0035618 A1 | 2/2006 | Pleasant |
| 2006/0052068 A1 | 3/2006 | Sander et al. |
| 2006/0052124 A1 | 3/2006 | Pottenger et al. |
| 2006/0055458 A1 | 3/2006 | Shiikuma et al. |
| 2006/0066396 A1 | 3/2006 | Brandt |
| 2006/0068707 A1 | 3/2006 | Greeley |
| 2006/0088081 A1 | 4/2006 | Withington et al. |
| 2006/0142821 A1 | 6/2006 | Bange et al. |
| 2006/0160502 A1 | 7/2006 | Kintis |
| 2006/0220625 A1 | 10/2006 | Chapuis |
| 2006/0238245 A1 | 10/2006 | Carichner et al. |
| 2006/0262889 A1 | 11/2006 | Kalvaitis et al. |
| 2006/0264190 A1 | 11/2006 | Aleiner |
| 2006/0291589 A1 | 12/2006 | Eliezer et al. |
| 2006/0292999 A1 | 12/2006 | Sorrells et al. |
| 2006/0293000 A1 | 12/2006 | Sorrells et al. |
| 2007/0019757 A1 | 1/2007 | Matero |
| 2007/0021080 A1 | 1/2007 | Kuriyama et al. |
| 2007/0024268 A1* | 2/2007 | Ammar .............. G01K 11/006 324/76.14 |
| 2007/0030063 A1 | 2/2007 | Izumi et al. |
| 2007/0050758 A1 | 3/2007 | Arevalo et al. |
| 2007/0071114 A1 | 3/2007 | Sanderford et al. |
| 2007/0076814 A1 | 4/2007 | Ikeda et al. |
| 2007/0082630 A1 | 4/2007 | Aridas et al. |
| 2007/0087708 A1 | 4/2007 | Sorrells et al. |
| 2007/0087709 A1 | 4/2007 | Sorrells et al. |
| 2007/0090874 A1 | 4/2007 | Sorrells et al. |
| 2007/0096806 A1 | 5/2007 | Sorrells et al. |
| 2007/0111686 A1 | 5/2007 | Lee |
| 2007/0127563 A1 | 6/2007 | Wu et al. |
| 2007/0155344 A1 | 7/2007 | Wiessner et al. |
| 2007/0184790 A1 | 8/2007 | Gilbertson et al. |
| 2007/0190952 A1 | 8/2007 | Waheed et al. |
| 2007/0194986 A1 | 8/2007 | Dulmovits, Jr. et al. |
| 2007/0218852 A1 | 9/2007 | Huynh |
| 2007/0247217 A1 | 10/2007 | Sorrells et al. |
| 2007/0247220 A1 | 10/2007 | Sorrells et al. |
| 2007/0247221 A1 | 10/2007 | Sorrells et al. |
| 2007/0248156 A1 | 10/2007 | Sorrells et al. |
| 2007/0248185 A1 | 10/2007 | Sorrells et al. |
| 2007/0248186 A1 | 10/2007 | Sorrells et al. |
| 2007/0249299 A1 | 10/2007 | Sorrells et al. |
| 2007/0249300 A1 | 10/2007 | Sorrells et al. |
| 2007/0249301 A1 | 10/2007 | Sorrells et al. |
| 2007/0249302 A1 | 10/2007 | Sorrells et al. |
| 2007/0249304 A1 | 10/2007 | Snelgrove et al. |
| 2007/0291668 A1 | 12/2007 | Duan |
| 2008/0003960 A1 | 1/2008 | Zolfaghari |
| 2008/0019459 A1 | 1/2008 | Chen et al. |
| 2008/0072025 A1 | 3/2008 | Staszewski et al. |
| 2008/0089252 A1 | 4/2008 | Choi |
| 2008/0133982 A1 | 6/2008 | Rawlins et al. |
| 2008/0225929 A1 | 9/2008 | Proctor et al. |
| 2008/0225935 A1 | 9/2008 | Reddy |
| 2008/0259846 A1 | 10/2008 | Gonikberg et al. |
| 2008/0272841 A1 | 11/2008 | Sorrells et al. |
| 2008/0299913 A1 | 12/2008 | Han et al. |
| 2008/0311860 A1 | 12/2008 | Tanaka et al. |
| 2009/0004981 A1 | 1/2009 | Eliezer et al. |
| 2009/0063070 A1 | 3/2009 | Renneberg |
| 2009/0070568 A1 | 3/2009 | Shi et al. |
| 2009/0091384 A1 | 4/2009 | Sorrells et al. |
| 2009/0133083 A1* | 5/2009 | Klein .............. H03F 3/45085 725/111 |
| 2009/0134947 A1 | 5/2009 | Tarng |
| 2009/0201084 A1 | 8/2009 | See et al. |
| 2009/0227214 A1 | 9/2009 | Georgantas et al. |
| 2009/0232260 A1 | 9/2009 | Hayashi et al. |
| 2009/0238249 A1 | 9/2009 | van Waasen et al. |
| 2009/0262861 A1 | 10/2009 | Nielsen |
| 2009/0262877 A1 | 10/2009 | Shi et al. |
| 2010/0008680 A1 | 1/2010 | Chen et al. |
| 2010/0013527 A1 | 1/2010 | Warnick |
| 2010/0103052 A1 | 4/2010 | Ying |
| 2010/0259325 A1* | 10/2010 | Saunders .............. H01Q 3/26 330/124 R |
| 2010/0311353 A1 | 12/2010 | Teillet et al. |
| 2010/0329395 A1 | 12/2010 | Kang et al. |
| 2011/0099406 A1 | 4/2011 | Bell |
| 2011/0300885 A1 | 12/2011 | Darabi et al. |
| 2012/0025624 A1 | 2/2012 | Lee et al. |
| 2012/0153731 A9 | 6/2012 | Kirby et al. |
| 2012/0223709 A1* | 9/2012 | Schillak .............. G01R 33/3607 324/309 |
| 2012/0263215 A1 | 10/2012 | Peng |
| 2012/0321007 A1 | 12/2012 | Feher |
| 2013/0101074 A1 | 4/2013 | Hickling et al. |

(56) References Cited

U.S. PATENT DOCUMENTS

| | | | |
|---|---|---|---|
| 2013/0122973 A1 | 5/2013 | Caskey | |
| 2013/0244605 A1 | 9/2013 | Rawlins et al. | |
| 2013/0279631 A1 | 10/2013 | Bowers et al. | |
| 2014/0085001 A1* | 3/2014 | Anderson | H03F 1/0227 330/197 |

FOREIGN PATENT DOCUMENTS

| | | |
|---|---|---|
| EP | 0 630 104 A2 | 12/1994 |
| EP | 0 708 546 A2 | 4/1996 |
| EP | 0 471 346 B1 | 11/1996 |
| EP | 0 639 307 B1 | 12/1997 |
| EP | 0 821 304 A1 | 1/1998 |
| EP | 0 725 478 B1 | 8/1998 |
| EP | 0 892 529 A2 | 1/1999 |
| EP | 0 897 213 A1 | 2/1999 |
| EP | 0 598 585 B1 | 3/1999 |
| EP | 0 630 104 B1 | 8/2000 |
| EP | 0 821 304 B1 | 2/2002 |
| EP | 1 068 666 B1 | 5/2003 |
| EP | 1 381 154 A1 | 1/2004 |
| EP | 0 897 213 B1 | 3/2004 |
| EP | 1 487 100 A1 | 12/2004 |
| EP | 1 332 550 B1 | 3/2005 |
| EP | 1 142 250 B1 | 4/2005 |
| EP | 1 521 359 A1 | 4/2005 |
| EP | 1 583 228 A2 | 10/2005 |
| GB | 2159374 A | 11/1985 |
| GB | 2 267 402 | 12/1993 |
| JP | 54-022749 A | 2/1979 |
| JP | 60-63517 A | 4/1985 |
| JP | 1-284106 A | 11/1989 |
| JP | 2-87708 A | 3/1990 |
| JP | 3-232307 A | 10/1991 |
| JP | 3-247101 | 11/1991 |
| JP | 3-276923 | 12/1991 |
| JP | 4-095409 A | 3/1992 |
| JP | 4-104604 A | 4/1992 |
| JP | 5-22046 A | 1/1993 |
| JP | 5-037263 A | 2/1993 |
| JP | 6-338728 A | 12/1994 |
| JP | H08-163189 A | 6/1996 |
| JP | 9-018536 A | 1/1997 |
| JP | 9-074320 A | 3/1997 |
| JP | 10-70451 A | 3/1998 |
| JP | 2000-209291 A | 7/2000 |
| JP | 2000-244261 A | 9/2000 |
| JP | 2001-136057 A | 5/2001 |
| JP | 2001-217659 A | 8/2001 |
| JP | 2001-308650 A | 11/2001 |
| JP | 2002-543729 A | 12/2002 |
| JP | 2003-298357 A | 10/2003 |
| JP | 2003-298361 A | 10/2003 |
| JP | 2004-260707 A | 9/2004 |
| JP | 2005-101940 A | 4/2005 |
| JP | 2005-151543 A | 6/2005 |
| RO | 102824 | 11/1991 |
| RO | 100466 | 8/1992 |
| SU | 1322183 A1 | 7/1987 |
| WO | WO 94/21035 | 9/1994 |
| WO | WO 96/10310 | 4/1996 |
| WO | WO 96/19063 | 6/1996 |
| WO | WO 97/41642 | 11/1997 |
| WO | WO 97/48219 | 12/1997 |
| WO | WO 99/23755 | 5/1999 |
| WO | WO 99/52206 | 10/1999 |
| WO | WO 00/41371 | 7/2000 |
| WO | WO 00/67370 A1 | 11/2000 |
| WO | WO 01/03292 | 1/2001 |
| WO | WO 01/45205 | 6/2001 |
| WO | WO 01/91282 | 11/2001 |
| WO | WO 02/39577 | 5/2002 |
| WO | WO 02/082633 | 10/2002 |
| WO | WO 02/084864 A2 | 10/2002 |
| WO | WO 03/047093 | 6/2003 |
| WO | WO 03/061115 | 7/2003 |
| WO | WO 2004/023647 | 3/2004 |
| WO | WO 2004/036736 | 4/2004 |
| WO | WO 2004/057755 | 7/2004 |
| WO | WO 2005/031966 | 4/2005 |
| WO | WO 2005/036732 | 4/2005 |
| WO | WO 2005/055413 | 6/2005 |

OTHER PUBLICATIONS

"Designing an SSB Outphase," *Electronics World*, pp. 306-310 (Apr. 1996).

"New 50 KW Ampliphase AM Transmiter," *RCA in Broadcast News*, No. 111, pp. 36-39 (Jun. 1961).

*The Ampliphase Page*: *Ampliphase—A quick description . . .* , Reproduction of text from http://rossrevenge.co.uk/tx/ampli.htm, 13 pages (visited Jan. 18, 2006).

Ajluni, C., "Chip Set Withstands WLAN's Future Blows," at http://www.wsdmag.com/Articles/Print.cfm?ArticleID=6792, 5 pages (Oct. 2003).

Ampen-Darko, S. and Al-Raweshidy, H.S., "Gain/phase imbalance cancellation technique in LINC transmitters," *Electronics Letters*, vol. 34, No. 22, pp. 2093-2094 (Oct. 29, 1988).

Ampen-Darko, S.O. and Al-Raweshidy, H.S., "A Novel Technique for Gain/Phase Cancellation in LINC Transmitters," *IEEE VTS—$50^{th}$ Vehicular Technology Conference*, pp. 2034-2038 (Sep. 19-22, 1999).

Andreani, P., *Linear PA architectures (Chapter 13)*, available at http://server.oersted.dtu.dk/personal/pa/31636/pdf/paLin.pdf, 10 pages (Jun. 14, 2007).

Ariyavisitakul, S. and Lie, T.P., "Characterizing the Effects of Nonlinear Amplifiers on Linear Modulation for Digital Portable Radio Communications," *IEEE Transactions on Vehicular Technology*, vol. 39, No. 4, pp. 383-389 (Nov. 1990).

*ARMMS—The RF and Microwave Society—Last Meeting*, at http://www.armms.org/last.html, 4 pages (printed Apr. 14, 2005).

Asbeck, P.M. et al., "Power Amplifier Approaches for High Efficiency and Linearity," in Itoh, T. et al. (eds.), *RF Technologies for Low Power Wireless Communications*, ISBN No. 0-471-38267-1, pp. 189-227 (2001).

Asbeck, P.M. et al., "Synergistic Design of DSP and Power Amplifiers for Wireless Communications," *IEEE Transactions on Microwave Theory and Techniques*, vol. 49, No. 11, pp. 2163-2196 (Nov. 2001).

Banelli, P., "Error Sensitivity in Adaptive Predistortion Systems," *Global Telecommunications Conference—Globecom '99*, pp. 883-888 (1999).

Bateman, A., et al., "The Application of Digital Signal Processing to Transmitter Linearisation," *EUROCON 88: $8^{th}$ European Conference on Electrotechnics*, pp. 64-67 (Jun. 13-17, 1988).

Bespalov, V.B. and Aslamazyan, A.S., "Broadband Strip-Line SHF Ampliphasemeter," *Measurement Techniques (Translated from Russian)*, vol. 25, No. 8, pp. 712-715 (Aug. 1982).

Birafane, A. and Kouki, A., "An Analytical Approach to LINC Power Combining Efficiency Estimation and Optimization," *33rd European Microwave Conference*—Munich, pp. 1227-1229 (2003).

Birafane, A. and Kouki, A., "Distortion Free LINC Amplifier with Chireix-Outphasing Combiner Using Phase-Only Predistortion," *34th European Microwave Conference*—Amsterdam, pp. 1069-1072 (2004).

Birafane, A. and Kouki, A., "On the Linearity and Efficiency of Outphasing Microwave Amplifiers," *IEEE Transactions on Microwave Theory and Techniques*, vol. 52, No. 7, pp. 1702-1708 (Jul. 2004).

Birafane, A. and Kouki, A., "Sources of Linearity Degradation in LINC Transmitters for Hybrid and Outphasing Combiners," *Canadian Conference on Electrical and Computer Engineering*—Niagara Falls, pp. 547-550 (May 2004).

Birafane, A. and Kouki, A.B., "Phase-Only Predistortion for LINC Amplifiers With Chireix-Outphasing Combiners," *IEEE Transactions on Microwave Theory and Techniques*, vol. 53, No. 6, pp. 2240-2250 (Jun. 2005).

(56) References Cited

OTHER PUBLICATIONS

Breed, G., "Intermodulation Distortion Performance and Measurement Issues," *High Frequency Electronics*, p. 56(2) (May 2003).
Bruckmann, H., "Modulation Arrangements and Operating Costs of Broadcasting and Radio-Telephony Transmitters," *Telegraphen-Fernsprech-Funk-und Fernsehtechnik*, vol. 24, pp. 83-91 (Apr. 1935).
Burnill, J., "Transmitting AM," *Electronics World + Wireless World*, pp. 58-60 (Jan. 1995).
Casadevall, F. and Olmos, J.J., "On the Behavior of the LINC Transmitter," *40th IEEE Vehicular Technology Conference*, pp. 29-34 (May 6-9, 1990).
Casadevall, F.J. and Valdovinos, A., "Performance Analysis of QAM Modulations Applied to the LINC Transmitter," *IEEE Transactions on Vehicular Technology*, vol. 42, No. 4, pp. 399-406 (Nov. 1993).
Casadevall, F.J., "The LINC Transmitter", *RF Design*, pp. 41-48 (Feb. 1990).
Cha, J. et al., "Highly Efficient Power Amplifier for CDMA Base Stations Using Doherty Configuration," *IEEE MTT-S International Microwave Symposium Digest*, pp. 533-536 (2004).
Chan, K.Y. et al., "Analysis and Realisation of the LINC Transmitter using the Combined Analogue Locked Loop Universal Modulator (CALLUM)," *IEEE 44th Vehicular Technology Conference*, vol. 1, pp. 484-488 (Jun. 8-10, 1994).
Chen, J.-T. et al., "The Opitmal RLS Parameter Tracking Algorithm for a Power Amplifier Feedforward Linearizer," *IEEE Transactions on Circuits and Systems—II: Analog and Digital Signal Processing*, vol. 46, pp. 464-468 (Apr. 1999).
Chireix, H., "High Power Outphasing Modulation" *Proceedings of the Institute of Radio Engineers*, vol. 23, No. 11, pp. 1370-1392 (Nov. 1935).
Choi, L.U., *Multi-user MISO and MIMO Transmit Signal Processing for Wireless Communication*, PhD Thesis submitted to the Hong Kong University of Science and Technology, 191 pages, Mar. 2003.
Clark, G., "A Comparison of AM Techniques," *ABU Technical Review*, No. 44, p. 33-42, (May 1976).
Clark, G., "A Comparison of Current Broadcast Amplitude Modulation Techniques", *IEEE Transactions on Broadcasting*, vol. BC-21, No. 2, pp. 25-31 (Jun. 1975).
Clifton, J.C. et al., "Novel Multimode J-pHEMT Front-End Architecture With Power-Control Scheme for Maximum Efficiency," *IEEE Transactions on Microwave Theory and Techniques*, vol. 53, No. 6, pp. 2251-2258 (Jun. 2005).
Colantonio, P., "High Linearity and Efficiency Microwave PAs," *12th GAAS Symposium*—Amsterdam, pp. 183-186 (2004).
*Computational Science Research Center Colloquium—Time Reversal Bases Communications in Complex Environments*, Friday, Apr. 9, 2004, 2 pages, printed Jul. 14, 2006 from http://www.sdsunivers.info/info_content_event.asp?id=15044.
Conradi, C.P. et al., "Evaluation of a Lossless Combiner in a LINC Transmitter," *Proceedings of the 1999 IEEE Canadian Conference on Electrical Computer Engineering*, pp. 105-111 (May 12, 1999).
Couch, L. and Walker, J.L., "A VHF LINC Amplifier," *Proceedings of IEEE Southeastcon*, pp. 122-125 (1982).
*Course #08: Advanced RF Power Amplifier Techniques for Modern Wireless and Microwave Systems*, from http://www.cei.se/008.htm, 6 pages (printed Apr. 14, 2005).
*Course #114: Advanced RF Power Amplifier Techniques*, from http://www.bessercourse.com/outlinesOnly.asp?CTID=114, 3 pages (printed Jun. 22, 2005).
Cox, "Component Signal Separation and Recombination for Linear Amplification with Nonlinear Components," *IEEE Transactions on Communications*, vol. COM-23, No. 11, pp. 1281-1287 (Nov. 1975).
Cox, D.C. and Leck, R.P., "A VHF Implementation of a LINC Amplifier," *IEEE Transactions on Communications*, pp. 1018-1022 (Sep. 1976).

Cox, D.C., "Linear Amplification with Nonlinear Components," *IEEE Transactions on Communications*, vol. COM-22, pp. 1942-1945 (Dec. 1974).
Cripps, S.C., *Advanced Techniques in RF Power Amplifier Design*, Section 2—"Doherty and Chireix," pp. 33-72, Artech House (2002).
Cripps, Steve C., *PA Linearisation in RFICs . . . ignoring the obvious?*, available at http://www.cei.se/pa_milan.ppt, Hywave Associates, 24 pages (Created Aug. 2, 2001).
Cripps, Steve C., *RF Power Amplifier for Wireless Communications*, Artech House, ISBN No. 0890069891, pp. 240-250 (Apr. 1999).
Deltimple, N. et al., "A Configureable RF Power Amplifier Biasing Scheme", *Proceedings of the 2nd Annual IEEE Northeast Workshop on Circuits and Systems (NEWCAS2004)*, pp. 365-368, (Jun. 20-23, 2004).
Dennis, A., "A Novel Digital Transmitter Architecture for Multimode/Multiband Applications: DTX, A Technology of MACOM," Tyco Electronics, 32 pages (Aug. 17, 2004).
Dinis, R. et al., "Performance Trade-Offs with Quasi-Linearly Amplified OFDM Through a Two-Branch Combining Technique," *IEEE 46th Vehicular Technology Conference*, pp. 899-903 (Apr. 28-May 1, 1996).
Ellinger, F. et al., "Calibratable Adaptive Antenna Combiner at 5.2 GHz with High Yield for Laptop Interface Card," *IEEE Transactions on Microwave Theory and Techniques*, vol. 48, No. 12, pp. 2714-2720 (Dec. 2000).
Faust, H.H. et al., "A Spectrally Clean Transmitting System for Solid-State Phased-Array Radars," *Proceedings of the 2004 IEEE Radar Conference*, pp. 140-144 (Apr. 26-Apr. 29, 2004).
Fisher, S.T., "A New Method of Amplifying with High Efficiency a Carrier Wave Modulated in Amplitude by a Voice Wave," *Proceedings of the Institute of Radio Engineers*, vol. 34, pp. 3P-13P (Jan. 1946).
García, P. et al., "An Adaptive Digital Method of Imbalances Cancellation in LINC Transmitters," *IEEE Transactions on Vehicular Technology*, vol. 54, No. 3, pp. 879-888 (May 2005).
Gaudernack, L.F., "A Phase-Opposition System of Amplitude Modulation," *IRE Proceedings*, vol. 26, No. 8, pp. 983-1008 (Aug. 1938).
Gentzler, C.G. and Leong, S.K., "Broadband VHF/UHF Amplifier Design Using Coaxial Transformers," *High Frequency Electronics*, pp. 42, 44, 46, 48, 50, and 51 (May 2003).
Gerhard, W. and Knöchel, R., "Digital Component Separator for future W-CDMA-LINC Transmitters implemented on an FPGA," *Advances in Radio Science*, 3, pp. 239-246 (2005).
Gründlingh, J. et al., "A High Efficiency Chireix Out-phasing Power Amplifier for 5GHz WLAN Applications," *IEEE MTT-S International Symposium Digest*, vol. 3, pp. 1535-1538 (2004).
Hakala, I. et al., "A 2.14-GHz Chireix Outphasing Transmitter," *IEEE Transactions on Microwave Theory and Techniques*, vol. 53, No. 6, pp. 2129-2138 (Jun. 2005).
Hakala, I. et al., "Chireix Power Combining with Saturated Class-B Power Amplifiers," *Conference Proceedings, 34th European Microwave Conference*, pp. 379-382 (2004).
Hamedi-Hagh, S. and Salama, A.T., "CMOS Wireless Phase-Shifted Transmitter," *IEEE Journal of Solid-State Circuits*, vol. 39, No. 8, pp. 1241-1252 (Aug. 2004).
Hammond, R. and Henry, J., "High Power Vector Summation Switching Power Amplifier Development," *IEEE Power Electronics Specialists Conference (PESC)*, pp. 267-272 (Jun. 29-Jul. 3, 1981).
Heiden, D., "Principle of a phase constant and low distortion amplitude modulation system for transistor transmitters," *Nachrichtentechnische Zeitschrift*, vol. 23, No. 12, pp. 608-612 (Dec. 1970).
Hetzel, S.A. et al., "LINC Transmitter," *Electronics Letters*, vol. 27, No. 10, pp. 844-846 (May 9, 1991).
Internet Postings at *"Class E-AM Forum" :: View Topic—What exactly is class D?*, at http://classe.monkeypuppet.com/viewtopic.php?t=220, 6 pages (Dec. 14-17, 2003).
Iwamoto, M. et al., "An Extended Doherty Amplifier with High Efficiency Over a Wide Power Range," *IEEE Transactions on Microwave Theory and Techniques*, vol. 49, No. 12, pp. 2472-2479 (Dec. 2001).

(56) References Cited

OTHER PUBLICATIONS

Jeong, Y.-C., *Linearizing Principles on High Power Amplifier*, Chonbuk National University School of Electronics & Information Engineering, 41 pages (Oct. 26, 2004).

Karn, P., *Re: [amsat-bb] AO-40 Satellite RF Architecture Question*, at http://www.uk/amsat.org/ListArchives/amsat-bb/2002/msg01409.html, 2 pages (Feb. 25, 2002).

Katz, A., *Linearization: Reducing Distortion in Power Amplifiers*, The College of New Jersey, 52 pages (Apr. 16, 2004).

Kaunisto, R., "A Vector-Locked Loop for Power Amplifier Linearization," *IEEE MTT-S International Microwave Symposium Digest*, 4 pages (Jun. 6-11, 2004).

Kelly, W.M. et al., "Vector Modulator, Output Amplifier, and Multiplier Chain Assemblies for a Vector Signal Generator," *Hewlett-Packard Journal*, vol. 38, No. 11, pp. 48-52 (Dec. 1987).

Kenington, P.B. et al., "Broadband Linearisation of High-Efficiency Power Amplifiers," *Proceedings of the Third International Mobile Satellite Conference*, pp. 59-64 (1993).

Kim, I. et al., "The linearity and efficiency enhancement using 3-way Doherty amplifier with uneven power drive," *International Technical Conference on Circuits/Systems, Computers and Communications*, Jeju, Korea, pp. 369-370 (Jul. 2005).

Kim, J. et al., "Optimum Operation of Asymmetrical-Cells-Based Linear Doherty Power Amplifiers—Uneven Power Drive and Power Matching," *IEEE Transactions on Microwave Theory and Techniques*, vol. 53, No. 5, pp. 1802-1809 (May 2005).

Kosugi, H. et al., "A High-Efficiency Linear Power Amplifier Using an Envelope Feedback Method," *Electronics and Communications in Japan*, Part 2, vol. 77, No. 3, pp. 50-57 (1994).

Kurzrok, R., "Simple Lab-Built Test Accessories for RF, IF, Baseband and Audio," *High Frequency Electronics*, pp. 60 and 62-64 (May 2003).

Langridge, R. et al., "A Power Re-Use Technique for Improved Efficiency of Outphasing Microwave Power Amplifiers," *IEEE Transactions on Microwave Theory and Techniques*, vol. 47, No. 8, pp. 1467-1470 (Aug. 1999).

Li, C. et al., "Optimal IDM-MISO Transmit Strategy with Partial CSI at Transmitter," 6 pages, downloaded Jun. 2006 from http://www288.pair.com/ciss/ciss/numbered/36.pdf.

Love, D.J. et al., "Grassmannian Beamforming for Multiple-Input Multiple-Output Wireless Systems," pp. 1-29, downloaded Jun. 2006 from http://www.math.ucdavis.edu/~strohmer/papers/2003/grassbeam.ps.gz, Jun. 3, 2003.

Lyles, J.T.M., *[AMPS] Amplifuzz [TSPA]*, http://lists.contesting.com/pipermail/amps/2005-January/042303.html, 2 pages (Jan. 28, 2005).

*Manuals and Schematics*, at http://www.lks.net/~radio/Pages/manuals.htm, 8 pages (last update Aug. 23, 2005).

Masse, D., "Advanced Techniques in RF Power Amplifier Design," *Microwave Journal (International Edition)*, vol. 45, Issue 9, p. 216 (Sep. 2002).

Masse, D., "Design of Linear RF Outphasing Power Amplifiers," *Microwave Journal (International Edition)*, vol. 47, Issue 7, p. 152 (Jul. 2004).

McCune, E., "High-Efficiency, Multi-Mode Multi-Band Terminal Power Amplifiers," *IEEE Microwave Magazine*, vol. 6, No. 1, pp. 44-55 (Mar. 2005).

McPherson, D.S. et al., "A 28 GHz HBT Vector Modulator and its Application to an LMCS Feedforward Power Amplifier," *28th European Microwave Conference*—Amsterdam, vol. 1, pp. 523-528 (1998).

*Mead Education: Information Registration: RF Transceivers and Power Amplifiers*, at http://www.mead.ch/htm/ch/bios_texte/RF-PA_05_text.html, 3 pages (printed Sep. 1, 2005).

Morais, D.H. and Feher, K., "NLA-QAM: A Method for Generating High-Power QAM Signals Through Nonlinear Amplification," *IEEE Transactions on Communications*, vol. COM-30, No. 3, pp. 517-522 (Mar. 1982).

Moustakas, A.L. and Simon, S.H., "Optimizing multiple-input single-output (MISO) communication systems with general Gaussian channels; nontrivial covariance and nonzero mean," *IEEE Trans. on Information Theory*, vol. 49, Issue 10, pp. 2770-2780, Oct. 2003.

Musson, D.R., "Ampliphase . . . for Economical Super-Power AM Transmitters", *Broadcast News*, vol. No. 119, pp. 24-29 (Feb. 1964).

Norris, G.B. et al., "A Fully Monolithic 4-18 GHZ Digital Vector Modulator," *IEEE MTT-S International Microwave Symposium Diges*, pp. 789-792 (1990).

Olson, S.A. and Stengel, R.E., "LINC Imbalance Correction using Baseband Preconditioning," *Proceedings IEEE Radio Wireless Conference*, pp. 179-182 (Aug. 1-4, 1999).

Pereyra, L. A., "Modulation techniques for radiodiffusion transmitters," *Revista Telegrafica Electronica*, vol. 67, No. 801, pp. 1132-1138 and 1148 (Oct. 1979).

Pigeon, M., "A CBC Engineering Report: Montreal Antenna Replacement Project," *Broadcast Technology*, vol. 15, No. 4, pp. 25-27 (Jan. 1990).

Poitau, G. et al., "Experimental Characterization of LINC Oupthasting Combiners' Efficiency and Linearity," *Proceedings IEEE Radio and Wireless Conference*, pp. 87-90 (2004).

Price, T.H., "The Circuit Development of the Ampliphase Broadcasting Transmitter," *The Proceedings of The Institution of Electrical Engineers*, vol. 101, pp. 391-399 (1954).

Qiu, R.C. et al., "Time Reversal with MISO for Ultra-Wideband Communications: Experimental Results (*invited paper*)," 4 pages, downloaded Jun. 2006 from http://iweb.tntech.edu/rqiu/paper/conference/RWS06Qiu_TH2B1.pdf.

Raab, F.H. et al., "Power Amplifiers and Transmitters for RF and Microwave," *IEEE Transactions on Microwave Theory and Techniques*, vol. 50, No. 3, pp. 814-826 (Mar. 2002).

Raab, F.H. et al., "RF and Microwave Power Amplifier and Transmitter Technologies—Part 1," *High Frequency Electronics*, pp. 22, 24, 26, 28, 29, 30, 32, 34, and 36 (May 2003).

Raab, F.H. et al., "RF and Microwave Power Amplifier and Transmitter Technologies—Part 3," *High Frequency Electronics*, pp. 34, 36, 38, 40, 42-44, 46, and 48 (2003).

Raab, F.H. et al., "RF and Microwave Power Amplifier and Transmitter Technologies—Part 5," *High Frequency Electronics*, pp. 46, 48-50, 52, and 54 (2004).

Raab, F.H., "Efficiency of Doherty RF-Power Amplifier Systems" *IEEE Transactions on Broadcasting*, vol. BC-33, No. 3, pp. 77-83 (Sep. 1987).

Raab, F.H., "Efficiency of Outphasing RF Power-Amplifier Systems," *IEEE Transactions on Communications*, vol. COM-33, No. 10, pp. 1094-1099 (Oct. 1985).

Rabjohn, G. and Wight, J., "Improving Efficiency, Output Power with 802.11a Out-Phasing PAs," at http://www.us.design-reuse.com/articles/article6937.html, 8 pages (Jan. 9, 2004).

Rustako, A.J. and Yeh, Y.S., "A Wide-Band Phase-Feedback Inverse-Sine Phase Modulator with Application Toward a LINC Amplifier," *IEEE Transactions on Communications*, vol. COM-24, No. 10, pp. 1139-1143 (Oct. 1976).

Saleh, A.A.M. and Cox, D.C., "Improving the Power-Added Efficiency of FET Amplifiers Operating with Varying-Envelope Signals," IEEE Transactions on Microwave Theory and Techniques, vol. 31, No. 1, pp. 51-56 (Jan. 1983).

Saraga, W., "A new version of the out-phasing (quadrature-modulation) method for frequency translation (SSB generation and detection)," *Transmission Aspects of Communications Networks*, pp. 131-134 (1964).

Shi, B. and Sundström, L., "A 200-MHz IF BiCMOS Signal Component Separator for Linear LINC Transmitters," *IEEE Journal of Solid-State Circuits*, vol. 35, No. 7, pp. 987-993 (Jul. 2000).

Shi, B. and Sundström, L., "A Voltage-Translinear Based CMOS Signal Component Separator Chip for Linear LINC Transmitters," *Analog Integrated Circuits and Signal Processing*, 30, pp. 31-39 (2002).

Shi, B. and Sundström, L., "Investigation of a Highly Efficient LINC Amplifier Topology," *Proceedings IEEE 45th Vehicular Technology Conference*, vol. 2, pp. 1215-1219 (Oct. 7-11, 2001).

(56) References Cited

OTHER PUBLICATIONS

Shin, B. et al., "Linear Power Amplifier based on 3-Way Doherty Amplifier with Predistorter," *IEEE MTT-S International Microwave Symposium Digest*, pp. 2027-2030 (2004).

Simon, M. and Weigel, R., "A Low Noise Vector Modulator with integrated Basebandfilter in 120 nm CMOS Technology," *2003 IEEE Radio Frequency Integrated Circuits Symposium*, pp. 409-412 (2003).

Skarbek, I. "New High-Efficiency 5-KW AM Transmitter 'Unique Class C Amplifier Operates with 90% Efficiency'," *RCE Broadcast News # 107*, pp. 8-13 (Mar. 1960).

Sokal, N. O., "RF Power Amplifiers, Classes A though S—How they Operate, and When to Use Each," *Electronics Industries Forum of New England, Professional Program Proceedings*, Boston, MA, pp. 179-252 (1997).

Staudinger, J. et al, "High Efficiency CDMA RF Power Amplifier Using Dynamic Envelope Tracking Technique," *IEEE MTT-S International Microwave Symposium Digest*, vol. 2, pp. 873-876 (Jun. 11-16, 2000).

Stengel, B. and Eisenstadt, W.R., "LINC Power Amplifier Combiner Method Efficiency Optimization," *IEEE Transactions on Vehicular Technology*, vol. 49, No. 1, pp. 229-234 (Jan. 2000).

Sundström, L. "Spectral Sensitivity of LINC Transmitters to Quadrature Modulator Misalignments," *IEEE Transactions on Vehicular Technology*, vol. 49, No. 4, pp. 1474-1487 (Jul. 2000).

Sundström, L., "Automatic adjustment of gain and phase imbalances in LINC transmitters," *Electronics Letters*, vol. 31, No. 3, pp. 155-156 (Feb. 2, 1995).

Sundström, L., "Effect of modulation scheme on LINC transmitter power efficiency," *Electronics Letters*, vol. 30, No. 20, pp. 1643-1645 (Sep. 29, 1994).

Sundström, L., "Effects of reconstruction filters and sampling rate for a digital signal component separator on LINC transmitter performance," *Electronics Letters*, vol. 31, No. 14, pp. 1124-1125 (Jul. 6, 1995).

Sundström, L., "The Effect of Quantization in a Digital Signal Component Separator for LINC Transmitters," *IEEE Transactions on Vehicular Technology*, vol. 45, No. 2, pp. 346-352 (May 1996).

Sundström, L., *Digital RF Power Amplifier Linearisers Analysis and Design*, Department of Applied Electronics, Lund University, pp. i-x and 1-64 (1995).

Tan, J. S. and Gardner, P., "A LINC Demonstrator Based on Switchable Phase Shifters," *Microwave and Optical Technology Letters*, vol. 35, No. 4, pp. 262-264 (Nov. 20, 2002).

Tchamov, N. T., *Power Amplifiers*, Tampere University of Technology, Institute of Communications Engineering, RF-ASIC Laboratory, 26 pages (May 17, 2004).

TDP: RCA BHF-100A, at http://www.transmitter.be/rca-bhf100a.html, 8 pages (printed Jun. 15, 2005).

*The Ampliphase Ancestry*, at http://www.rossrevenge.co.uk/tx/ancest.htm, 8 pages, (latest update Aug. 2002).

Tomisato, S. et al., "Phase Error Free LINC Modulator," *Electronics Letters*, vol. 25, No. 9, pp. 576-577 (Apr. 27, 1989).

Ullah, I., "Exciter Modulator for an Ampliphase Type Broadcast Transmitter," *ABU Technical Review*, No. 62, pp. 21-27 (May 1979).

Ullah, I., "Output Circuit of an Ampliphase Broadcast Transmitter," *ABU Technical Review*, No. 63, pp. 17-24 (Jul. 1979).

Vasyukov, V.V. et al., "The Effect of Channel Phase Asymmetry on Nonlinear Distortions in Modulation by Dephasing," *Radioelectronics and Communications Systems*, vol. 28, No. 4, pp. 86-87 (1985).

Venkataramani, M., *Efficiency Improvement of WCDMA Base Station Transmitters using Class-F power amplifiers*, Thesis, Virginia Polytechnic Institute, Blacksburg, Virginia, pp. i-xi and 1-55 (Feb. 13, 2004).

Virmani, B.D., "Phase-to-amplitude modulation," *Wireless World*, vol. 61, No. 4, pp. 183-187 (Apr. 1955).

Wang, F. et al., "Envelope Tracking Power Amplifier with Pre-Distortion Linearization for WLAN 802.11g," *2004 IEEE MTT-S International Microwave Symposium Digest*, vol. 3, pp. 1543-1546 (Jun. 6-11, 2004).

Whitaker, Jerry C., *Power Vacuum Tubes Handbook* (*Electronics Handbook Series*), CRC Publishing, ISBN No. 0849313457, pp. 236-238 (May 1999).

Wight, J., "Computational microwave circuits arrive," at http://www.eetimes.com/showArticle.jhtml?articleID=18900752, EE Times, 3 pages (Apr. 12, 2004).

Wilds, R.B., "An S-Band Two-Phase Demodulator," pp. 48-53 (Aug. 1958).

Woo, Y.Y. et al., "SDR Transmitter Based on LINC Amplifier with Bias Control," *IEEE MTT-S International Microwave Symposium Digest*, pp. 1703-1706 (2003).

Ya, S. et al., "A C-Band Monolithic Vector Modulator," *Research & Progress of SSE*, vol. 14, No. 4, pp. 302-306 (Nov. 1994).

Yang, Y. et al., "A Fully Matched N-Way Doherty Amplifier With Optimized Linearity," *IEEE Transactions on Microwave Theory and Techniques*, vol. 51, No. 3. pp. 986-993 (Mar. 2003).

Yang, Y. et al., "A Microwave Doherty Amplifier Employing Envelope Tracking Technique for High Efficiency and Linearity," *IEEE Microwave and Wireless Components Letters*, vol. 13, No. 9, pp. 370-372 (Sep. 2003).

Yang, Y. et al., "Experimental Investigation on Efficiency and Linearity of Microwave Doherty Amplifier," IEEE, 4 pages (2001).

Yang, Y. et al., "Optimum Design for Linearity and Efficiecny of a Microwave Doherty Amplifier Using a New Load Matching Technique," *Microwave Journal*, 8 pages (Dec. 1, 2001).

Yankin, V. A., "Effect of quantization, amplifier noise and the parameters of the calibration elements on the accuracy of measurement using a six-port microwave ampliphasemeter," *Radioelectronics and Communication Systems*, vol. 32, No. 8, pp. 110-112 (1989).

Yao, J. and Long, S.I., "High Efficiency Switching-Mode Amplifiers for Mobile Base Station Applications," Final Report 2002-2003 Final Report for MICRO Project 02-044, 4 pages (2002-2003).

Yao, J. et al., "High Efficiency Switch Mode Amplifiers for Mobile and Base Station Applications," Final Report 2000-2001 for MICRO Project 00-061, 4 pages (2000-2001).

Yi, J. et al., "Effect of efficiency optimization on linearity of LINC amplifiers with CDMA signal," *IEEE MTT-S International Microwave Symposium Digest*, vol. 2, pp. 1359-1362 (May 2001).

Zhang, X., *An Improved Outphasing Power Amplifier System for Wireless Communications*, Dissertation, University of California, San Diego, pp. i-xvii and 1-201 (2001).

Zhang, X. and Larson, L.E., "Gain and Phase Error-Free LINC Transmitter," *IEEE Transactions on Vehicular Technology*, vol. 49, No. 5, pp. 1986-1994 (Sep. 2000).

Zhang, X. et al. "Gain/Phase Imbalance-Minimization Techniques for LINC Transmitters," *IEEE Transactions on Microwave Theory and Techniques*, vol. 49, No. 12, pp. 2507-2516 (Dec. 2001).

Zhang, X. et al., "A Gain/Phase Imbalance Minimization Technique for LINC Transmitter," *IEEE MTT-S International Microwave Symposium Digest*, pp. 801-804 (2001).

Zhang, X. et al., "Analysis of Power Recycling Techniques for RF and Microwave Outphasing Power Amplifiers," *IEEE Transactions on Circuits and Systems II: Analog and Digital Signal Processing*, vol. 49, No. 5, p. 312-320 (May 2002).

Zhang, X. et al., "Calibration scheme for LINC transmitter," *Electronics Letters*, vol. 37, No. 5, pp. 317-318 (Mar. 1, 2001).

Zhang, X. et al., *Design of Linear RF Outphasing Power Amplifiers*, entire book, Artech House, ISBN No. 1-58053-374-4 (2003).

Zhong, S.S. and Cui, J.H., "A New Dual Polarized Aperture-Coupled Printer Array for SAR Applications," *Journal of Shanghai University (English Edition)*, vol. 5, No. 4, pp. 295-298 (Dec. 2001).

English Abstract for European Patent Publication No. EP 0 639 307 B1, published Feb. 22, 1995, downloaded from http://v3.espacenet.com, 1 page.

English Abstract for European Patent Publication No. EP 0 708 546 A2, published Apr. 24, 1996, downloaded from http://v3.espacenet.com, 1 page.

(56) References Cited

OTHER PUBLICATIONS

English Abstract for European Patent Publication No. EP 0 892 529 A2, published Jan. 20, 1999, downloaded from http://v3.espacenet.com, 1 page.
English Abstract for Japanese Patent Publication No. JP 60-63517 A, published Apr. 11, 1985, downloaded from http://v3.espacenet.com, 1 page.
English Abstract for Japanese Patent Publication No. JP 2-87708 A, published Feb. 28, 1990, downloaded from http://v3.espacenet.com, 1 page.
English Abstract for Japanese Patent Publication No. JP 3-232307 A, published Oct. 16, 1991, downloaded from http://v3.espacenet.com, 1 page.
English Abstract for Japanese Patent Publication No. JP 5-22046 A, published Jan. 29, 1993, downloaded from http://v3.espacenet.com, 1 page.
English Abstract for Japanese Patent Publication No. JP 6-338728 A, published Dec. 6, 1994, downloaded from http://v3.espacenet.com, 1 page.
English Abstract for Japanese Patent Publication No. JP 10-70451 A, published Mar. 19, 1998, downloaded from http://v3.espacenet.com, 1 page.
English Abstract for Japanese Patent Publication No. JP 2001-136057 A, published May 18, 2001, downloaded from http://v3.espacenet.com, 1 page.
English Abstract for Japanese Patent Publication No. JP 2004-260707 A, published Sep. 16, 2004, downloaded from http://v3.espacenet.com, 1 page.
English Translation for Romanian Patent Publication No. RO 100466, published Aug. 20, 1992, obtained from Transperfect Translations, 4 pages.
English Abstract for Romanian Patent Publication No. RO 102824, published Nov. 19, 2001, downloaded from http://v3.espacenet.com, 1 page.
English Translation for Russian Patent Publication No. SU 1322183 A1, published Jul. 7, 1987, obtained from Transperfect Translations, 2 pages.
Notification of Transmittal of the International Search Report and Written Opinion, dated Mar. 4, 2008, for PCT Application No. PCT/US07/06197, 8 pages.
Notification of Transmittal of the International Search Report and Written Opinion, dated Aug. 15, 2008, for PCT Application No. PCT/US08/06360, 6 pages.
Notification of Transmittal of the International Search Report and Written Opinion, dated Sep. 3, 2008, for PCT Application No. PCT/US2008/008118, 6 pages.
Notification of Transmittal of the International Search Report and Written Opinion, dated Sep. 8, 2008, for PCT Application No. PCT/US2008/007623, 6 pages.
Silverman, L. and Del Plato, C., "Vector Modulator Enhances Feedforward Cancellation,"*Microwaves & RF*, pp. 1-4 (Mar. 1998).
Notification of Transmittal of the International Search Report and Written Opinion, dated Jul. 7, 2009, for PCT Application No. PCT/US09/03212, 6 pages.
Jang, M. et al., "Linearity Improvement of Power Amplifier Using Modulation of Low Frequency IMD Signals," *Asia-Pacific Microwave Conference Proceedings*, vol. 2, pp. 1156-1159, Dec. 4-7, 2005.
Woo, W. et al., "A Hybrid Digital/RF Envelope Predistortion Linearization System for Power Amplifiers," *IEEE Transactions on Microwave Theory and Techniques*, vol. 53, No. 1, pp. 229-237, Jan. 2005.
Notification of Transmittal of the International Search Report and Written Opinion, dated Apr. 27, 2010, for PCT Application No. PCT/US2009/057306, 11 pages.
English Abstract for Japanese Patent Publication No. JP 2005-151543 A, published Jun. 9, 2005, downloaded from http://v3.espacenet.com, 1 page.

English Abstract for Japanese Patent Publication No. JP 1-284106 A, published Nov. 15, 1989, downloaded from http://v3.espacenet.com, 1 page.
English Abstract for Japanese Patent Publication No. JP 4-095409 A, published Mar. 27, 1992, downloaded from http://v3.espacenet.com, 1 page.
English Abstract for Japanese Patent Publication No. JP 4-104604 A, published Apr. 7, 1992, downloaded from http://v3.espacenet.com, 1 page.
English Abstract for Japanese Patent Publication No. JP 9-018536 A, published Jan. 17, 1997, downloaded from http://v3.espacenet.com, 1 page.
English Abstract for Japanese Patent Publication No. JP 9-074320 A, published Mar. 18, 1997, downloaded from http://v3.espacenet.com, 1 page.
English Abstract for Japanese Patent Publication No. JP 2000-209291 A, published Jul. 28, 2000, downloaded from http://v3.espacenet.com, 1 page.
English Abstract for Japanese Patent Publication No. JP 2003-298357 A, published Oct. 17, 2003, downloaded from http://v3.espacenet.com, 1 page.
English Abstract for Japanese Patent Publication No. JP 2000-244261 A, published Sep. 8, 2000, downloaded from http://worldwide.espacenet.com, 1 page.
English Abstract for Japanese Patent Publication No. JP 2001-217659 A, published Aug. 10, 2001, downloaded from http://worldwide.espacenet.com, 1 page.
English Abstract for Japanese Patent Publication No. JP 2001-308650 A, published Nov. 2, 2001, downloaded from http://worldwide.espacenet.com, 1 page.
English Abstract for Japanese Patent Publication No. JP 2002-543729 A, published Dec. 17, 2002, downloaded from http://worldwide.espacenet.com, 1 page.
English Abstract for Japanese Patent Publication No. JP 5-037263 A, published Feb. 12, 1993, downloaded from http://worldwide.espacenet.com, 1 page.
English Abstract for Japanese Publication No. JP 2005-101940 A, published Apr. 14, 2005, downloaded from http://worldwide.espacenet.com, 1 page.
Notification of Transmittal of the International Search Report and Written Opinion, dated Aug. 14, 2012, for PCT Appl. No. PCT/US2012/032791, 7 pages.
Harlan, G. et al, "Dynamically-Configurable Multimode Transmitter Systems for Wireless Handsets, Cognitive Radio and SDR Applications," *IEEE International Conference on Microwaves, Communications, Antennas and Electronics Systems*, Nov. 9, 2009, pp. 1-5.
Rawlins, G. and Sorrells, D., "A Thermodynamic Theory of RF Power Transmitters with an Example," *IEEE 10th Annual Wireless and Microwave Technology Conference*, Apr. 20, 2009, pp. 1-5.
Rawlins, G. et al., "Using an IQ Data to RF Power Transmitter to Realize a Highly-Efficient Transmit Chain for Current and Next-Generation Mobile Handsets," *Proceedings of the 38th European Microwave Conference*, Oct. 27, 2008, pp. 579-582.
Notification of Transmittal of the International Search Report and Written Opinion, dated Dec. 14, 2012, for PCT Appl. No. PCT/US2012/040500, 9 pages.
English Abstract for Japanese Patent Publication No. JP H08-163189 A, published Jun. 21, 1996, downloaded from http://worldwide.epacenet.com, 2 pages.
English Abstract for Japanese Patent Publication No. JP 2003-298361 A, published Oct. 17, 2003, downloaded from http://worldwide.espacenet.com, 2 pages.
English Abstract for Japanese Patent Publication No. JP 3-276923 A, published Dec. 9, 1991, downloaded from http://worldwide.espacenet.com, 2 pages.
Notification of Transmittal of the International Search Report and Written Opinion, dated Dec. 31, 2014, for PCT Appl. No. PCT/US2014/056086, 18 pages.
English Abstract for Japanese Patent Publication No. JP 3-247101 A, published Nov. 5, 1991, downloaded from httn://worldwide.espacenet.com, 2 pages.

\* cited by examiner

I/Q MEASURED POLAR VECTOR

180° OUTPHASING CASE

FINAL AVERAGE DC CURRENT THROUGH INDUCTOR

REACTIVE POWER CYCLED IN THE INDUCTOR IN dBr WITH
RELATIVE PSEUDO EFFICIENCY (RIGHT AXIS)
REFERENCED TO PHI = 0

BLENDED OUTPHASING AND BIAS ATTENUATION

CONTROL OF MISO NODE

CROSS-REFERENCE TO RELATED APPLICATIONS

The present application is a continuation of U.S. patent application Ser. No. 13/891,316, filed May 10, 2013, now allowed, which is a continuation of U.S. patent application Ser. No. 12/628,510, filed Dec. 1, 2009, now U.S. Pat. No. 8,461,924, which is a continuation of U.S. patent application Ser. No. 12/142,521, filed Jun. 19, 2008, now U.S. Pat. No. 8,013,675, which claims the benefit of U.S. Provisional Patent Application No. 60/929,239, filed Jun. 19, 2007, and U.S. Provisional Patent Application No. 60/929,584, filed Jul. 3, 2007, which are all incorporated herein by reference in their entireties.

The present application is related to U.S. patent application Ser. No. 11/256,172, filed Oct. 24, 2005, now U.S. Pat. No. 7,184,723 and U.S. patent application Ser. No. 11/508,989, filed Aug. 24, 2006, now U.S. Pat. No. 7,355,470, both of which are incorporated herein by reference in their entireties.

BACKGROUND

Field

Embodiments of the present invention are related generally to power amplification, modulation, and transmission.

Background

Outphasing amplification techniques have been proposed for RF amplifier designs. In several aspects, however, existing outphasing techniques are deficient in satisfying complex signal amplification requirements, particularly as defined by wireless communication standards. For example, existing outphasing techniques employ an isolating and/or a combining element when combining constant envelope constituents of a desired output signal. Indeed, it is commonly the case that a power combiner is used to combine the constituent signals. This combining approach, however, typically results in a degradation of output signal power due to insertion loss and limited bandwidth, and, correspondingly, a decrease in power efficiency.

What is needed therefore are power amplification methods and systems that solve the deficiencies of existing power amplifying techniques while maximizing power efficiency and minimizing non-linear distortion. Further, power amplification methods and systems that can be implemented without the limitations of traditional power combining circuitry and techniques are needed.

BRIEF SUMMARY

In an embodiment, a method for generating a radio frequency (RF) signal is disclosed herein. The method includes generating, with a plurality of analog-to-digital converters, analog control signals. A modulated control signal is generated, using a modulator, based on the analog control signals. A biased modulated control signal is generated, using an amplifier, based on the modulated control signal and a first bias control signal. Further, the RF signal is generated, using a multiple-input-single-output (MISO) device, based on the biased modulated control signal and a second bias control signal.

In another embodiment, an apparatus for generating a radio frequency (RF) signal is disclosed herein. The apparatus includes a plurality of analog-to-digital converters (ADCs), a modulator, an amplifier, and a multiple-input-single-output (MISO) device. Each of the ADCs is configured to generate an analog control signal. The modulator is configured to generate a modulated control signal based on the analog control signals from the plurality of ADCs. The amplifier is configured to generate a biased modulated control signal based on the modulated control signal and a first bias control signal. And, the MISO device is configured to generate the RF signal based on the biased modulated control signal and a second bias control signal.

Each of the ADCs is configured to receive a control signal and to generate an analog control signal. The modulator is configured to generate a modulated control signal based on the analog control signals from the plurality of ADCs. The amplifier is configured to receive the modulated signal and a first bias control signal and to generate a biased modulated control signal. And, the MISO device is configured to receive the biased modulated control signal and a second bias control signal and to generate the RF signal.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

Embodiments of the present invention will be described with reference to the accompanying drawings, wherein generally like reference numbers indicate identical or functionally similar elements. Also, generally, the leftmost digit(s) of the reference numbers identify the drawings in which the associated elements are first introduced.

DETAILED DESCRIPTION

Figure 1:
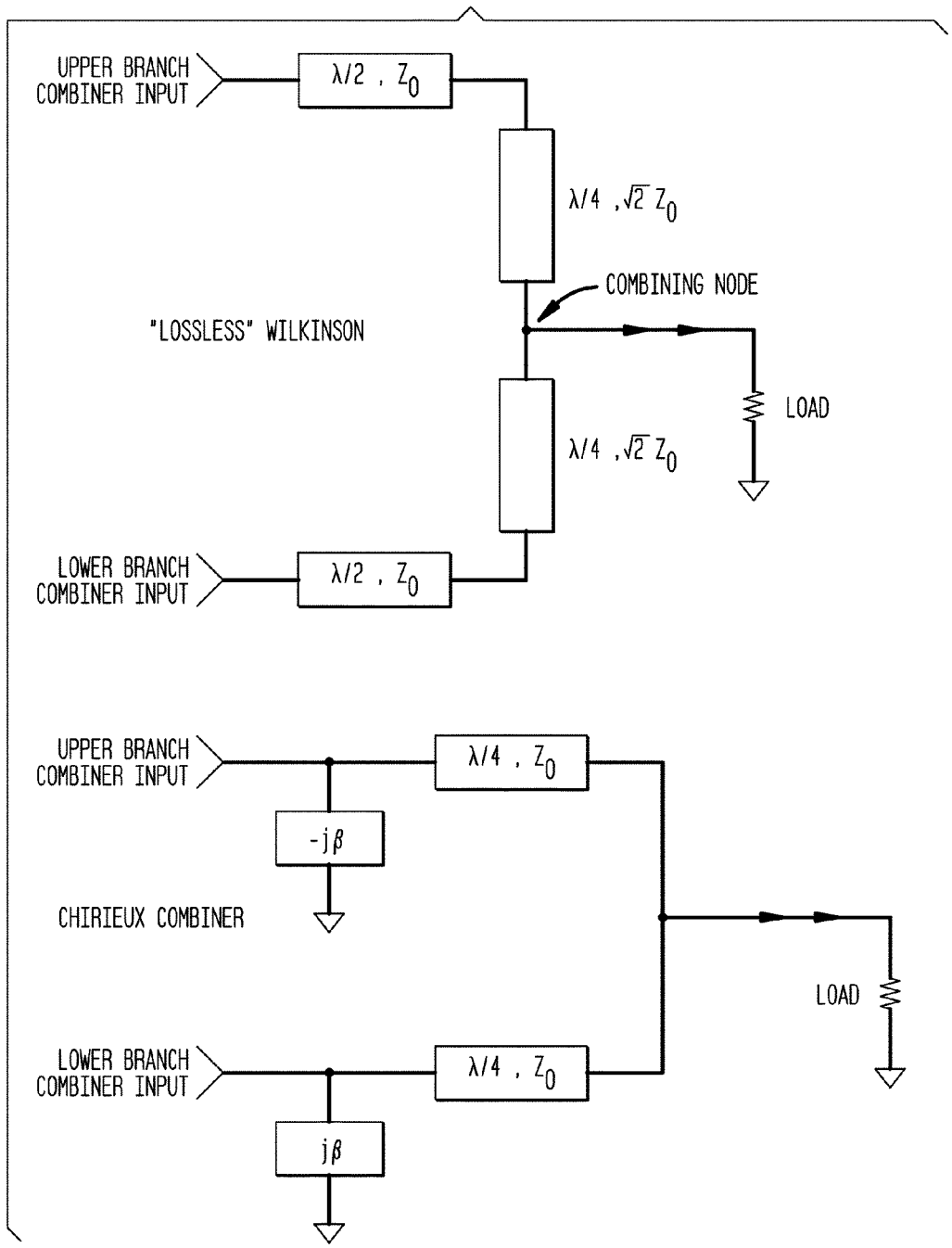
FIG. 1 illustrates two example lossless combiner topologies.

1. Overview
2. Combiner Definition
3. Outphasing and "Lossy" versus "Lossless" Combiner Attributes
4. Output Branch Amplifiers and MISO Amplifier
5. Simplified Laplace Transfer Functions
6. "Lossless" T and MISO Simulation
7. MISO Amplifier Simulations and "Lossless" T Efficiency
   (a) Switching MISO design
   (i) Circuit Performance
8. Lab Results for MISO Amplifiers and VPA System
9. VPA Waveform Processing with Blended Control Functions and Compensation
   (a) Calibration and Compensation
10. Comments on Transient Solutions and a Mathematical Basis for the MISO Node Operation
   (a) R-L MISO Circuit without Load and Variable Duty Cycle
   (b) Blended Outphasing in the R-L Case Without Load
   (c) Equations Related to Outphasing with a Load
   (i) Blended Outphasing Efficiency
11. Summary

1. Overview

A comparison of MISO (multiple input single output) amplifier architectures employing an innovative Vector Power Amplification (VPA) Technology versus conventional outphasing approaches, such as Linear Amplification using Nonlinear Components (LINC), is provided herein. Description of MISO and VPA architectures are presented in U.S. Pat. Nos. 7,184,723 and 7,355,470, both of which are incorporated by reference in their entireties. This comparison is based in simulation results as well as theory. Some concepts are especially expanded on for purposes of this comparison. In particular, since the combining node is a focus of this genre of power amplifier (PA) and is key for many performance metric comparisons, its operation is illustrated in a detailed manner. In addition, an important theme of the comparison is efficiency and its relationship to the combining node operation as well as certain MISO principles.

In sections 2-6, a comparison between MISO and "Lossless" combiners is provided. Section 7 provides simulations which illustrate the efficiency of "Lossless" T and MISO for various blended control MISO approaches. Section 8 provides actual experimental verification of MISO operation and performance, in support of the results presented in Section 7. Section 9 provides the concept of a unified system approach for optimizing the deployment of MISO. Section 10 provides a mathematical view of MISO operation. A summary is presented in Section 11.

2. Combiner Definition

Generally, a combiner is a structure which permits the transfer of energy from two or more branches or inputs to an output. In contrast, MISO includes structure which facilitates the efficient transfer of energy from a power source to a load. Note that the power source may possess any spectral content, and that this does not require that MISO transfer power at all from its inputs to its output. Indeed, MISO inputs can be viewed as control points that create a variable impedance at the combining node or that permit steering currents to enter or leave the node. As such, in the case of ideal switches at the input branches, no power is transferred through the input branches. This is in direct contrast to all conventional outphasing systems which depend on efficient transfer of power through the input branches of the combiner.

There are two categories of combiners generally, "lossless" and "lossy." The industry literature distinguishes between the two categories by noting that lossy combiners provide isolation between the input ports and that lossless combiners do not. In this disclosure, a lossless combiner may or may not possess some form of isolation. In particular, significant time delay is considered a certain type of isolation at certain frequencies.

MISO may be described as lossless. However, as the term "lossless" as used by the industry is often misunderstood or misappropriated, it is useful to provide some insight into conventional combiner properties compared to MISO.

First, it should be noted that lossiness refers to the insertion loss properties of the combiner structure, which combines the branches of an outphasing amplifier to generate the amplifier's output. It is also noted that loss is a function of frequency for most circuits involving non-zero branch impedances. While it may be true that a lossless transmission line (lossless T) has little insertion loss at DC and certain harmonically related frequencies associated with the transmission line branches, it is not lossless at all frequencies for fixed termination impedances. As such, lossless Ts typically possess an operational bandwidth.

Figure 2:
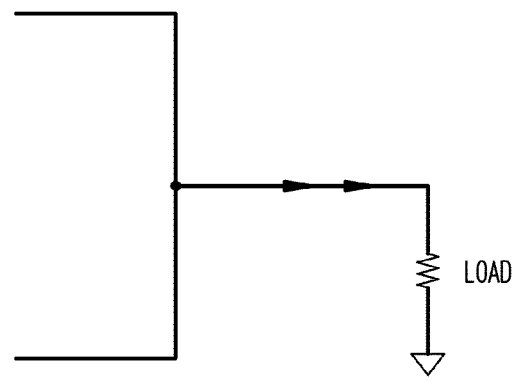
FIG. 2 illustrates an example MISO topology.

Two versions of the classical "lossless" combiner often reported in literature are illustrated in FIG. 1. In particular, the top diagram illustrates a "lossless" Wilkinson combiner and the bottom diagram illustrates a Chireix combiner. In contrast, FIG. 2 illustrates a 2-input MISO topology with load.

Some fundamental differences can be noted between the MISO topology and the classical "lossless" combiner topologies. In particular, differences that relate to impedance, time delay, and frequency response can be noted. Other differences will be apparent to persons skilled in the art.

From one aspect, the MISO topology possesses branch impedances that are substantially equal to zero and thus do not alter phase or amplitude characteristics of the branch currents. This results in no restriction in terms of the frequency response of the topology. In contrast, the "lossless" combiner topologies are in fact lossless at only the design frequency and certain multiples thereof, and thus cause frequency-dependent amplitude as well as phase modifications on the branch currents. In fact, significant phase shifts can be experienced at offsets from the fundamental carrier, which considerably restricts the usable frequency response of the topologies.

From another aspect, the "lossless" combiner topologies utilize reflected wave fronts of transverse-electromagnetic energy (TEM) stored in the transmission lines to constructively or destructively interfere in a precise manner, based on wavelength, to provide time delay isolation between the inputs. In contrast, the MISO topology does not store energy temporally and treats all wavelengths equivalently.

In view of the above, "lossless" combiner topologies have limited bandwidths. While it is possible to design an array of wideband "lossless" combiners, "lossless" combiners can never possess all of the following attributes: small size, low complexity, low cost, and can be implemented in IC technology. However, as will be further shown below, the MISO topology provides a substantial improvement, or is even optimal, with respect to any one of these attributes compared to "lossless" combiner topologies.

3. Outphasing and "Lossy" Versus "Lossless" Combiner Attributes

A variety of amplifier architectures have been analyzed in the literature, such as LINC, to evaluate the tradeoffs between lossless and lossy combiners. In particular, Conradi, Johnston, and McRory, "Evaluation of a Lossless Combiner in a LINC Transmitter," Proceedings of the 1999 IEEE Canadian Conference on Electrical and Computer Engineering, May 1999, found that a lossy matched combiner (which provides some branch isolation) provides better baseline linearity performance in the overall LINC output response of a LINC architecture than a lossless combiner. However, the evaluation found that the lossless combiner provides better efficiency. This can be explained by the fact that a lossy combiner (e.g., Wilkinson) includes a resistor in its topology, which results in power being dissipated in the combiner, adversely affecting the efficiency of the combiner but providing input branch isolation.

MISO optimizes efficiency. In an embodiment, linearity is achieved by means such as VPA Technology used in conjunction with a MISO amplifier.

In terms of efficiency, lossy combiner architectures are not competitive in today's cellular and mobile wireless market. While other techniques may be employed with lossy combiner architectures to trim efficiency losses in the architecture, these techniques often introduce non-linearities.

In embodiments, MISO designs opt for high efficiency combiner architecture and combine characterization, compensation, and/or calibration to address time variant system non-linearities, which are typically associated with transistor technology. As such, MISO enhances efficiency while dedicating digital and/or analog algorithms to linearize the entire VPA architecture, not just the combiner. Further, the necessary combiner properties are maintained without isolation by employing VPA Technology to adjust the combiner sources that drive the combiner's inputs.

4. Output Branch Amplifiers and Miso Amplifier

In traditional architectures, the branch amplifiers are treated as individual entities with unique inputs and outputs that can be described in terms of their respective transfer characteristics. Whenever these classical amplifiers are employed with a lossy combiner, analysis is manageable provided that the branch amplifiers are at constant bias. However, if conventional amplifiers are employed with a lossless combiner, then the analysis becomes more complicated at the circuit level if complete transistor models are used. That is why system level analysis and characterization are often preferred.

A MISO amplifier is intricate at the circuit level as well but simpler to analyze than a conventional amplifier using a lossless combiner. In fact, embodiments of the MISO amplifier can be viewed as a single unit with multiple inputs and a single output, with the inputs interacting or not. The single output of the exemplary MISO amplifier is a complicated function of the inputs, at the detailed circuit level. However, system level characterization of the MISO amplifier can be simplified when the combiner is viewed as a variable impedance node, with impedance given as a function of outphasing angle or other MISO state. This variable impedance node collects the sum of multiple branch steering currents whenever a power source is available at the summing node. The combiner node uses several means to efficiently integrate the branch currents into a single branch. For example, outphasing, bias control, power control, amplitude control, and/or impedance control can be used. In an embodiment, in the limiting case, when the MISO amplifier input branches are modulated as nearly ideal switches, the combiner node input waveforms are symmetrically pulse width modulated as a function of the outphasing angle. In an embodiment, the modulated pulses repeat at the carrier rate or at some integrally related submultiples or multiple. Further, the pulses are harmonically rich. Therefore, a frequency selective network is utilized to isolate and match the fundamental or desired harmonic to the load.

According to an embodiment of the present invention, a MISO amplifier integrates all of the features of a switching amplifier with the summing node in a single efficient structure. A traditional LINC amplifier, on the other hand, treats the amplifiers in each branch as separate entities to be optimized prior to the cascade of the power combiner.

Raab et al., "RF and Microwave Power Amplifier and Transmitter Technologies—Part 3," High Frequency Electronics 2003, provides an overview of classes of amplifiers which can be used with the LINC architecture. Similarly, MISO architecture embodiments can use all of these classes of operation. However, in an embodiment, the highest efficiency is attained whenever the branch amplifiers and the MISO amplifier are operated in switch mode.

Figure 3:
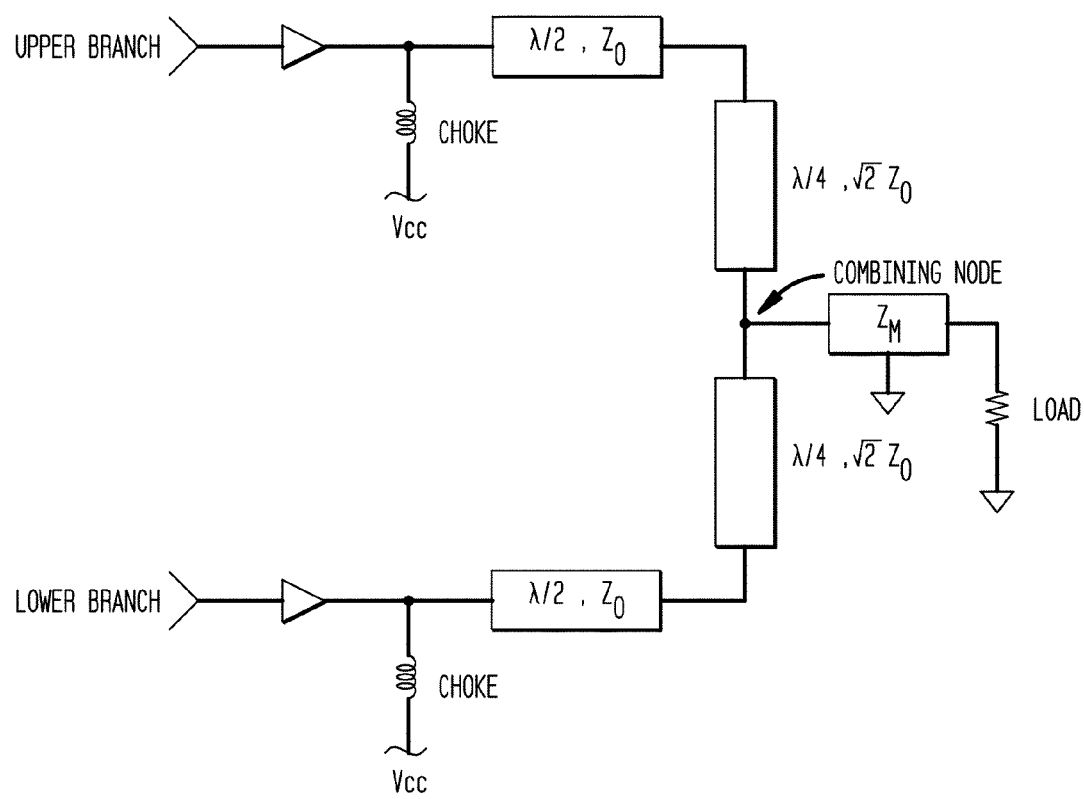
FIG. 3 illustrates a conventional branch amplifier topology with a lossless combiner.
Figure 4:
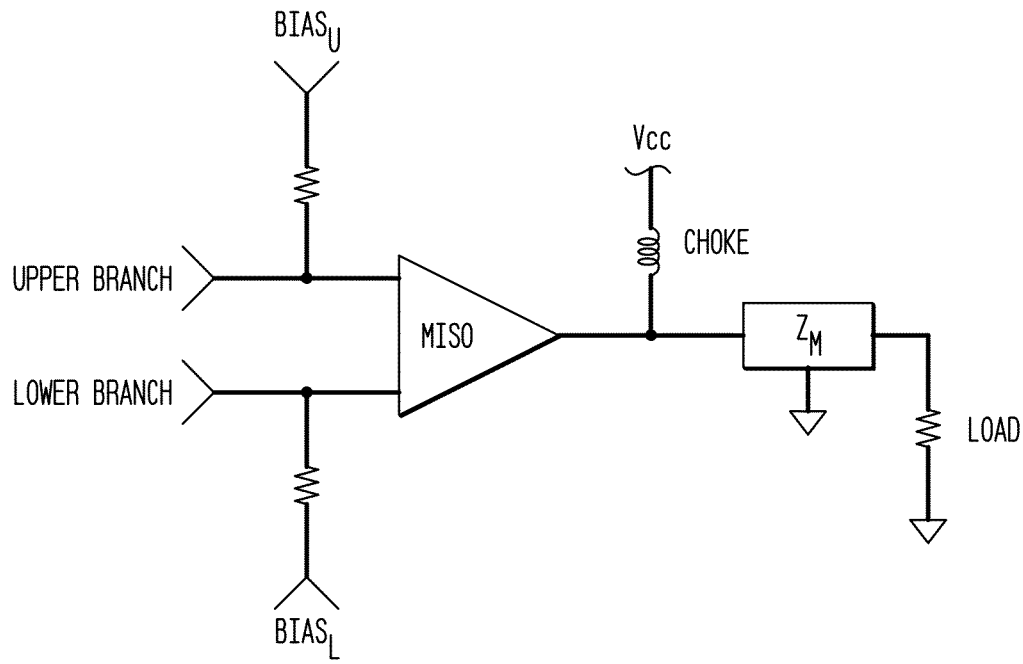
FIG. 4 illustrates an example MISO amplifier topology.

Consider the two circuit topologies in FIGS. 3 and 4. FIG. 3 illustrates a conventional branch amplifier topology with a lossless combiner. FIG. 4 illustrates a MISO amplifier topology according to an embodiment of the invention. An important difference between the two topologies relates to isolation between the branches. It is noted, for example, that currents at the combining node interact through bandwidth dependent complex impedances in the lossless combiner topology. In contrast, the MISO amplifier topology does not suffer from this restriction. This difference becomes even more important when switch mode operation is invoked. Indeed, the currents flowing from the combiner node through the MISO amplifier can be virtually instantaneously interactive with their branch switching elements. Traditional topologies, on the other hand, do not permit this instantaneous interaction, with either the switch elements or the load branch. In this sense, the lossless T possesses a form of isolation, known as time isolation, while the MISO amplifier generates steering currents or summing currents which contend for the node without isolation.

Switching transient terms and harmonic content are major considerations for the efficiency of a switching amplifier. If the transients are limited or if the harmonic content is misused, it is not possible for the amplifier to operate efficiently. Indeed, the literature is replete with analyses and examples for Class "E" and Class "F" amplifiers which require from 3 to 10 harmonics along with proper management of the conduction angles for current and voltage to obtain a desired result. It is important therefore to note that harmonics are not altered by the combiner transfer function in a MISO amplifier, according to an embodiment of the present invention.

5. Simplified Laplace Transfer Functions

Figure 5:
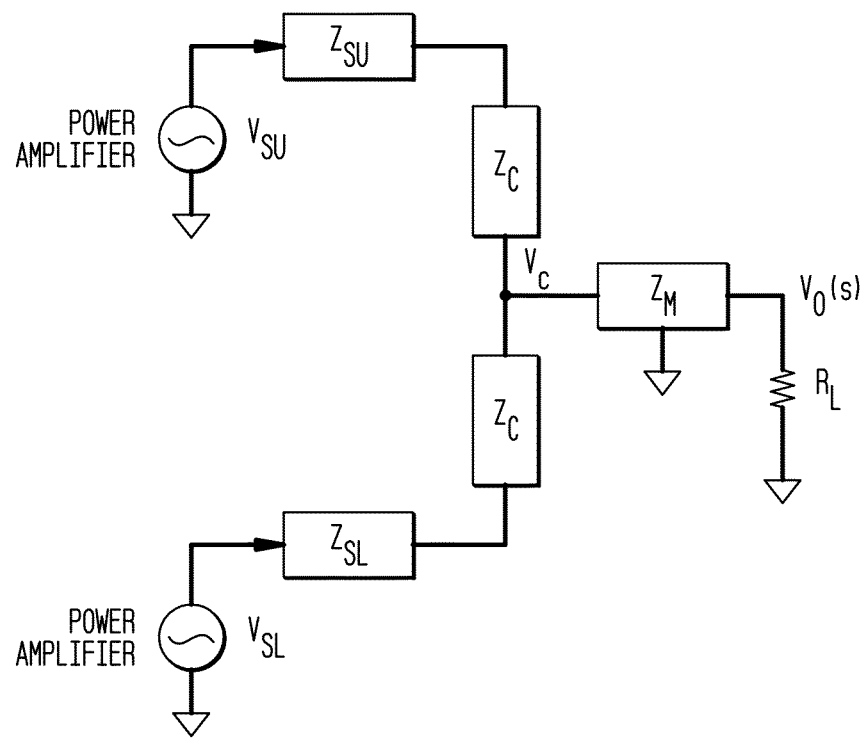
FIG. 5 illustrates a traditional topology with lossless combiner.
Figure 6:
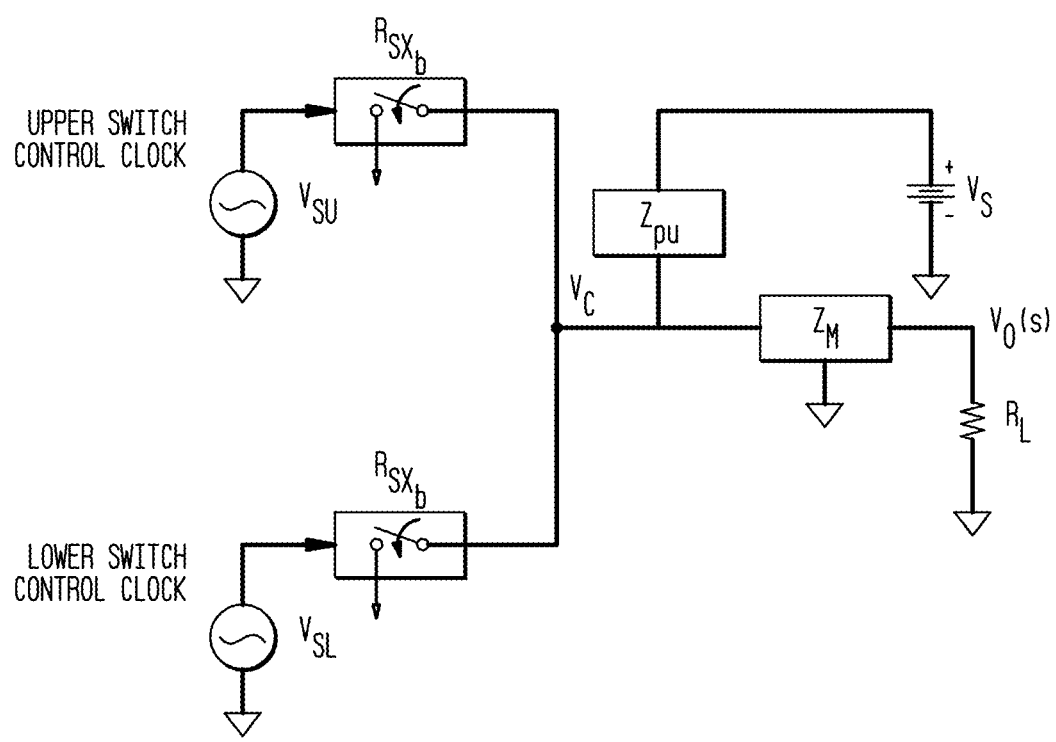
FIG. 6 illustrates an example MISO topology.

The combiner topologies of FIGS. 3 and 4 can be further analyzed using the circuits of FIGS. 5 and 6. FIG. 5 illustrates a traditional topology with lossless combiner. FIG. 6 illustrates an example MISO topology according to an embodiment of the present invention.

Analyzing the circuit of FIG. 5 in the Laplace domain yields:

$$\frac{V_0(s)}{V_S(s)} = (1 + e^{-T_M s})\left(\frac{(\mathcal{Z}_C + \mathcal{Z}_S)R_L}{(\mathcal{Z}_C + \mathcal{Z}_S)((\mathcal{Z}_M + R_L) + (\mathcal{Z}_M + R_L + \mathcal{Z}_C + \mathcal{Z}_S))}\right)$$

$V_{SU}(s) = V_{SL}(s)e^{-T_M s}$ (Upper and Lower Branch Source Transform)

$V_S \triangleq V_{SU}$ $T_M \triangleq$ Delay difference between Upper and Lower Branch Input Signals related to Modulation and Outphasing Angle.

$T_C \triangleq$ Carrier Cycle Time $\mathcal{Z}_C \triangleq$ Combiner Branch Impedance (T-line description for "Lossless" Wilkinson or other "Lossless" T.)

$\mathcal{Z}_S \triangleq$ Impedance of Upper or Lower Branch Source assumed to be the same.

In these models, the upper and lower branch sources are identical except for the time delay (phase term) related by $T_M$. $T_M$ can vary according to the modulation envelope. It is possible to create modulation angles such that $T_M$ forces a transfer function which approaches zero. An alternate form of the simplified Laplace Transfer Function of the topology of FIG. 5 can be written as:

$$\frac{V_0(s)}{V_S(s)} = e^{-\tau_D s}(1 + e^{-T_M s})$$

$$\left(\frac{(\mathcal{Z}'_C + \mathcal{Z}'_S)R_L}{(\mathcal{Z}'_C + \mathcal{Z}'_S)((\mathcal{Z}_M + R_L) + (\mathcal{Z}_M + R_L + \mathcal{Z}'_C + \mathcal{Z}'_S))}\right)$$

$\mathcal{Z}'_C \triangleq$ Impedance Transformation for the "Lossless" Combiner Bench $\tau_D \triangleq$ Effective Delay through the "Lossless" Combiner Branch In this form it can be seen that the exponent, $\tau_D$, for combiner branch delay forces different impedance values at different harmonics of the carrier, which in turn modifies $V_O(s)/V_S(s)$ at those harmonics.

The transfer function of the MISO topology of FIG. 6 can be written as:

$$\frac{R_L i_L(s)}{V_S} = \frac{R_L}{s\left(\alpha_1(s)\left(\not{Z}_{pu} + \frac{R_a}{U_a(s)}\right) - \alpha_0(s)\frac{R_b}{U_a(s)}\right)}$$

$$\alpha_1(s) = \left(\frac{U_a(s)}{R_a} + \frac{U_b(s)}{R_b}\right)\left(\frac{R_b}{U_b(s)} + R_L + \not{Z}_M\right) - \frac{R_b U_a(s)}{R_a U_b(s)}$$

$$\alpha_0(s) = \frac{U_b(s)}{R_b}\left(\frac{R_b}{U_b(s)} + R_L + \not{Z}_M\right)$$

$$R_{SX_a} = \frac{R_a}{U_a(s)}$$

$$R_{SX_b} = \frac{R_b}{U_b(s)}$$

$$U_a(s) = \sum_{k=0}^{\infty} (e^{-ks} - e^{-s(k+1/2)T_C})\frac{1}{s}$$

$$U_b(s) = \sum_{k=0}^{\infty} (e^{-ks} - e^{-s(k+1/2)T_C})\frac{e^{-s(T_M)}}{s}$$

In the MISO model, a main difference is the fact that rather than voltage sources which combine power via the combiner branches, the power transfer occurs from the battery to the combiner node by the operation of switched resistances on the combiner inputs. These switching cycles generate currents, causing energy storage in $\not{Z}_{pu}$. The energy is then released to the load, when the switches open. The combiner inputs do not transfer power whenever $R_a = R_b = 0, \infty$.

Although $V_O(s)/V_S(s)$ was calculated above, for convenience, it should be apparent based on the teachings herein that $I_O(s)/I_S(s)$ can be obtained from the relationships:

$$I_0(s) = \frac{V_0(s)}{R_L}$$

$$I_S(s) = \frac{V_S(s)}{\not{Z}_S(s)}$$

$T_M$ varies according to the outphasing angle and correspondingly forces a different impedance at the combiner node. This is further examined in section 6 below, which illustrates this phenomenon with S-parameters.

6. "Lossless" T and Miso Simulation

A simulation using ADS (Advanced Design System) reveals the differences between conventional lossless combiner topologies and example MISO topologies from an S-Parameter (Scattering parameter) point of view.

Figure 7:
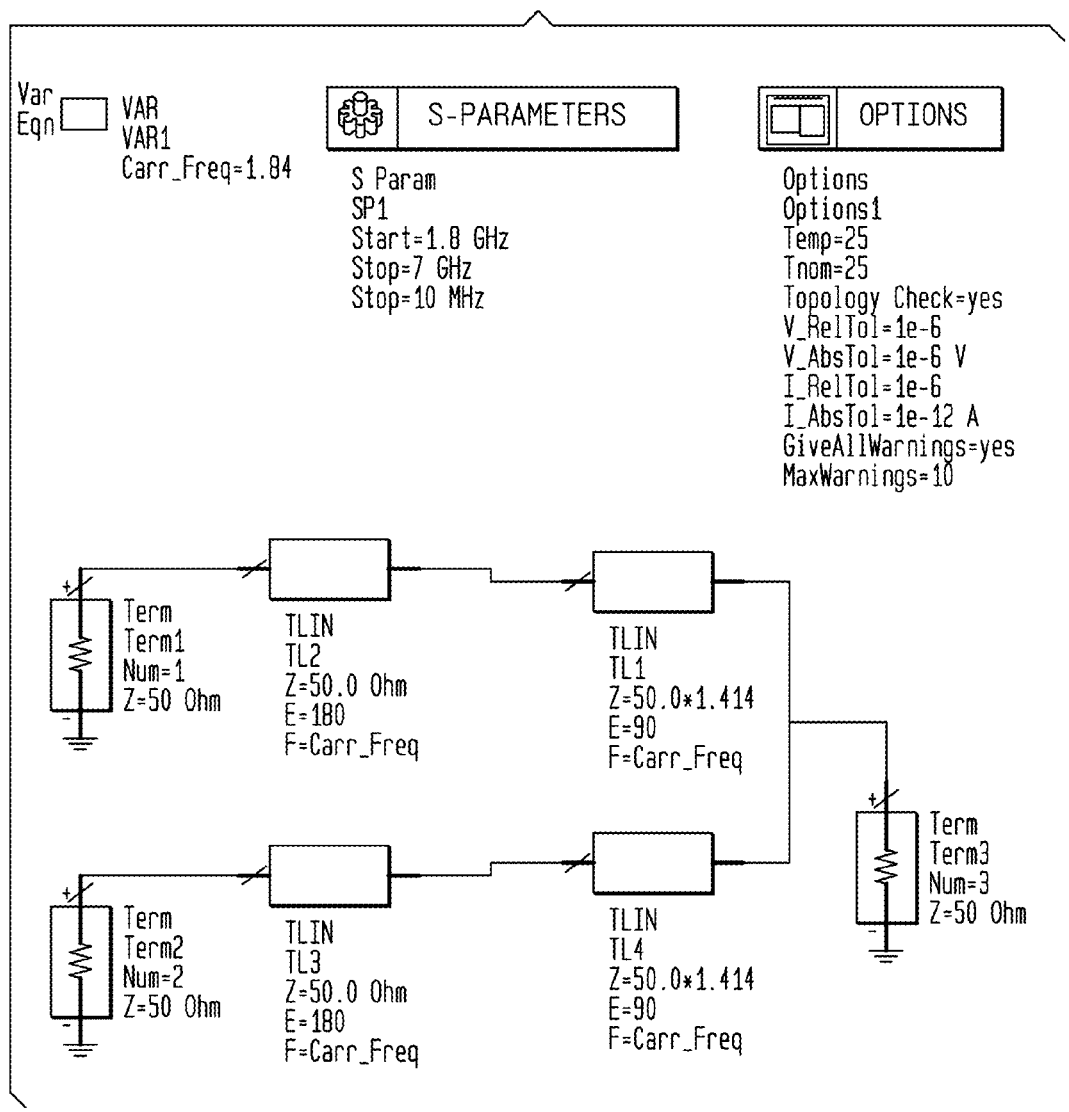
FIG. 7 illustrates an S-parameter test bench for a lossless T-line (lossless T).

FIG. 7 illustrates an S-parameter test bench for a lossless T, which uses a common compound transmission line. Simulations results using the S-parameter test bench of FIG. 7 are illustrated in FIGS. 8-12.

Figure 8:
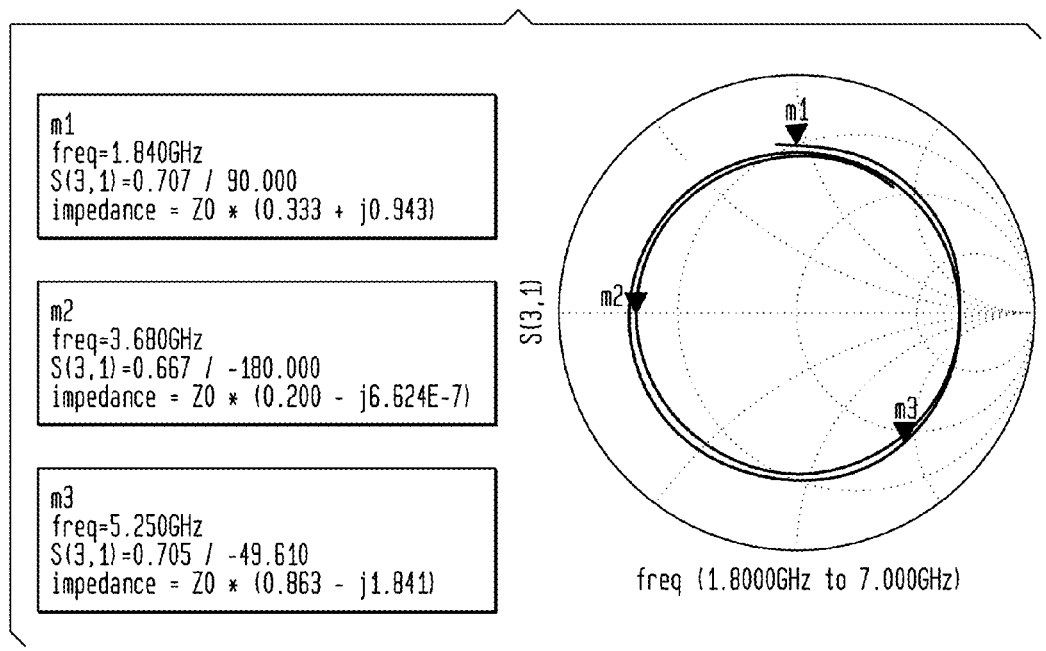
FIG. 8 illustrates an example plot of branch impedance for a lossless T.
Figure 9:
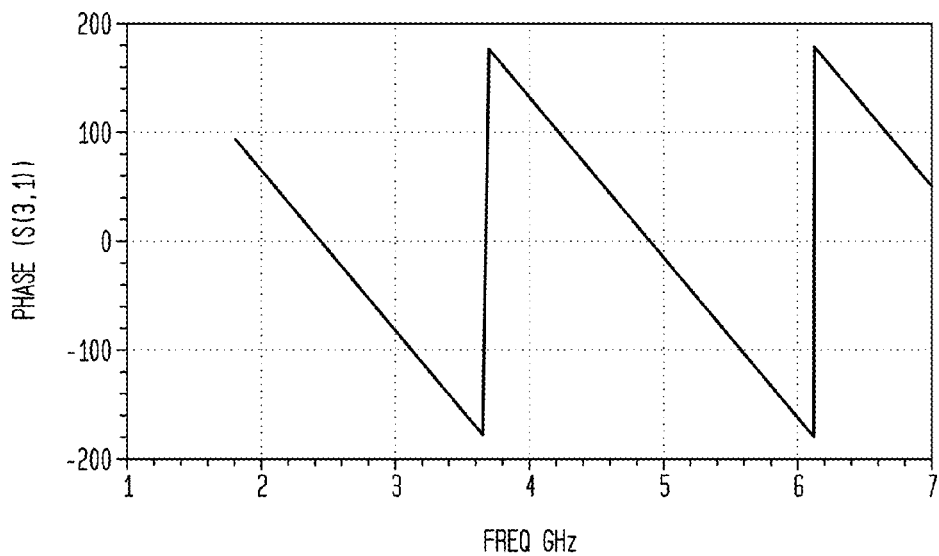
FIG. 9 illustrates an example plot of branch phase shift for a lossless T.

FIG. 8 illustrates an example plot of branch impedance for a lossless T. In particular, FIG. 8 illustrates the branch impedance associated with S31 and shows that the branch impedance associated with S31 varies wildly over the frequency range of several harmonics. Three (3) harmonics are marked for reference. FIG. 9 illustrates an example plot of branch phase shift for a lossless T. In particular, FIG. 9 illustrates the branch phase shift associated with S31 and shows the significant phase shift at each harmonic. It is noted that the phase shift is not modulo λ, and that S31 traces multiple loops around the Smith Chart for 3 harmonics.

Figure 10:
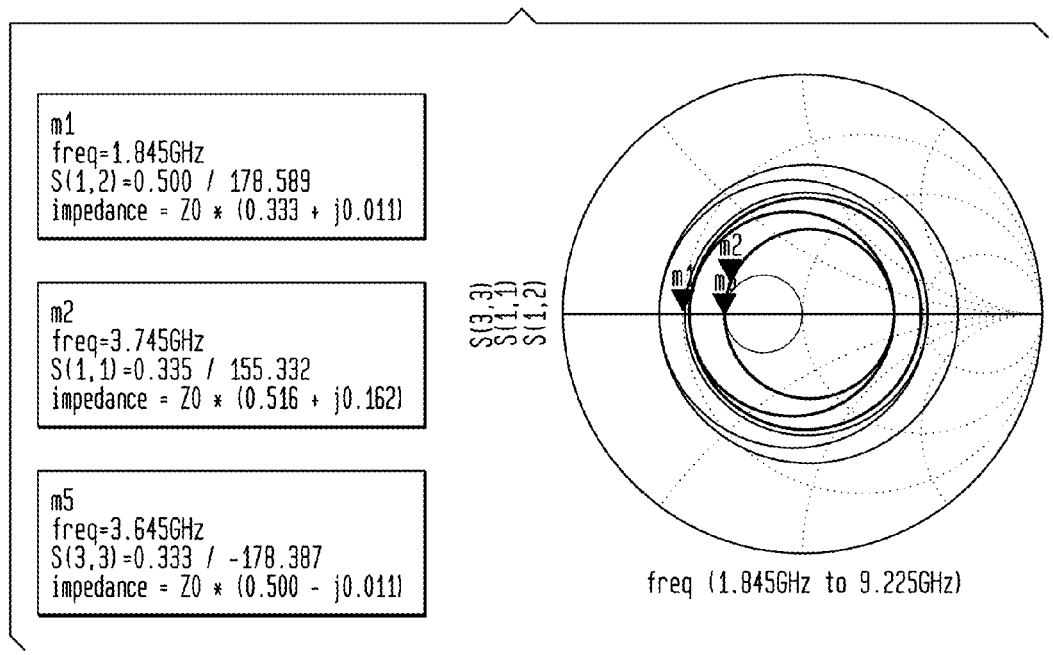
FIG. 10 illustrates an S-Parameter Smith Chart for a lossless T.
Figure 11:
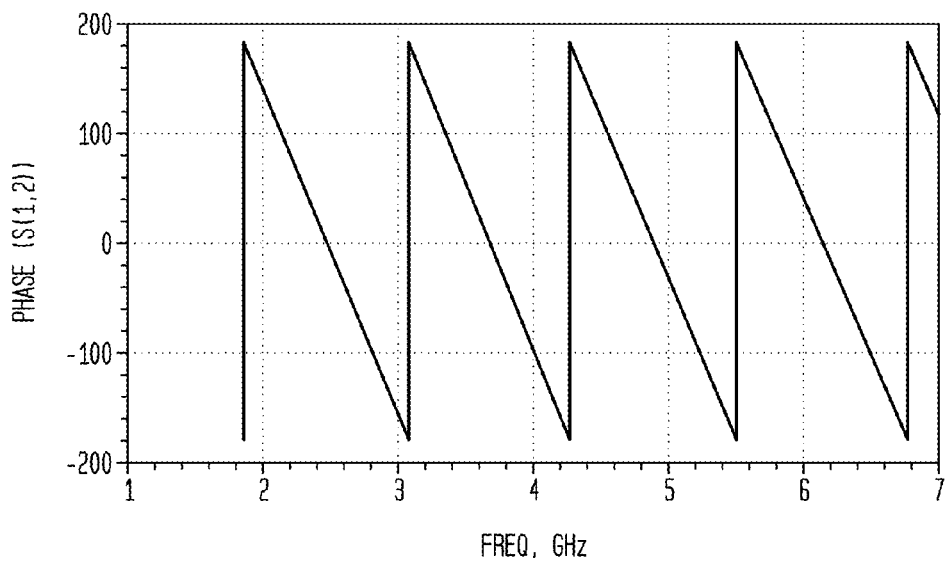
FIG. 11 illustrates an example plot of the phase shift between combiner inputs for a lossless T.
Figure 12:
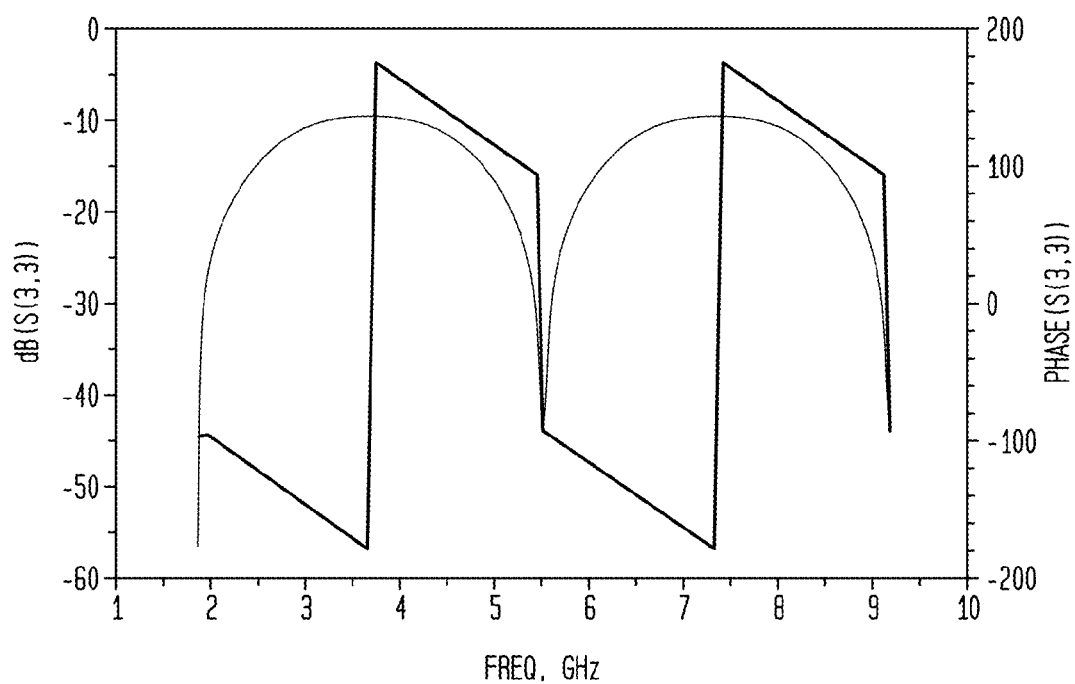
FIG. 12 illustrates an example plot of gain and phase shift versus frequency for a lossless T.

FIG. 10 illustrates an S-Parameter Smith Chart for a lossless T. In particular, FIG. 10 illustrates a S-Parameter Smith Chart for S(1, 2), S(1, 1), S(1, 3). FIG. 11 illustrates the phase shift associated with S12, which is the phase shift between the combiner inputs. It is important to note the multiple loop trace for S12 to accommodate 3 harmonics. Also to be noted are the drastic variations in both gain and phase shift associated with S33, as illustrated in FIG. 12.

Figure 13:
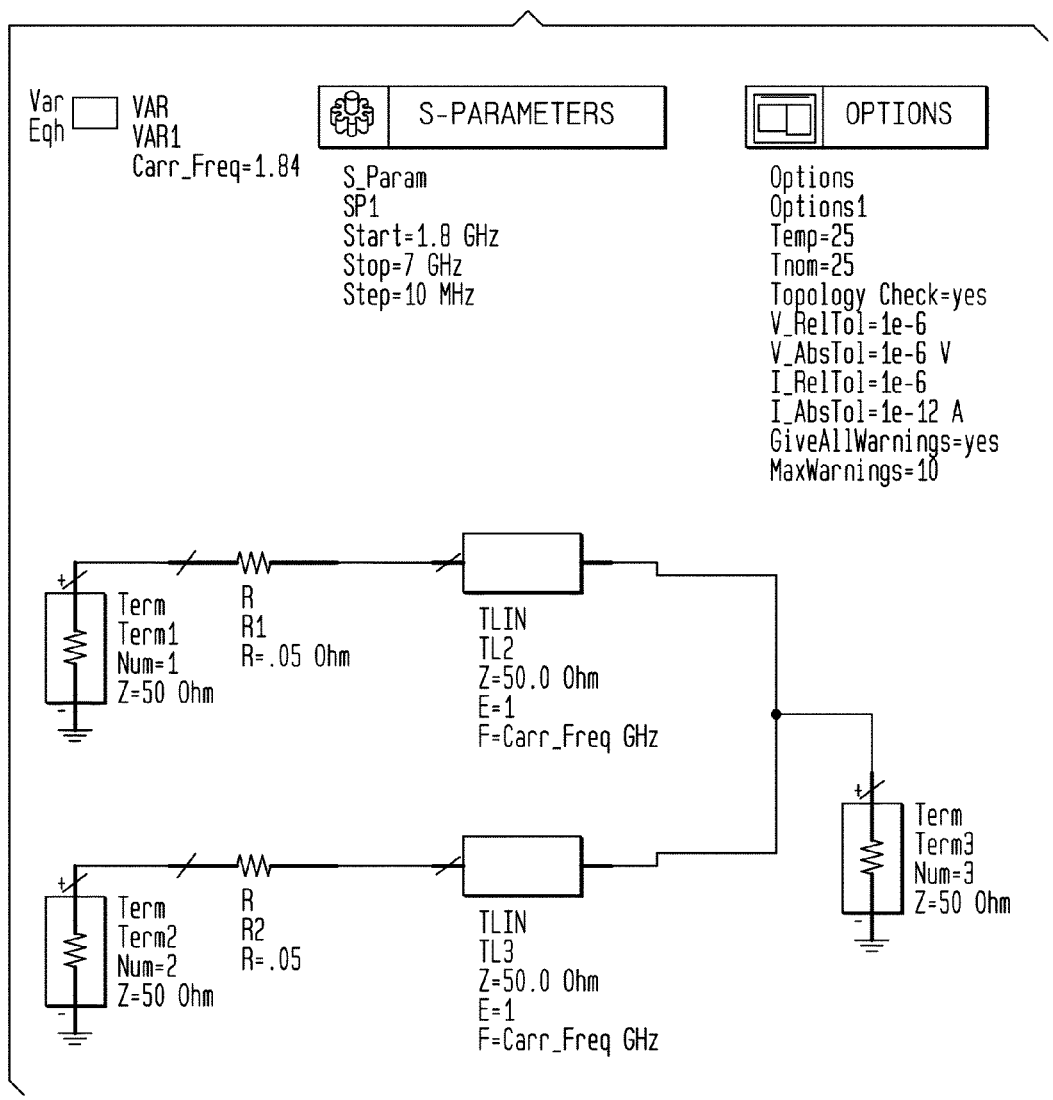
FIG. 13 illustrates an example S-parameter test bench for a MISO combiner node.

FIG. 13 illustrates an S-parameter test bench for a MISO combiner node. Simulation results using the S-parameter test bench of FIG. 13 are illustrated in FIGS. 14-15.

Figure 14:
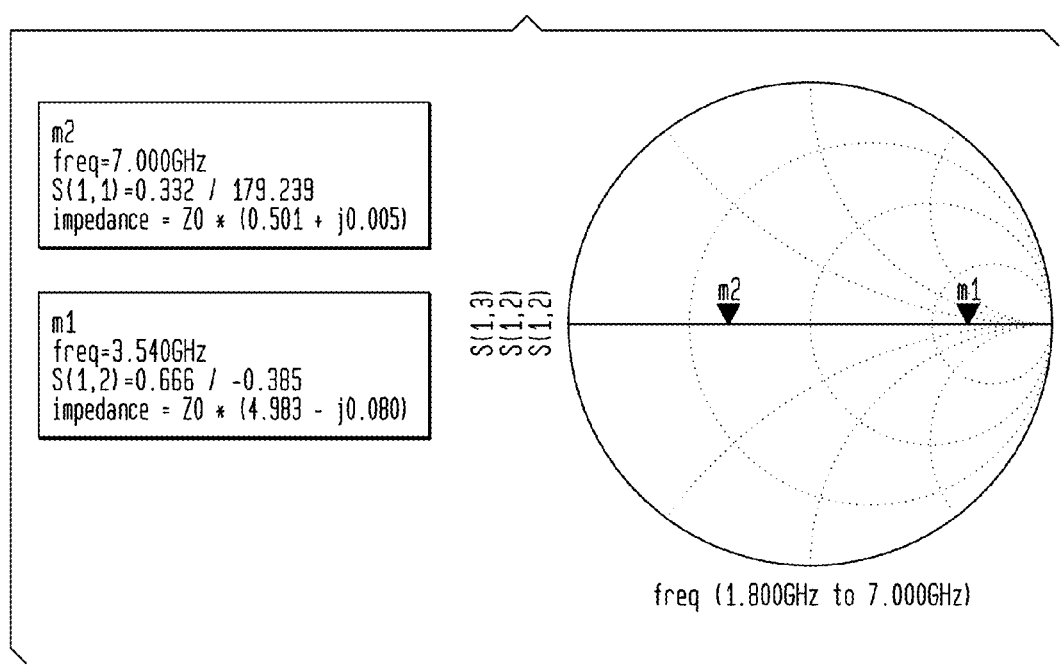
FIG. 14 illustrates an example S-parameter Smith Chart for a MISO combiner node.
Figure 15:
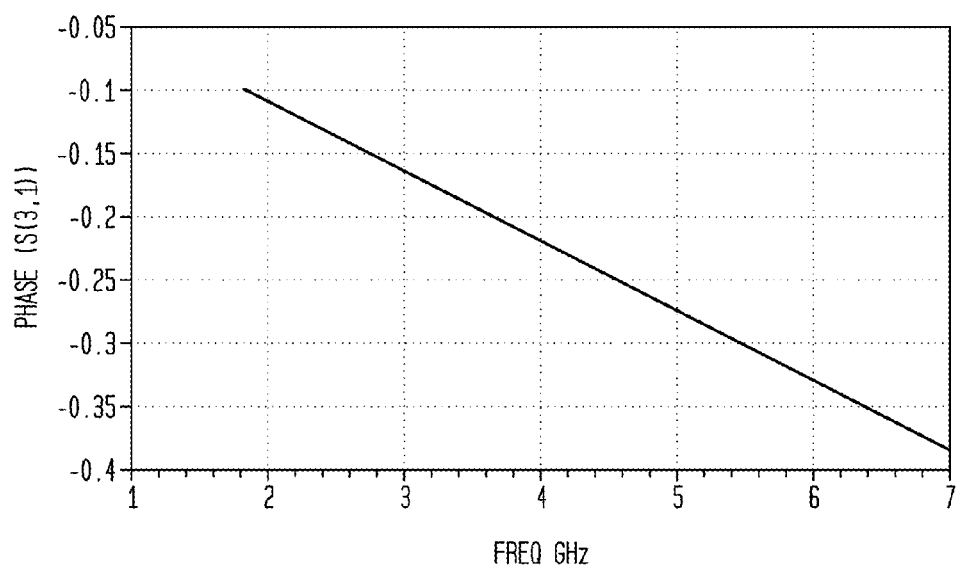
FIG. 15 illustrates an example plot of phase shift for a MISO combiner node.

FIG. 14 illustrates an example S-parameter Smith Chart for a MISO combiner node. In particular, FIG. 14 illustrates an S-parameter Smith Chart for S12, S13, and S11 (S13=S12). FIG. 15 illustrates an example plot of phase shift for a MISO combiner node. In particular, FIG. 15 illustrates the phase shift associated with S31. As shown, the phase shift is minimal and the impedance is constant over the entire range of frequencies. This also holds true for the combiner path to the output load and for the combiner inputs as well.

Also, from this analysis, note that S12=S21=S31 for the MISO combiner node and that there is no phase shift or time delay in the branches.

Figure 16:
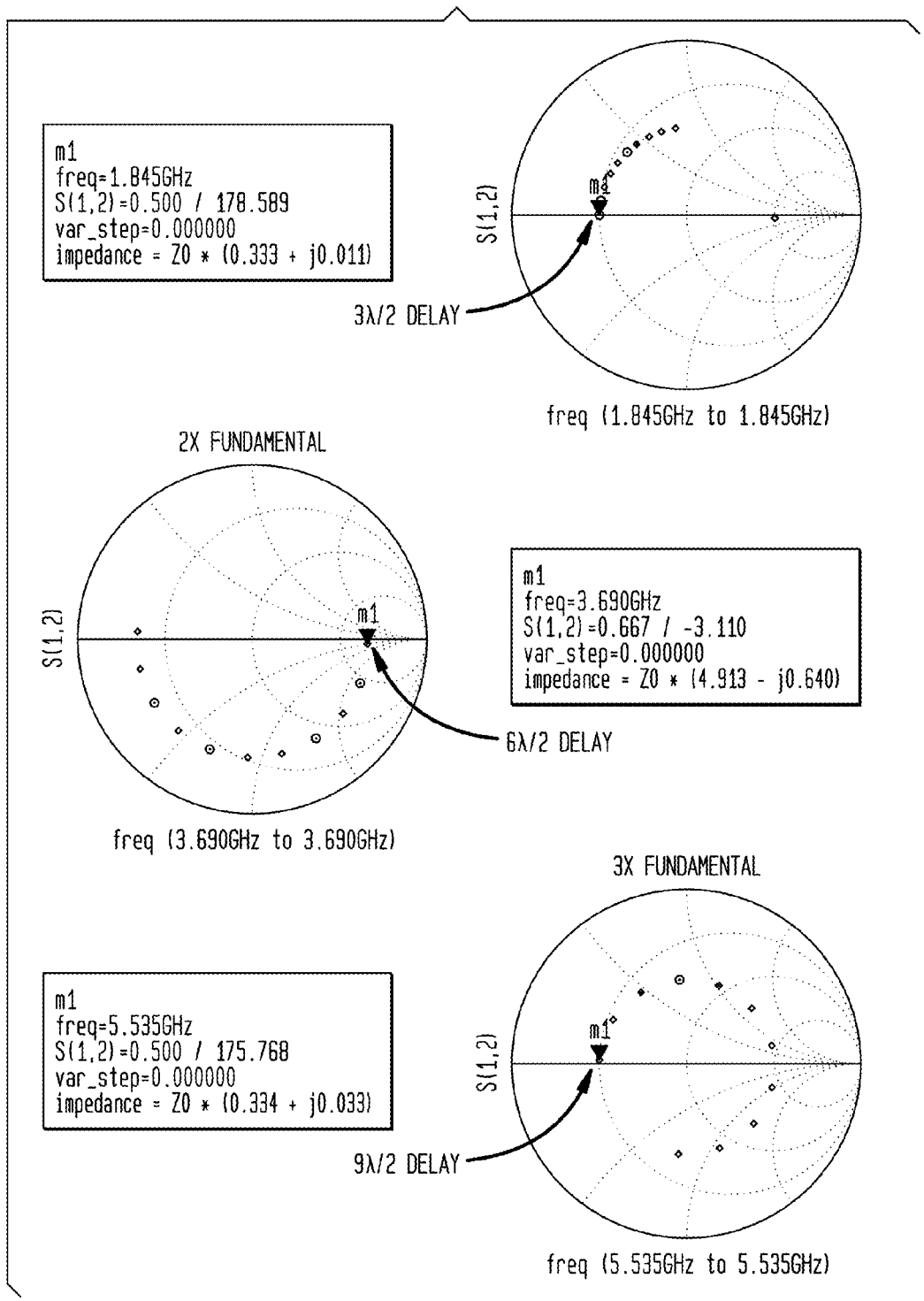
FIG. 16 illustrates a sequence of example Smith Chart plots for a lossless Wilkinson T combiner.
Figure 17:
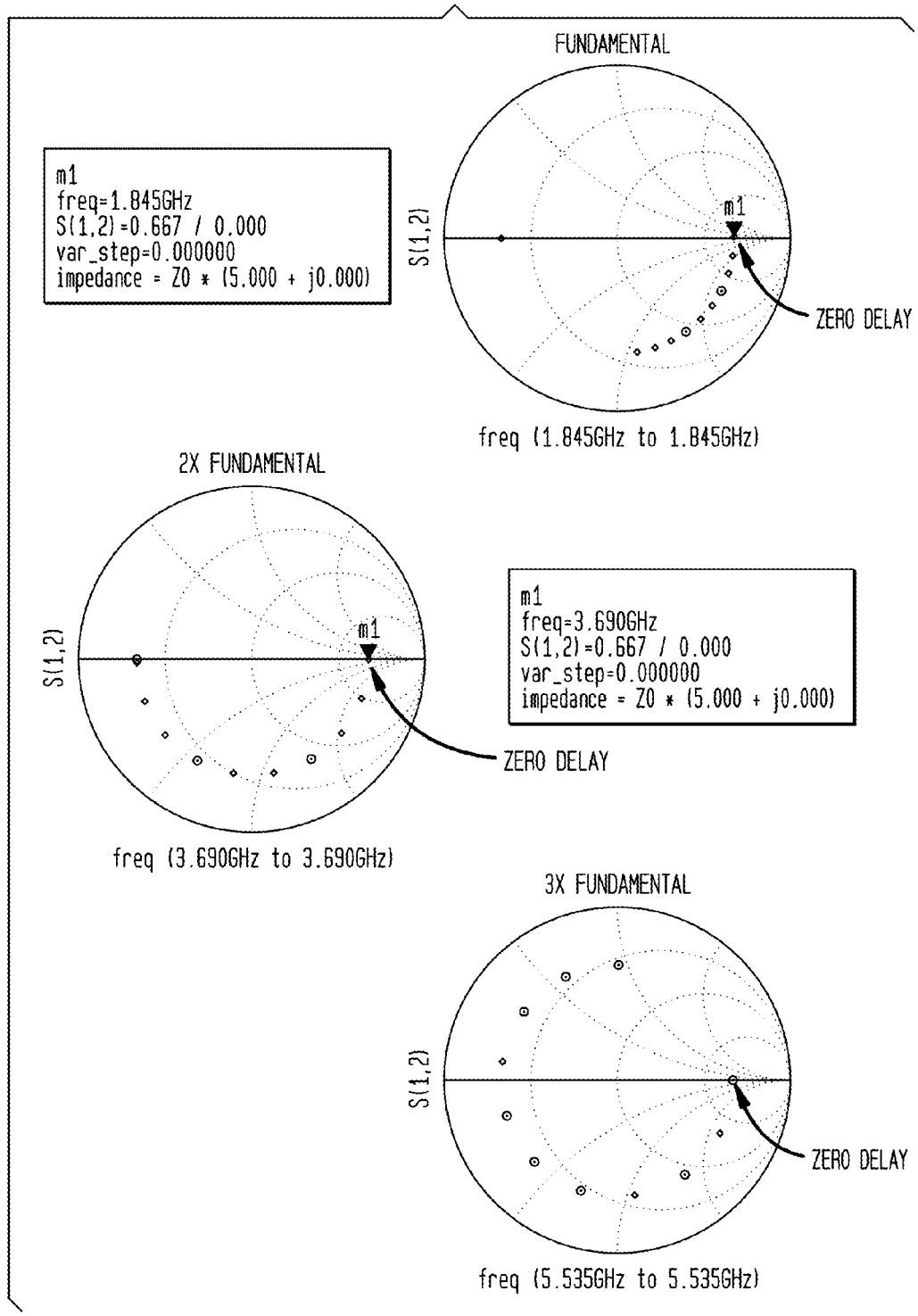
FIG. 17 illustrates a sequence of example Smith Chart plots for a pseudo-MISO combiner node.

FIGS. 16 and 17 illustrate sequences of Smith Chart plots, which show how the insertion S parameters change as a function of outphasing angles for three harmonics. In particular, FIG. 16 illustrates the case of a lossless Wilkinson T combiner. FIG. 17 illustrates the case of a pseudo-MISO combiner node. As shown in FIG. 16, in the case of the lossless Wilkinson T, the insertion delay is considerable at each harmonic. It is noted that the sweep spans 90° of outphasing.

Also noted is the difference between the lossless T and the pseudo-MISO for S12 at the fundamental at 1.84 GHz. Also with respect to the harmonics, the lossless T possesses an alternating origin for the locus of points depending on whether the harmonics are even or odd, in addition to the other apparent differences from the pseudo-MISO case. In contrast, in the MISO case, all harmonics launch or spawn from a common point on the real axis. This is significant for asymmetric pulses in switching devices. Indeed, efficient output PA device designs will possess some level of pulse asymmetry to run in an efficient manner. This asymmetry must be accommodated for practical application particularly as outphasing is applied. This asymmetry is more difficult to manage in the lossless T case, for some switching amplifier topologies.

7. Miso Amplifier Simulations and "Lossless" T Efficiency

According to an embodiment, the VPA Architecture utilizes a MISO amplifier to enable efficient operations while maintaining a myriad of other benefits. The manner in which the MISO is implemented often utilizes a combiner node with little or no substantial isolation between the inputs and the driving amplifiers or sources. Nevertheless, appropriate current summing at the node is accomplished by controlling the properties of the source amplifiers through a blend of outphasing, bias control, amplitude control, power supply control, and impedance control. In this manner, suitable transfer functions can be constructed to enable efficient transmitter operation, even with waveforms which possess large PAPR (Peak to Average Power Ratio).

One method of accomplishing the desired MISO operation is by blending bias control along with outphasing. Another method could be a blend of amplitude control as well as outphasing and bias control. It is also possible to combine power supply modulation if so desired. The following sections illustrate MISO operation via simulation in two basic configurations. The first set of simulation results relate to a switching MISO architecture captured in the ADS tool using "ideal" switches. The second set of simulation results provides a comparison between the MISO and more traditional lossless combiners using quasi Class "C" amplifier cores. The focus of the comparisons is efficiency versus power output for various levels of output back off. The basic implementation of back off comes from outphasing for the lossless T combiner examples while the MISO examples use additional degrees of freedom to accomplish a similar function.

As will be further described below, the simulations illustrate that the MISO node enables efficient multi branch amplifier signal processing when combined with VPA Technology.

(a) Switching MISO Design

Figure 18:
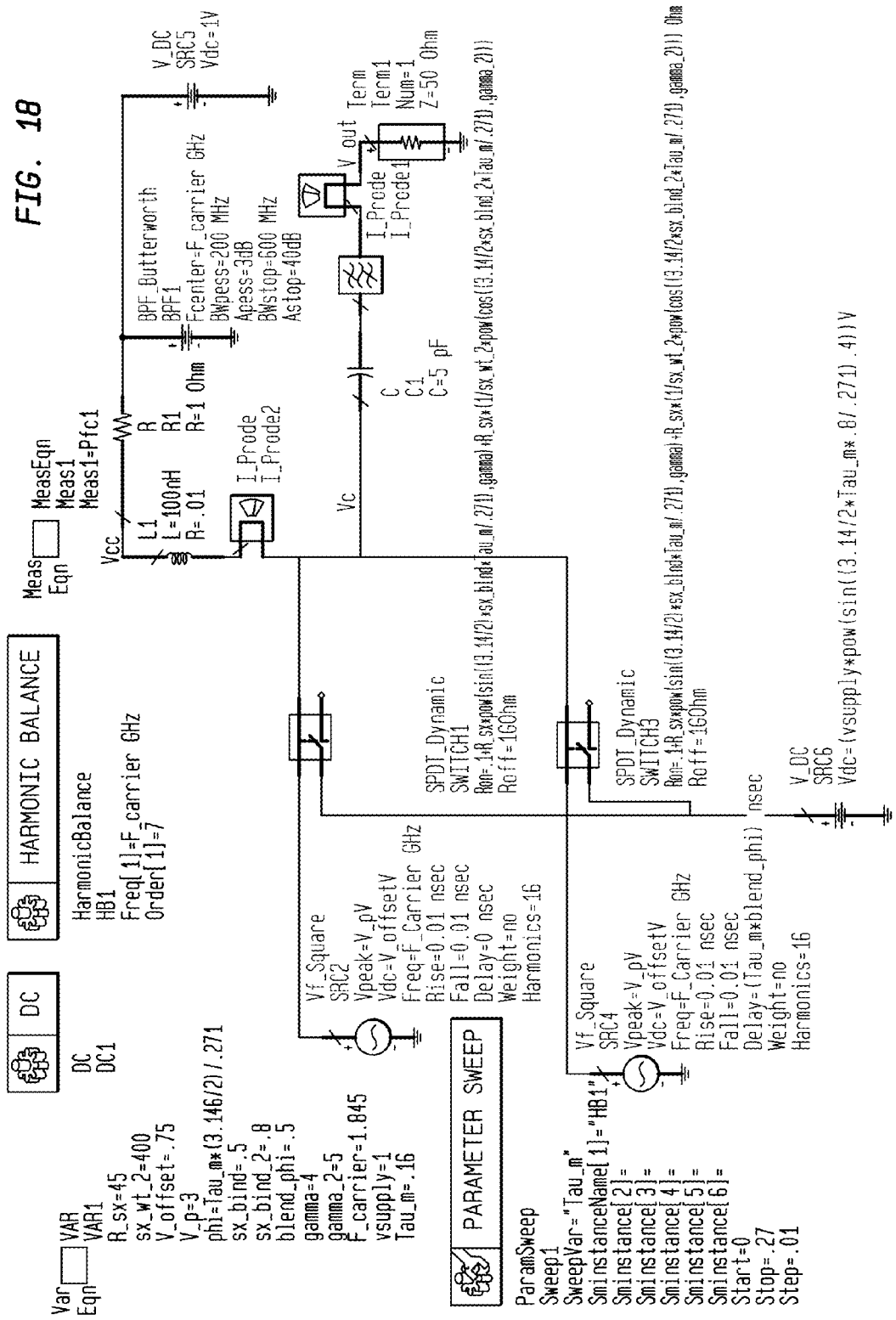
FIG. 18 illustrates an example S-parameter test bench for a MISO amplifier using ideal switching elements.

A simulation was conducted in ADS to illustrate the operation of a MISO amplifier using "ideal" switching elements. FIG. 18 illustrates the topology in ADS.

It is noted that the switches represent switching amplifier elements with virtually infinite gain. Parasitics are zero except for the insertion resistance of the switch, which can be controlled from a minimum of 0.1Ω to a very large value. The minimum and maximum values of resistance and controlling function are fully programmable. The functions are deliberately formulated with dependency on outphasing angle, which is swept for many of the simulations using the variable $T_M$, which is the time delay between the two source square wave leading edges.

The sources have rise and fall times which can be defined, as well as frequency amplitude and offset. Simulations were conducted in both transient and harmonic balance test benches.

Figure 19:
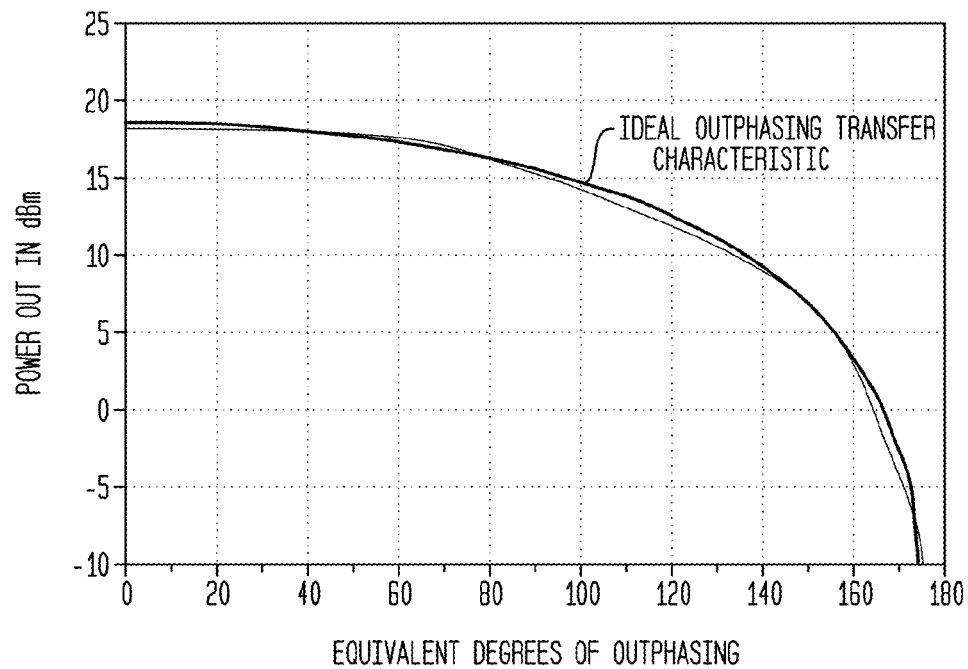
FIG. 19 illustrates a theoretical perfect outphasing transfer characteristic along with a simulated transfer characteristic.

FIG. 19 illustrates a perfect outphasing transfer characteristic along with a simulated transfer characteristic. The perfect characteristic represents the result:

Power Out=10 $\log_{10}$(A cos($\phi$/2))$^2$+30 dBm where $\phi$/2 is ½ the outphasing angle. $\phi$ is presented on the horizontal axis. The blue trace is the ideal result or template while the red trace is the simulated circuit response. The ideal trace is normalized to the maximum power out for the simulated circuit example. Note that the equivalent outphasing response of the combiner is very close to the ideal response without detailed calibration. In embodiments, this is accomplished by providing simple blended control functions and accuracy is typically forced by detailed compensation or calibration.

Figure 20:
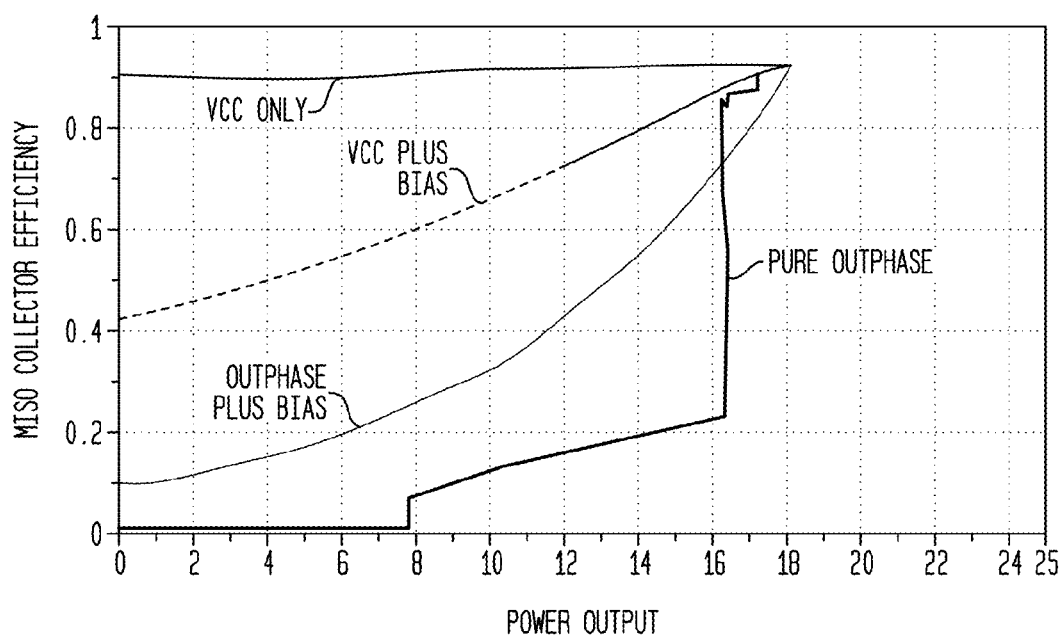
FIG. 20 illustrates the behavior of an example MISO amplifier from an efficiency point of view for a variety of control techniques.

FIG. 20 illustrates the behavior of an example MISO amplifier from an efficiency point of view for a variety of control techniques. It is noted that efficiency is poor with pure outphasing control. This is because the branch driving impedances for the inputs to the combiner are not optimized for efficiency versus $P_{out}$. Indeed, the optimal impedance function is non-linear and time variant and is therefore accounted for in the VPA transfer function which is connected to the MISO amplifier.

The other traces in FIG. 20 illustrate several other controls, including "outphase plus bias" control. In practice, this control blend provides very accurate control for precise reconstruction of waveforms such as EDGE. That is, very good ACPR performance is attained using this technique. In addition, it is usually the case that higher output power is available by employing this type of control.

Another control blend uses power supply control in conjunction with phase and bias.

(i) Circuit Performance

Figure 21:
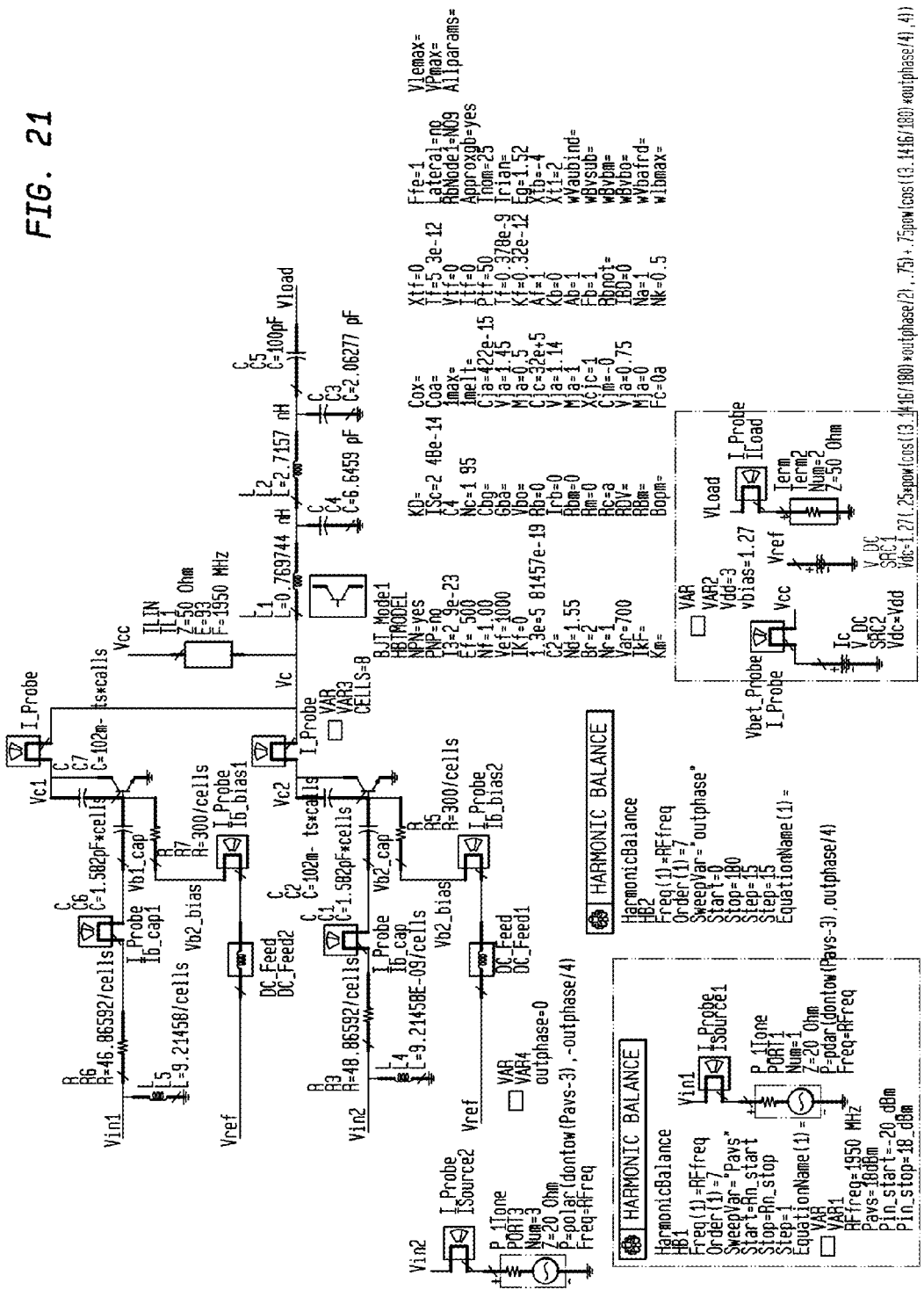
FIG. 21 illustrates an example ADS test bench for an example MISO amplifier with blended control.
Figure 22:
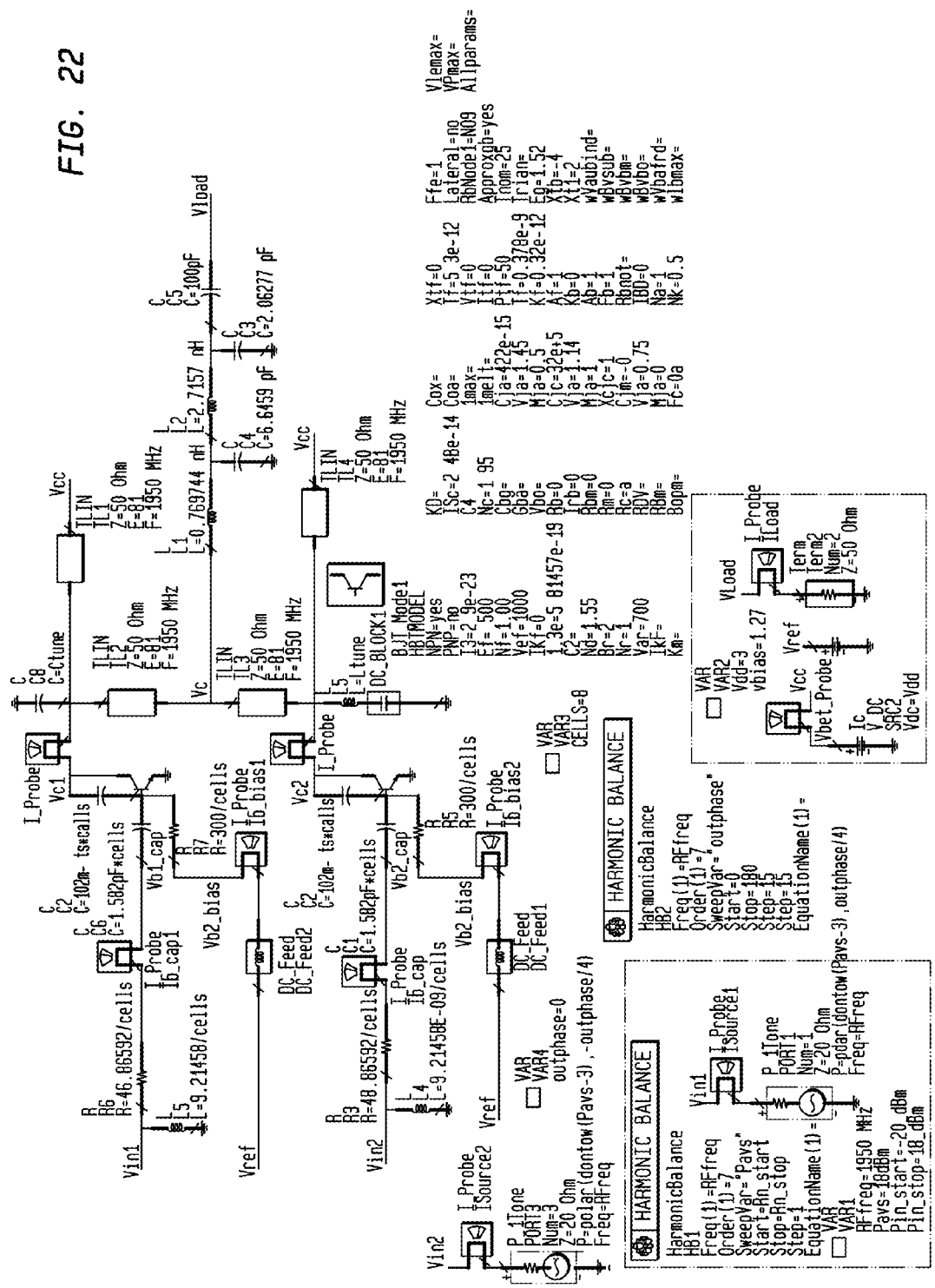
FIG. 22 illustrates an example ADS test bench for a modified Chireix combiner.

This section provides the results of simulations performed on circuits. The circuits are based on Class "C" amplifiers driven by nearly ideal sources, which can be outphased. ADS was utilized as the simulation tool. FIG. 21 illustrates the ADS test bench for a MISO amplifier with blended control. FIG. 22 illustrates the ADS test bench for a modified Chireix combiner.

Figure 23:
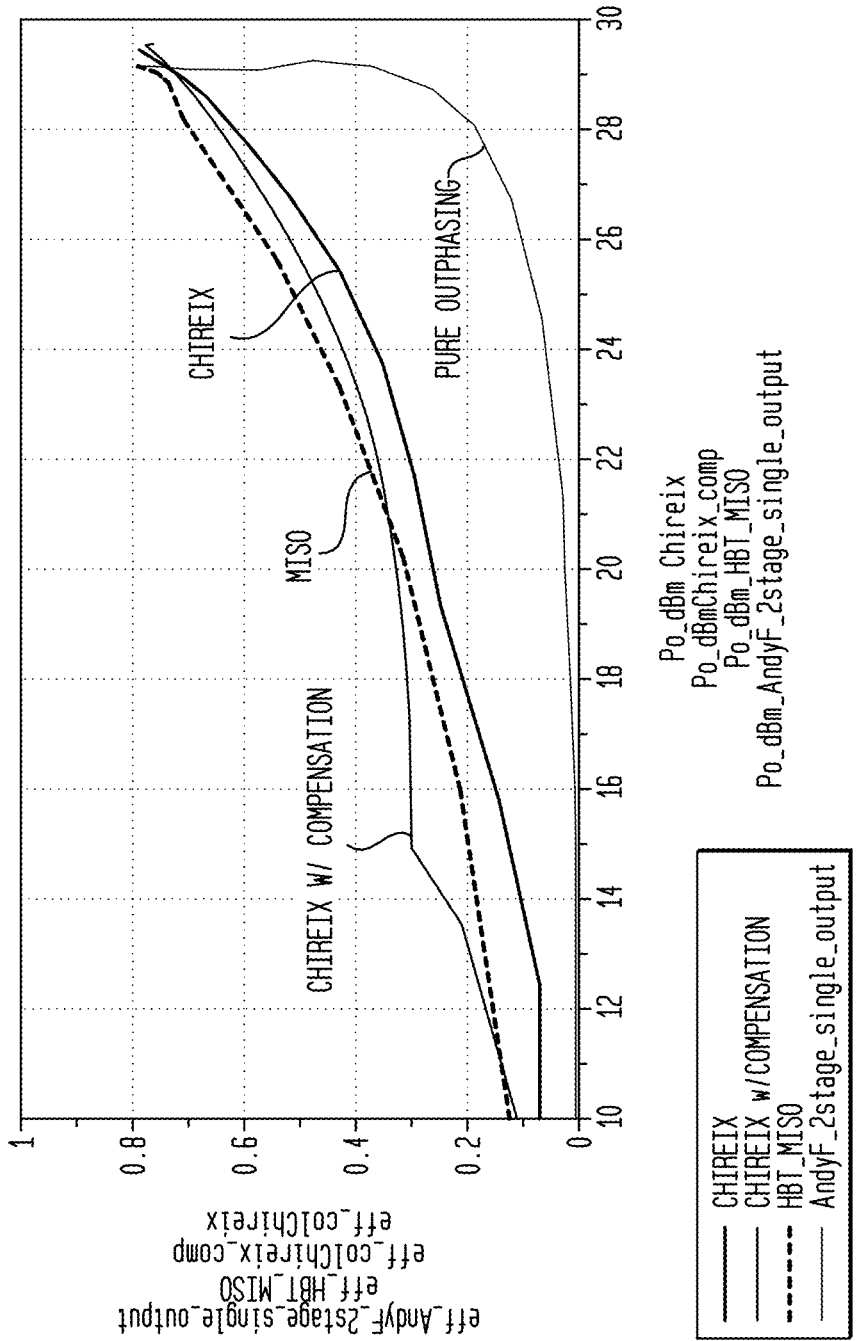
FIG. 23 illustrates the performance of two example Chireix designs and two example MISO designs.

FIG. 23 illustrates the performance of two Chireix designs and two MISO designs based on the test benches of FIGS. 21 and 22. The cyan trace corresponds to a MISO amplifier with pure outphasing control. The compensated Chireix and classical Chireix are illustrated in green and blue respectively and provide good efficiency versus output power control. Finally, a blended MISO design response is illustrated in violet, with excellent efficiency over the entire output power control range.

Although not illustrated in these simulations, it is also possible to accentuate the efficiency over a particular range of output power to optimize efficiency for specific waveform statistics. This feature is a fully programmable modification of the basic transfer function and control characteristic equation according to embodiments of the present invention.

8. Lab Results for Miso Amplifiers and Vpa System

This section provides results of laboratory measurements and experiments. Results are included for the MISO amplifier as well as the entire VPA 2 branch RF signal processing chain. The results illustrate the same trend of performance disclosed in the previous sections directed to simulation results.

Figure 24:
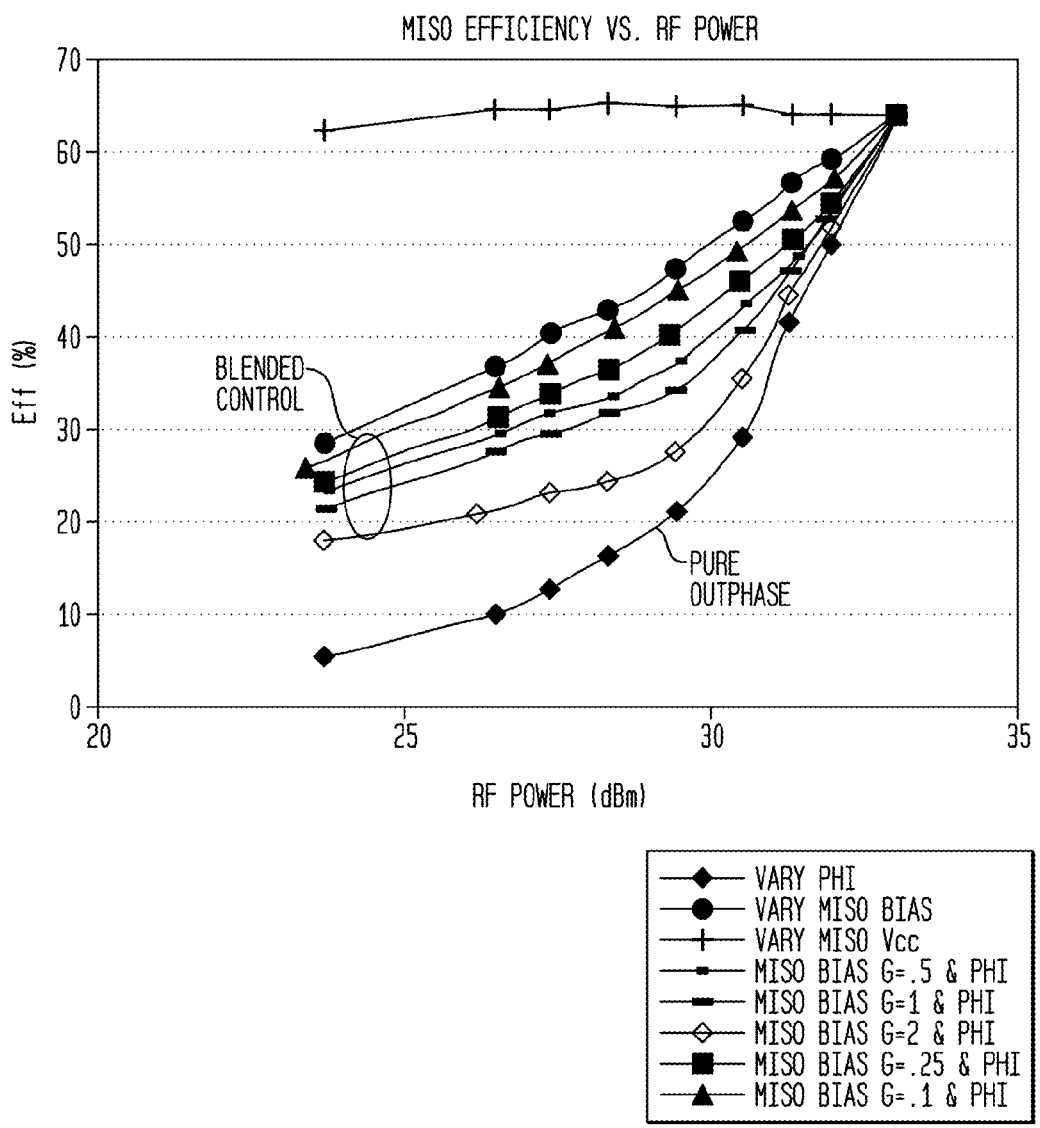
FIG. 24 illustrates example MISO amplifier efficiency versus output power for various control and biasing techniques.

FIG. 24 illustrates MISO amplifier efficiency versus output power for various control and biasing techniques, for a CW signal.

Figure 25:
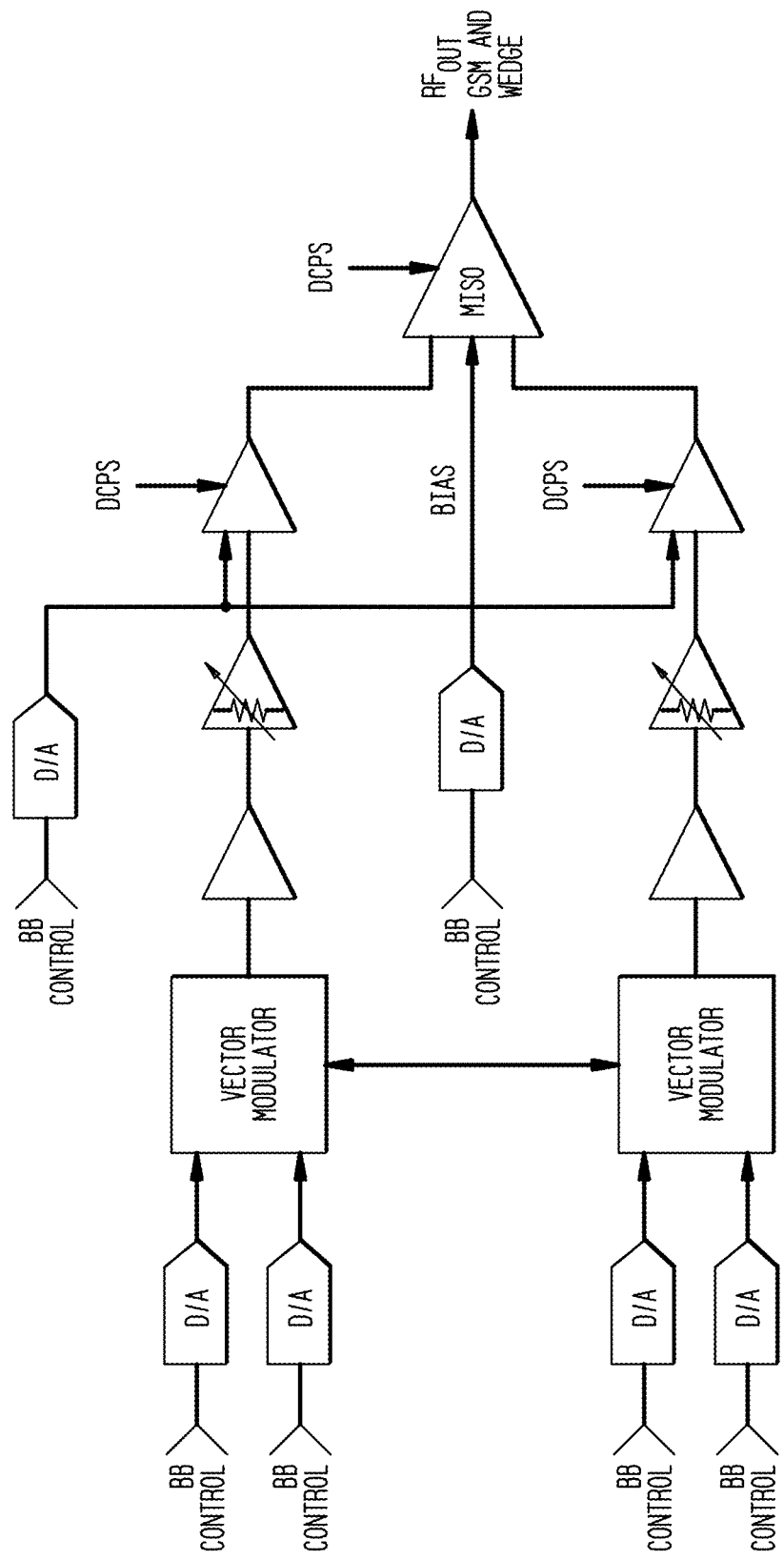
FIG. 25 illustrates control bias points in an example VPA using an example MISO amplifier.
Figure 26:
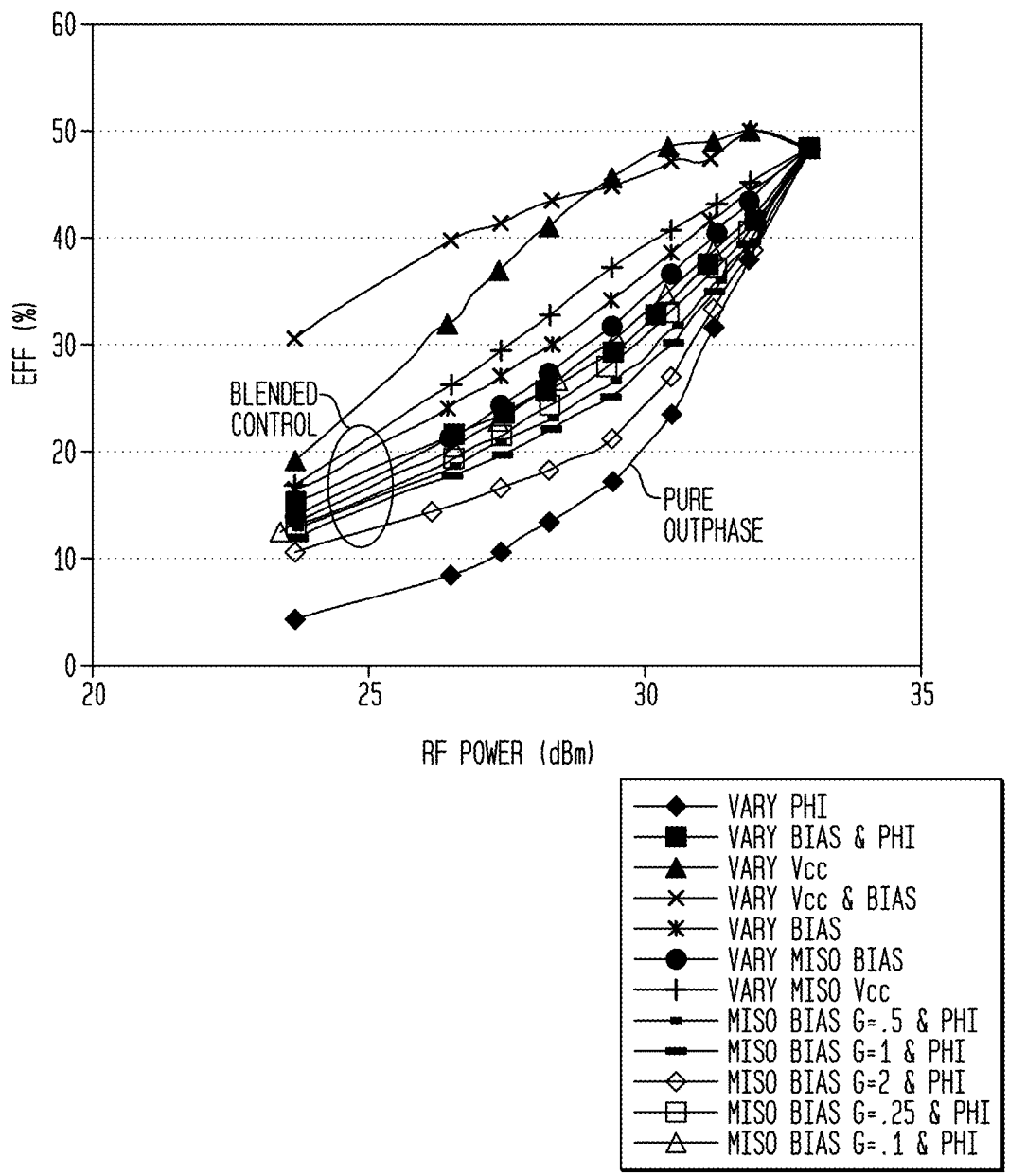
FIG. 26 illustrates an example efficiency performance plot of the system shown in FIG. 25 for various control techniques.

In addition to MISO amplifier control techniques, blended control techniques can also be used for other stages of the VPA. Accordingly, it is also possible to control bias points along the upper and lower branch amplifier chain, as illustrated in FIG. 25, for example. This allows for the optimization of the entire VPA system, not just the MISO stage. FIG. 26 illustrates the efficiency performance of the system shown in FIG. 25 for a variety of control techniques. As shown, these techniques include not only MISO control techniques but also control techniques applied at other control points of the VPA system.

Typically, blended techniques using outphasing plus bias control provide very good ACPR performance for complicated waveforms, especially over extended dynamic range. In addition, the blended technique generally permits slightly greater compliant maximum output powers for complicated large PAPR waveforms.

9. Vpa waveform processing with blended control functions and Compensation

FIG. 25 illustrates a 2 branch implementation of the VPA architecture with a MISO amplifier. As explained in previous sections, the MISO combining node utilizes a combination of outphasing, bias control, amplitude control, power supply control, and impedance control to accomplish an efficient and accurate transfer characteristic. The blend that is selected for the control algorithm is a function of control sensitivity, waveform performance requirements, efficiency, hardware, firmware complexity, and required operational dynamic range. According to embodiments of the present invention, EDGE, GSM, CDMA2000, WCDMA, OFDM, WLAN, and several other waveforms have been demonstrated on a unified platform over full dynamic range in a monolithic SiGe implementation, using bias and outphasing control.

This section explains some aspects of the bias and amplitude control and provides the basis for understanding compensation associated with the VPA. This system level perspective is related to the MISO operation. Since the MISO amplifier consumes a substantial portion of power of all function blocks in the VPA system it must be operated and controlled correctly in the context of efficient waveform reconstruction. This demands a symbiotic relationship between the MISO amplifier, drivers, pre-drivers, vector modulators, and control algorithms.

Figure 27:
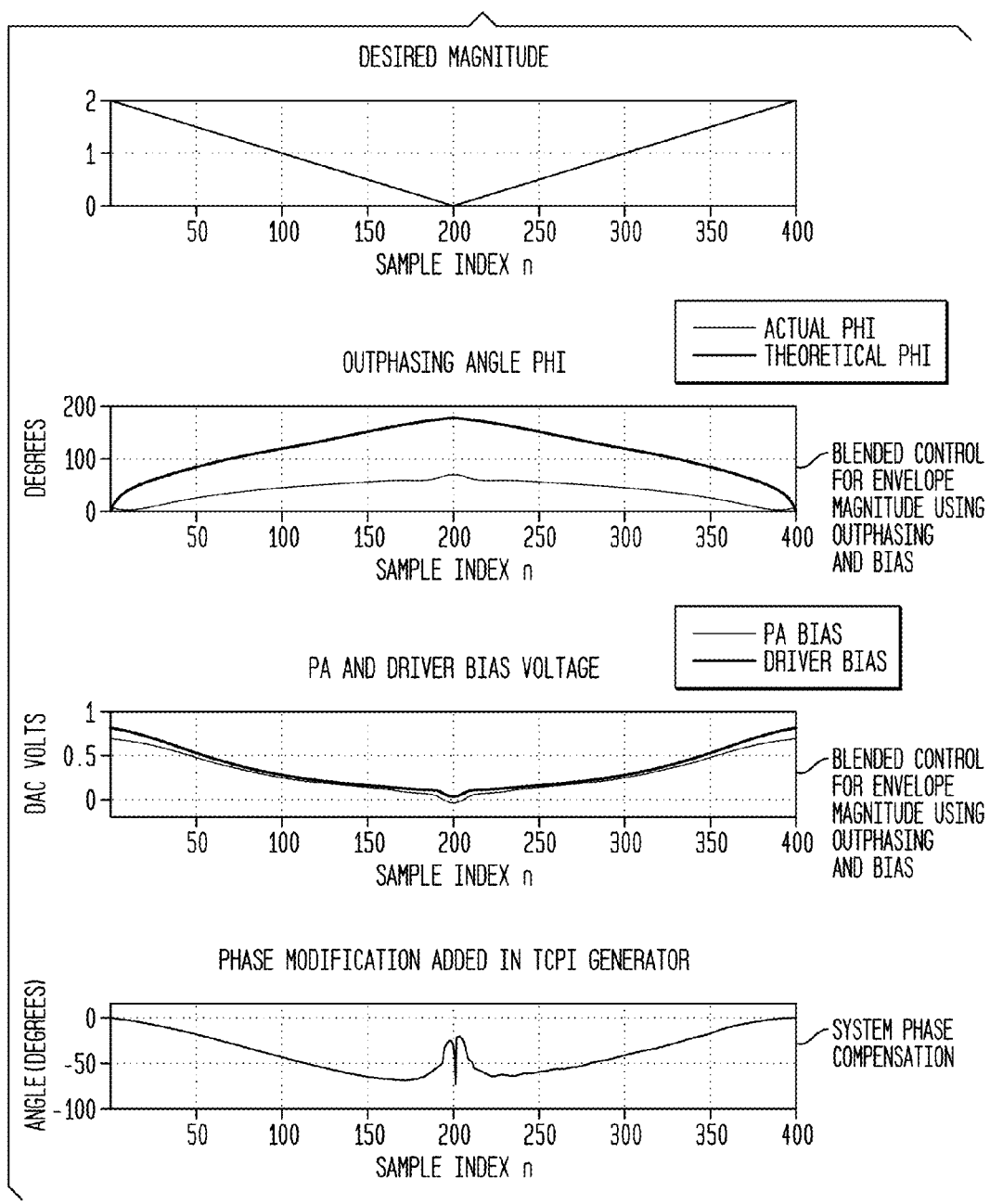
FIG. 27 illustrates example MISO control and compensation for a ramped dual sideband—suppressed carrier (DSB-SC) waveform.

FIG. 27 illustrates MISO control and compensation for a ramped dual sideband—suppressed carrier (DSB-SC) waveform, according to an embodiment of the present invention. The plots shown in FIG. 27 are generated using actual lab results.

The top plot in FIG. 27 illustrates the envelope for desired a linearly ramped RF waveform. The envelope represents the magnitude of the baseband waveform prior to algorithmic decomposition. Although not explicitly indicated in this set of plots the RF waveform changes phase 180° at the zero crossing point (sample 200). The three subsequent plots in FIG. 27 show the control functions required to reproduce the desired response at the filtered MISO output. In particular, the second plot is a plot of outphasing angle. The upper trace is a reference plot of the outphasing angle in degrees for a pure "ideal", outphasing system. The lower trace illustrates an actual outphasing control portion of a blended outphasing plus bias control algorithm. Note that the full outphasing angle is approximately 75°, as opposed to 180° for purely outphased systems.

The third plot in FIG. 27 illustrates bias control, which operates in concert with outphasing control to produce the blended attenuation of the ramp envelope all the way to the MISO output. This control includes compensation or calibration for amplitude mismatches, phase asymmetries, etc. Therefore, the control waveforms provided must take into account the non-ideal behavior of all of the components and functions in the dual branch chain. Both driver and MISO stages are controlled for this example. Controlling the bias of the driver reduces the input drive to the MISO as a function of signal envelope The fourth lot at the bottom of FIG. 27 illustrates the required phase control to guarantee phase linearity performance of the waveform over its entire dynamic range. At sample 200 a distinct discontinuity is apparent, which is associated with the 180° inversion at the ramp's zero crossing. Note that the phase compensation is very non-linear near the zero crossing at sample 200. At this point, the amplifiers are biased near cut off and S21 is very ill behaved for both the driver and PA/MISO stage. The plot associated with phase compensation represents the additional control required for proper carrier phase shift given the drastic shift in phase due to changing bias conditions. It should be further stated that the relationship between amplitude control and phase is such that they are codependent. As outphasing and bias are adjusted to create the signal envelope the phase compensation requirements change dynamically.

Figure 28:
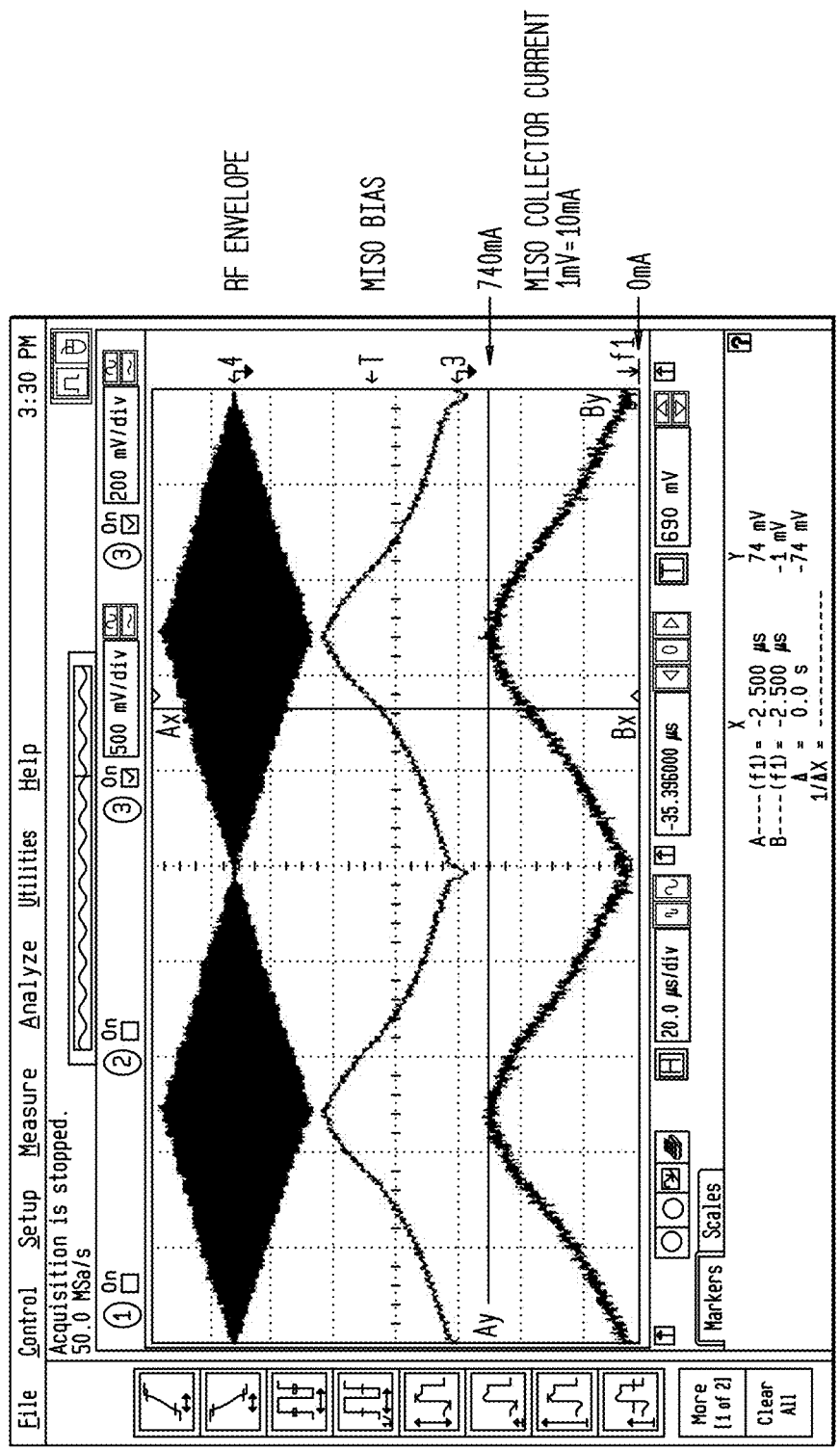
FIGS. 28 and 29 illustrate actual waveforms from a VPA with an example MISO amplifier of a ramped DSB-SC signal along with the MISO/Driver bias control signal and the MISO/Driver collector current.
Figure 29:
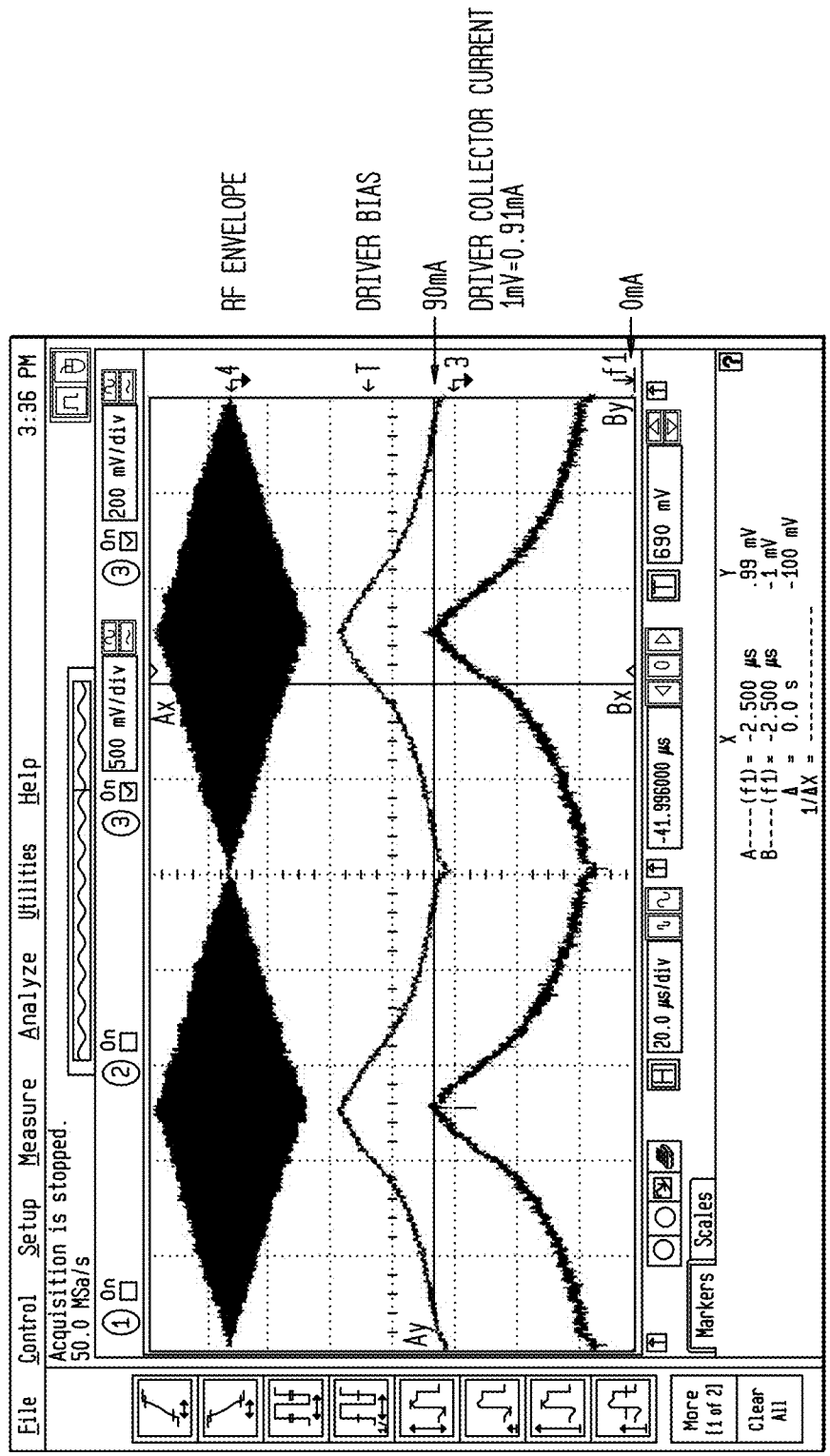

FIGS. 28 and 29 illustrate actual waveforms from a VPA with MISO, according to an embodiment of the present invention, which show the ramped DSB-SC signal along with the MISO/Driver bias control signal and the MISO/Driver collector current.

(a) Calibration and Compensation

Any control algorithm must contemplate the non ideal behavior of the amplifier chain. AM-PM and PM-AM distortion must also be addressed. Many signals of interest which are processed by the VPA architecture can be represented by constellations and constellation trajectories within the complex signaling plane. The RF carrier at the output of the filtered MISO can be written in complex form as:

$$y(t)=A(t)e^{j(\omega_c t+\Theta)}$$

Figure 30:
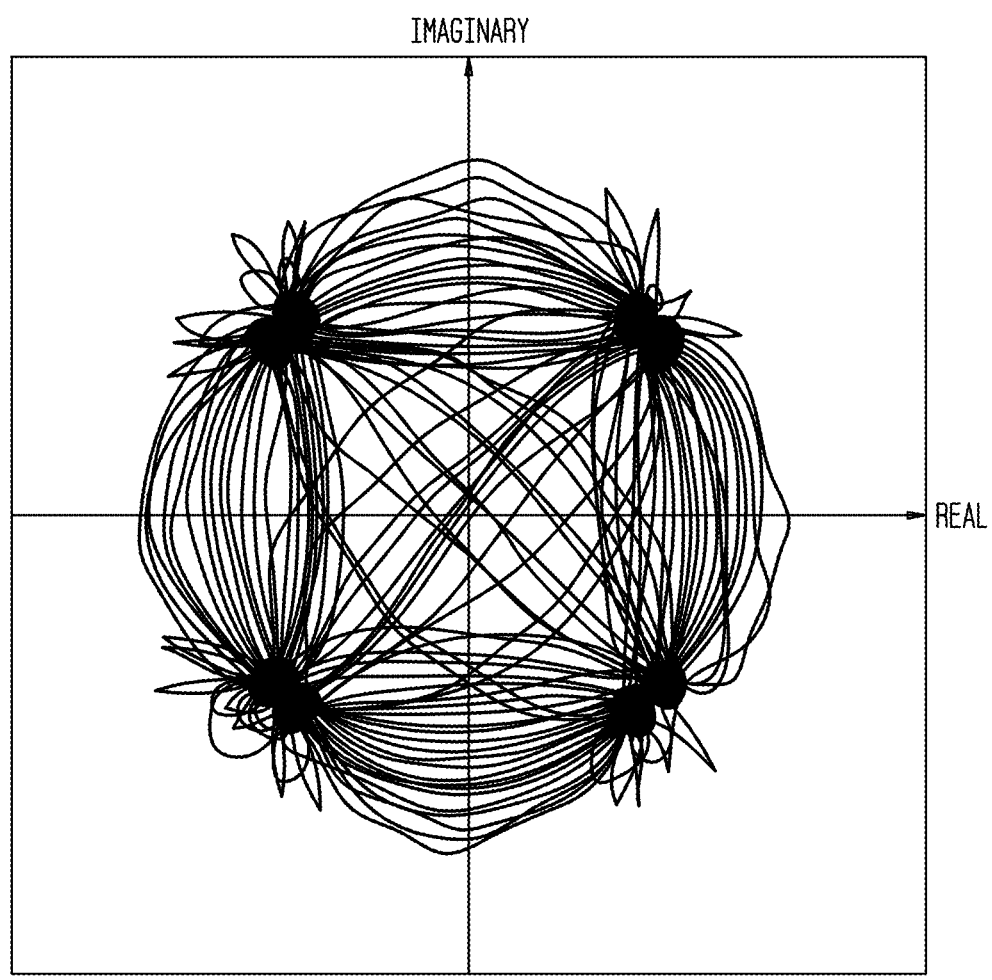
FIG. 30 illustrates an example WCDMA signal constellation.

$\omega_c \underline{\Delta}$ Carrier Frequency
$\Theta \underline{\Delta}$ Modulation Angle
$A(t) \underline{\Delta}$ Amplitude Modulation The complex signal plane representations of interest are obtained from the Re{y(t)} and Im{y(t)} components. A goal for the VPA is to produce signals at the filtered MISO node such that when decomposed into their complex envelope components, and projected onto the complex signaling plane, the distortions are minimal and efficiency is maximized. An example for such a signal constellation is given in FIG. 30.

Therefore, if the VPA response is known for the entire complex plane, a suitable algorithm will adjust the control signals to contemplate all distortions. If the control is accurate enough given the required compensations, compliant signal reconstruction is possible at the combining node.

Figure 31:
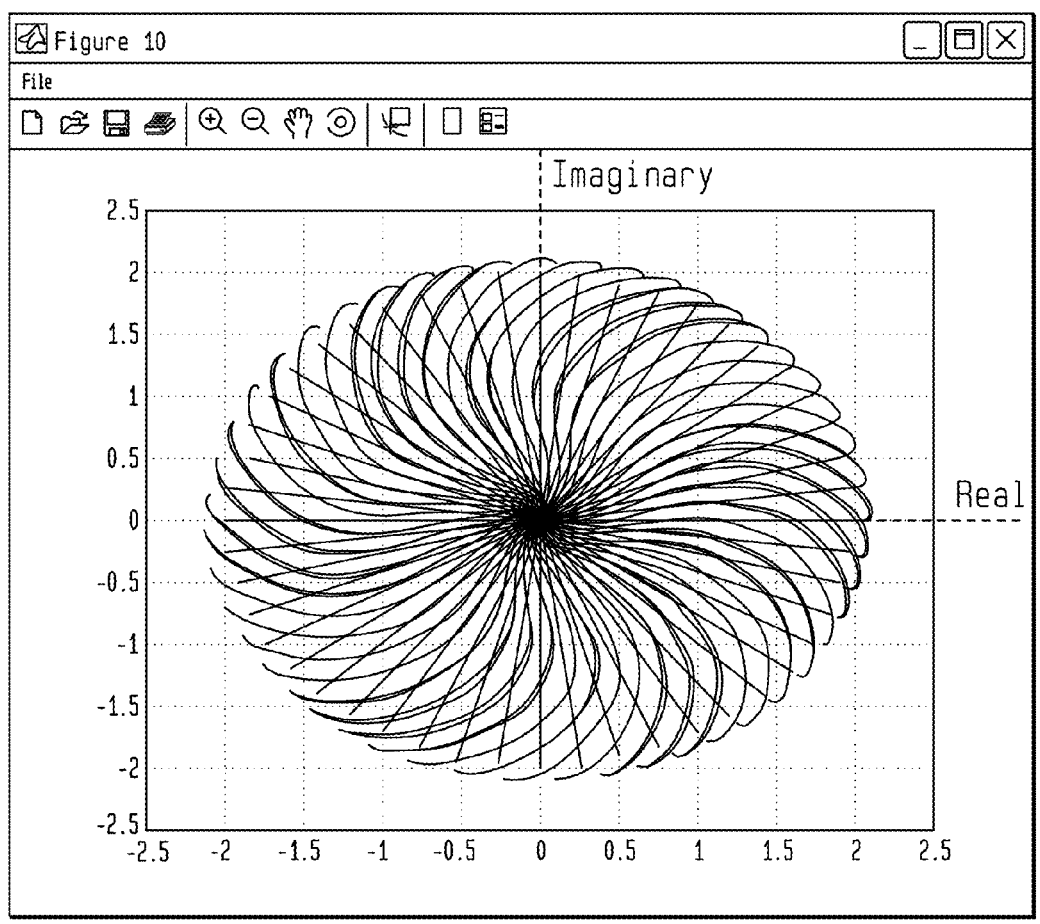
FIG. 31 illustrates an example "starburst" characterization and calibration constellation.

Suppose that the VPA system is stimulated in such a way that the output RF signal can be processed to detect the system non-linearities, superimposed on the complex signaling plane. FIG. 31 illustrates an example "starburst" characterization and calibration constellation, which is one technique to characterize the non-linearities imposed by the system as measured at the combining node, after filtering.

The red radials represent stimulus signals in the complex plane. The radials are swept out to the unit circle and back to the origin for a plethora of angles. Each swept radial at the system input spawns a corresponding blue radial at the output. Notice the bifurcation in the blue radials. This arises due to the memory inherent in high power SiGe transistor devices operated over certain portions of their dynamic range. It can be inferred from the complex plane starburst stimulus/response that a significant amount of amplitude and phase non-linearity is present. This non-linearity can be captured as an error $\vec{D}_{\epsilon_R}$) and characterized.

Figure 32:
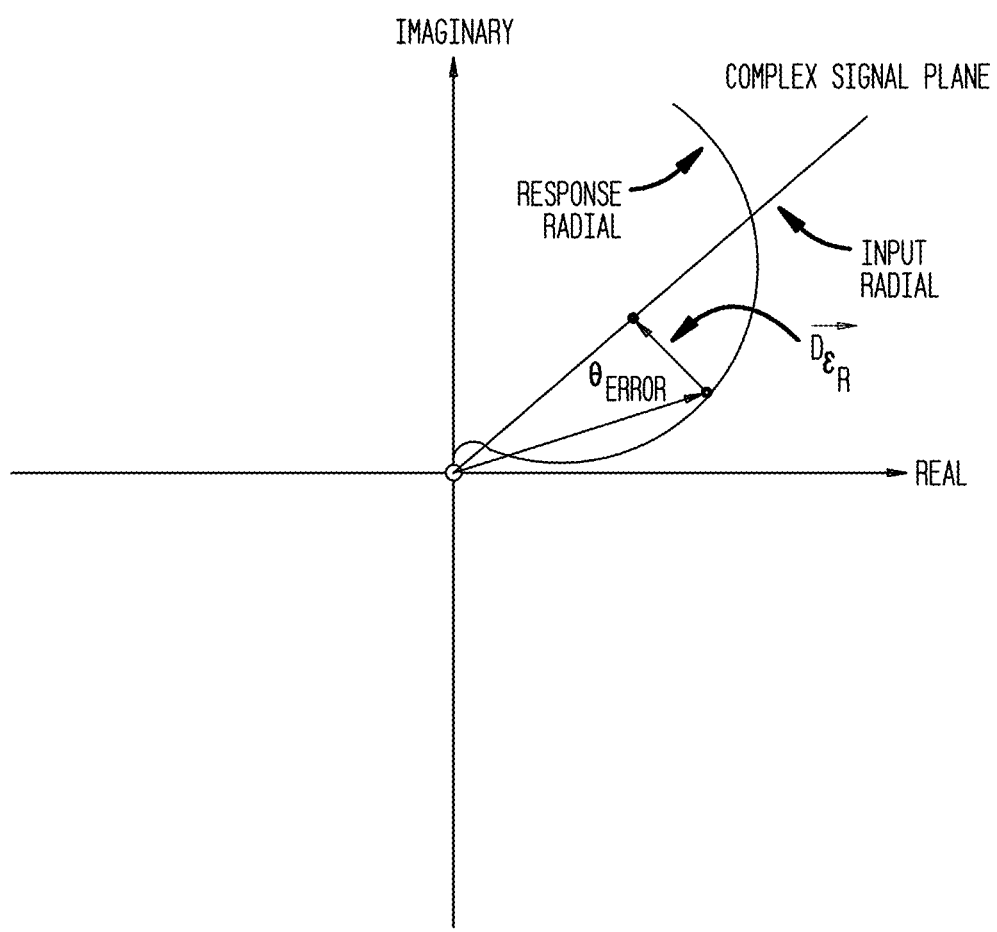
FIG. 32 illustrates a single starburst spoke of the example starburst constellation of FIG. 31.
Figure 33:
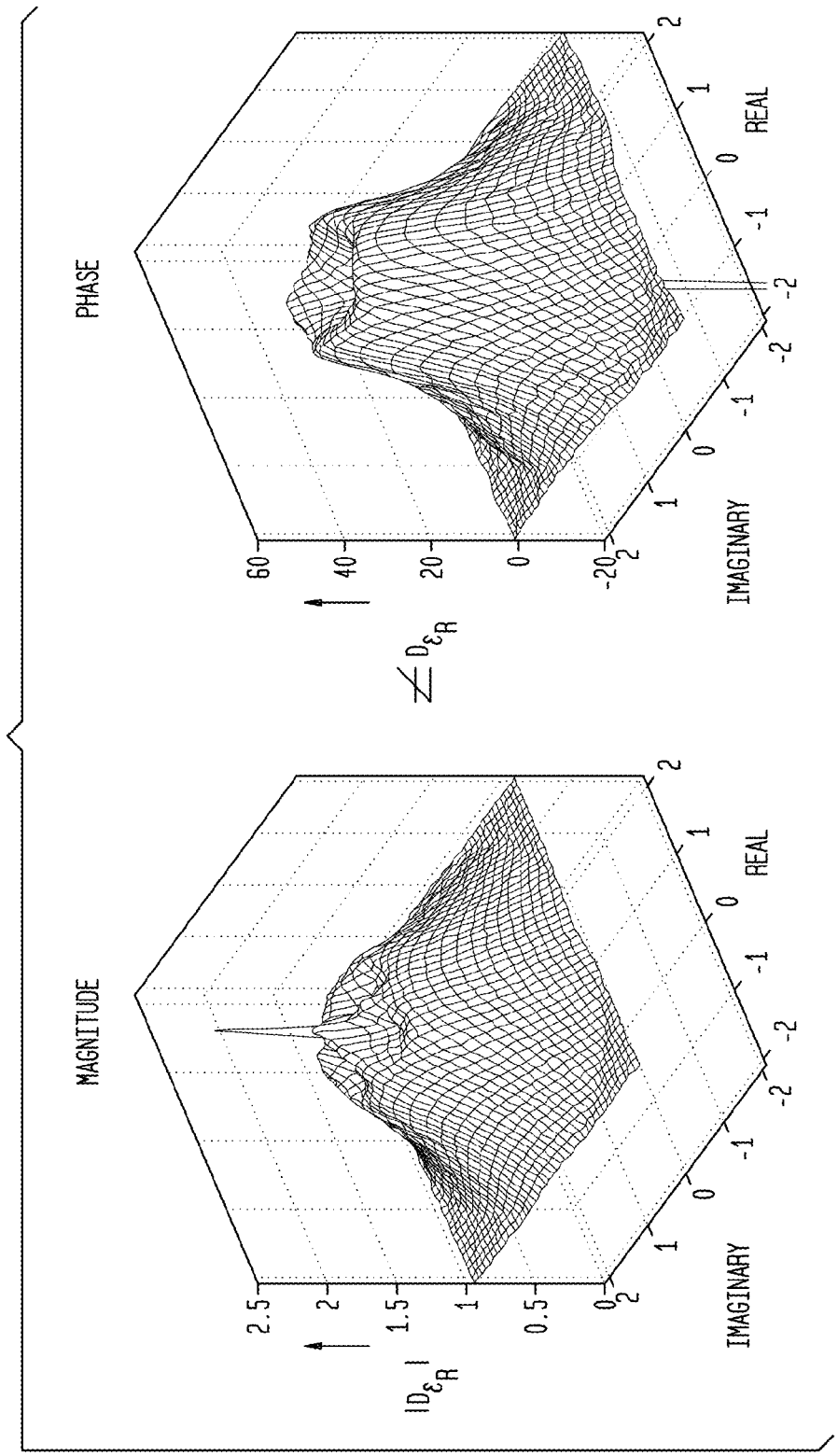
FIG. 33 illustrates example error surfaces.

FIG. 32 illustrates a single starburst spoke of the example starburst constellation of FIG. 31. As shown in FIG. 32, for each point along the trajectory, there is a magnitude and phase error or distortion which is related to error vector, $\vec{D}_{\epsilon_R}$. If the components of the error vector are disassembled into magnitude and phase for the entire complex plane, then error surfaces can be constructed as shown in FIG. 33.

Figure 34:
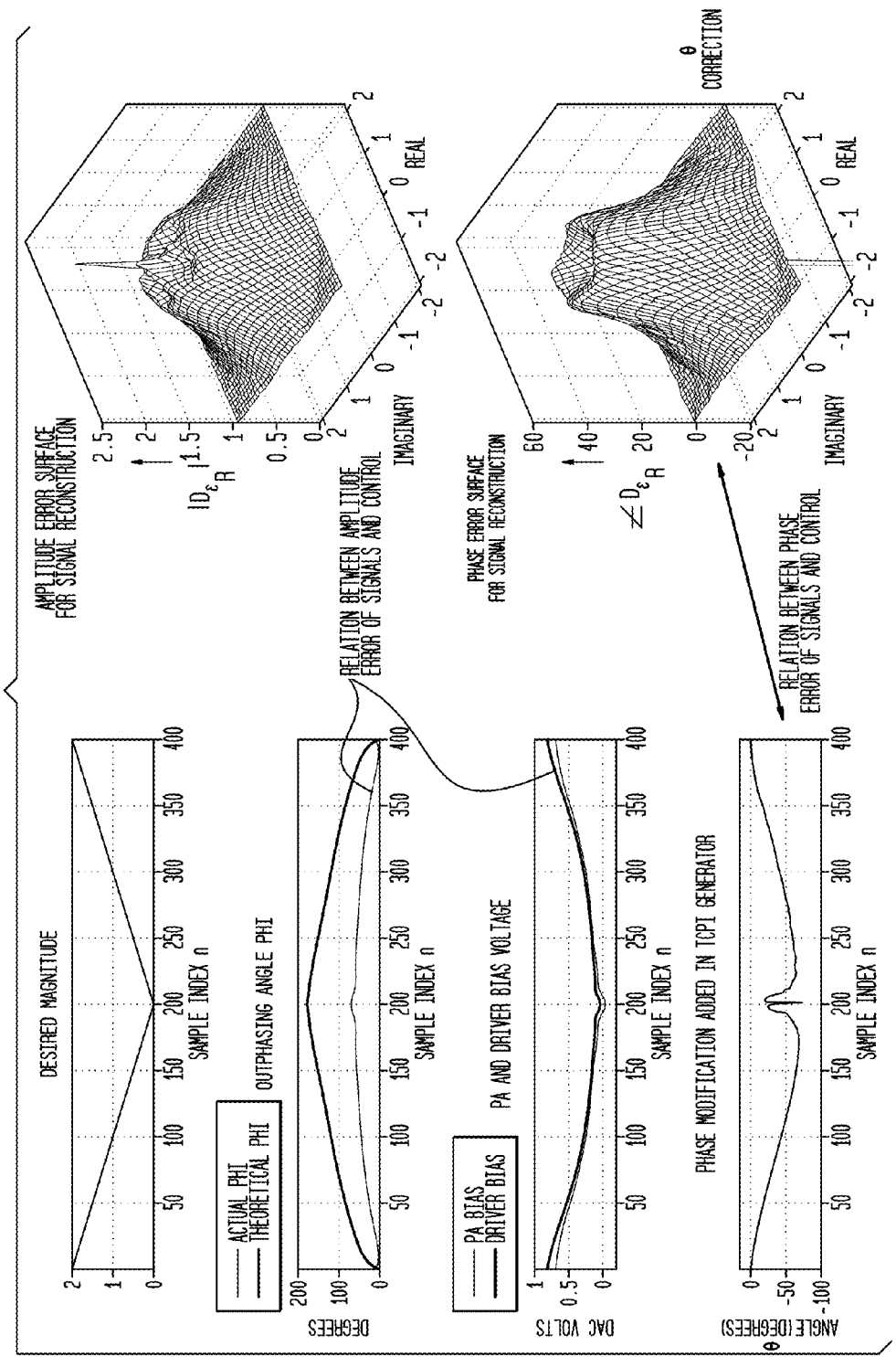
FIG. 34 illustrates the relationship between error compensation and control functions for the example of FIG. 27.

The magnitude error $|D_{\epsilon_R}|$ must be taken into account by the bias and outphasing control. The phase compensation must take into consideration the phase error $<D_{\epsilon_R}$. FIG. 34 illustrates the relationship between error compensation and control functions for the example of FIG. 27.

Another way to examine the role of the controls in signal reconstruction is to associate the controls with their impact on vector operations in the complex plane. The vectors are outphasing signals generated in the upper and lower branches of the hardware, which drives and includes the MISO amplifier. The outphasing angle is controlled, along with the gain of the driver and gain of the MISO amplifier.

Figure 35:
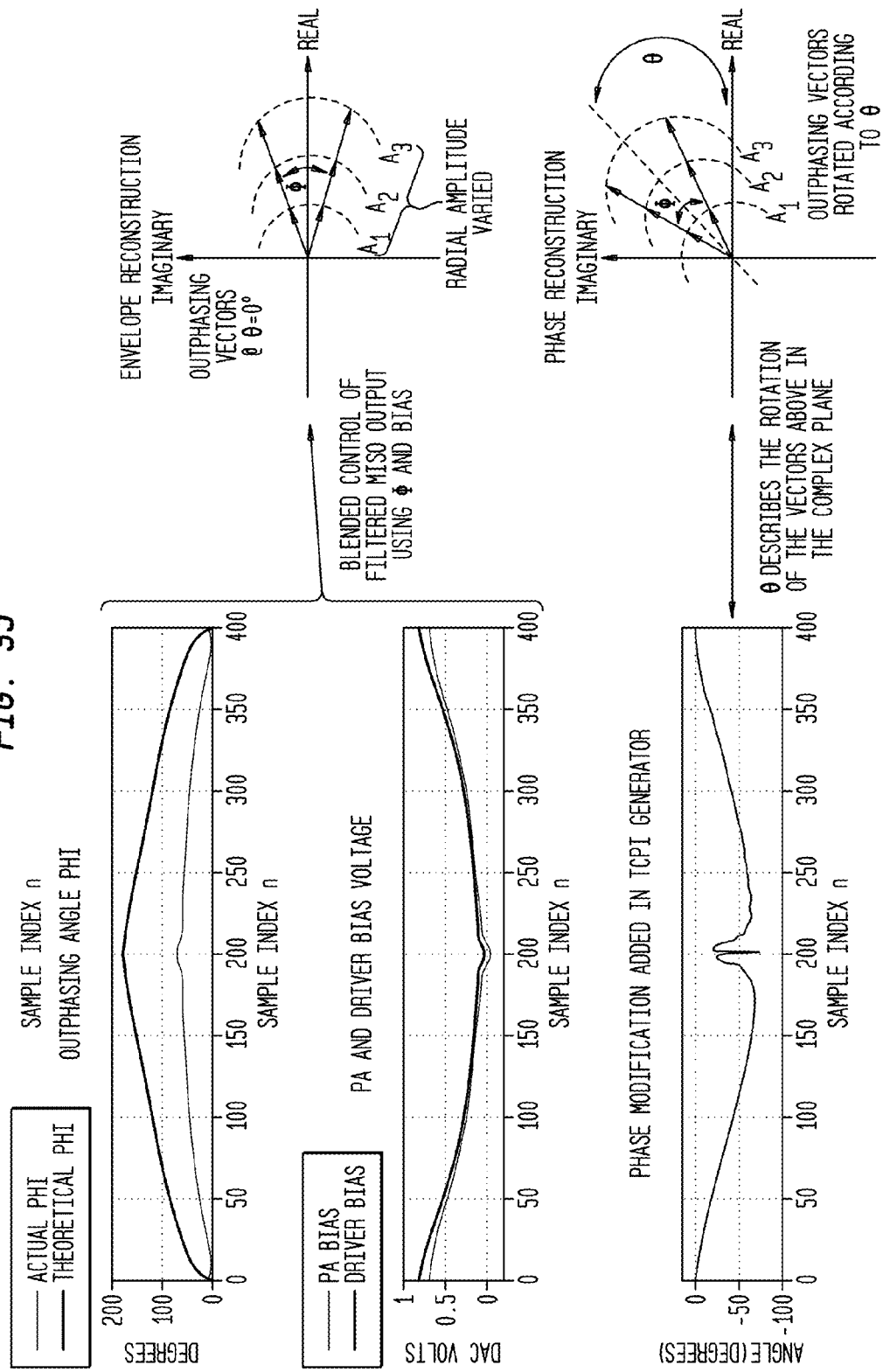
FIG. 35 illustrates the relationship between the upper and lower branch control, phase control, and vector reconstruction of signals in complex plane.

FIG. 35 illustrates the relationship between the upper and lower branch control, phase control, and vector reconstruction of signals in complex plane.

The upper and lower branch signals at the MISO amplifier inputs are controlled in terms of bias and outphasing angle φ to create the appropriate amplitude at the MISO combining node. In addition, the amplitudes of the MISO inputs may be controlled by varying the driver bias. $|\vec{D}_{\epsilon_R}|$ must be taken into account when implementing the blended control.

The phase of the reconstructed carrier is given by Θ and is controlled by manipulation of vector modulators at each branch input or controlling the phase of the RF carrier directly at the RF LO synthesizer for the system (or both). This phase Θ is associated with the modulation angle of the application signal, y(t).

Although a distinction is drawn between amplitude control and phase control of Θ they are in fact dependent and interact considerably. Their respective calculations and compensations are conjoined just as the real and imaginary components of $\vec{D}_{\epsilon_R}$ are interrelated. This is due to AM-PM and PM-AM distortion in physical hardware. As bias is reduced or power supplies varied or impedances tweaked, the insertion phase of both branches of a two branch MISO changes and therefore is a component of $<\vec{D}_{\epsilon_R}$. Hence, generating a particular point or trajectory in the complex plane related to the complex signal, at the filtered MISO output, requires the solution of at least a two dimensional parametric equation. The numbers generated for amplitude control of the complex signal are part of the solution for Θ, the modulation angle, and vice versa.

Figure 36:
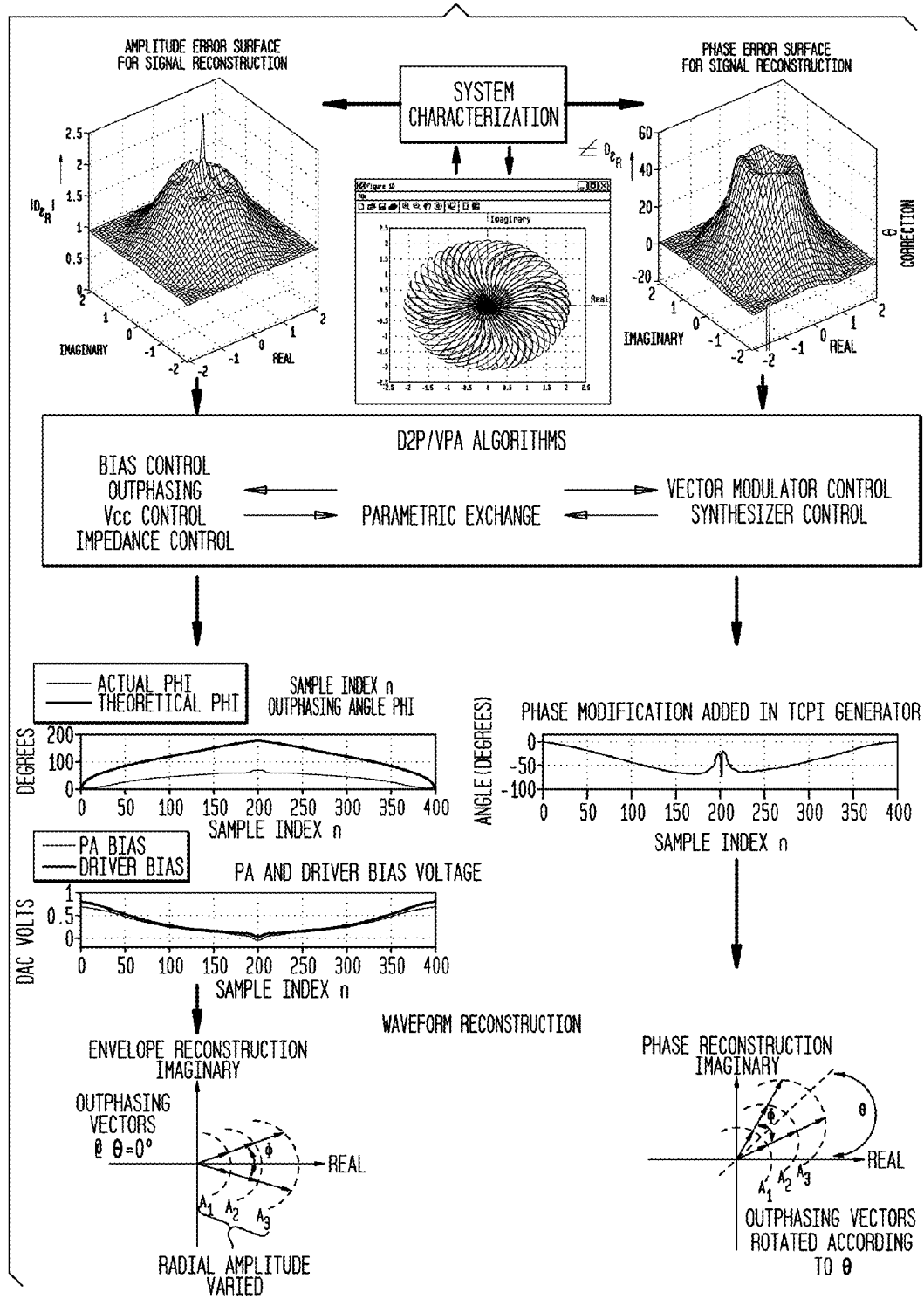
FIG. 36 illustrates the interrelationship between various example VPA algorithms and controls.

FIG. 36 illustrates the interrelationship between various example VPA algorithms and controls.

10. Comments on transient solutions and a mathematical basis for the miso Node operation Prior sections have shown that a purely outphased MISO is very efficient at maximum power output for a zero degree outphasing angle. Efficiency was also shown to drop as outphasing is applied. However, when the MISO amplifier is used in conjunction with VPA principles and control algorithms, improved efficiency is maintained throughout the power range of interest. This section provides a mathematical treatment of this behavior, including differential equation analysis which corroborates the simulated data presented previously.

Transient analysis usually requires the solution of a system of equations. In the continuous or quasi-continuous case, a time domain solution for t=(0⁺→∞) demands the solution of $2^{nd}$ order differential equations with time variant coefficients. Such equations are not practical to solve in closed form. Nevertheless, some piecewise solutions and formulation of the problem can yield important insights.

(a) R-L MISO Circuit without Load and Variable Duty Cycle

A principle of the switching amplifier requires that the power source transfers energy to some sort of energy storage device and then removes the energy (or allow it to "siphon" off) at some time later by efficient means for use by a load. The energy storage device may be a capacitor, inductor, transmission line, electrically coupled circuit, magnetically coupled circuit, or hybrids of all of the above. The transmission line is often overlooked as a means of storing energy. However, the TEM modes do in fact transport energy and can be efficient, provided loss tangents are minimal. The following treatment illustrates the use of an inductor to store energy. Consider the example RL circuit illustrated in FIG. 37.

Suppose the switch is closed at t=0. At t→0⁺ the characteristic equation of the system may be used to determine the current flowing in the circuit and the energy stored in the inductor. The differential equation is:

$$\frac{L di_a}{dt} + R s_{X_A} i_a = V_S$$

The solution of this equation requires the consideration of initial conditions:

$$i_a(t=0^-)=0$$

$$i_a(t=0^+)=0$$

Therefore, $$\frac{di_a}{dt} = \frac{V_S}{L}$$

The final current at t→∞ must approach $V_S/R_{SX_A}$. This yields a solution of:

$$i_a = \frac{V_S}{R_{SX_A}}\left(1 - e^{-(R_{SX_A}/L)t}\right)$$

Figure 37:
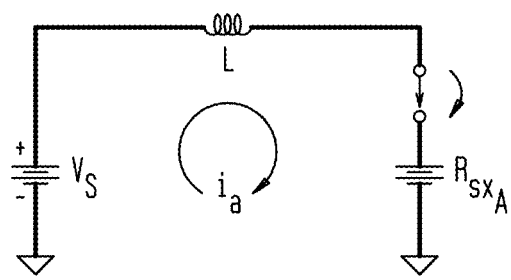
FIG. 37 illustrates an example RL circuit.
Figure 38:
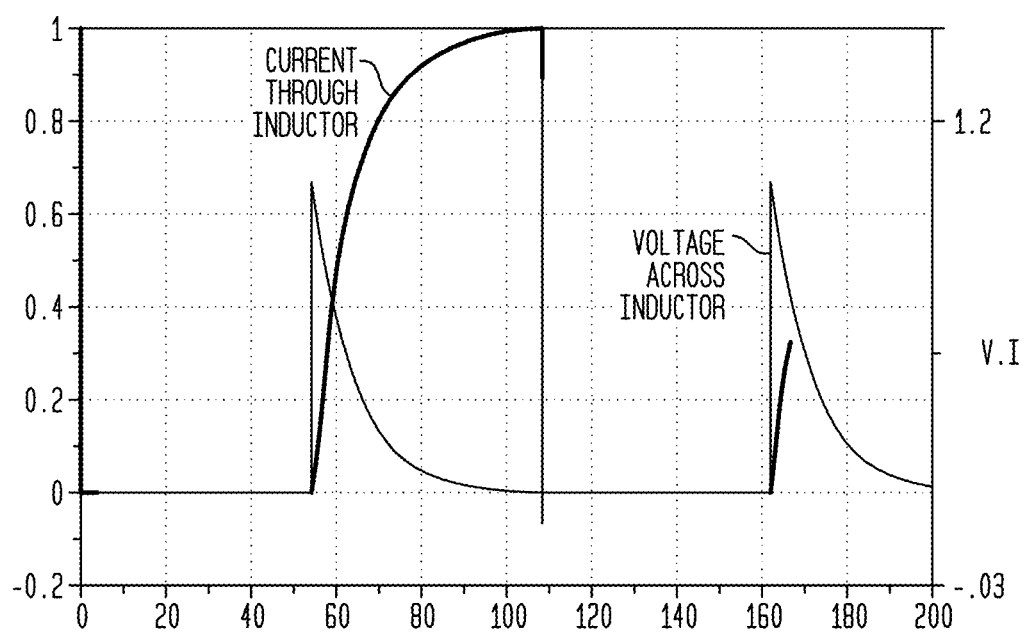
FIG. 38 illustrates the relationship between the current through the inductor and the voltage across the inductor in the example RL circuit of FIG. 37 for a 9.225 MHz carrier rate.

FIG. 38 illustrates the relationship between the current through the inductor and the voltage across the inductor in the example RL circuit of FIG. 37 for a 9.225 MHz carrier rate.

Figure 39:
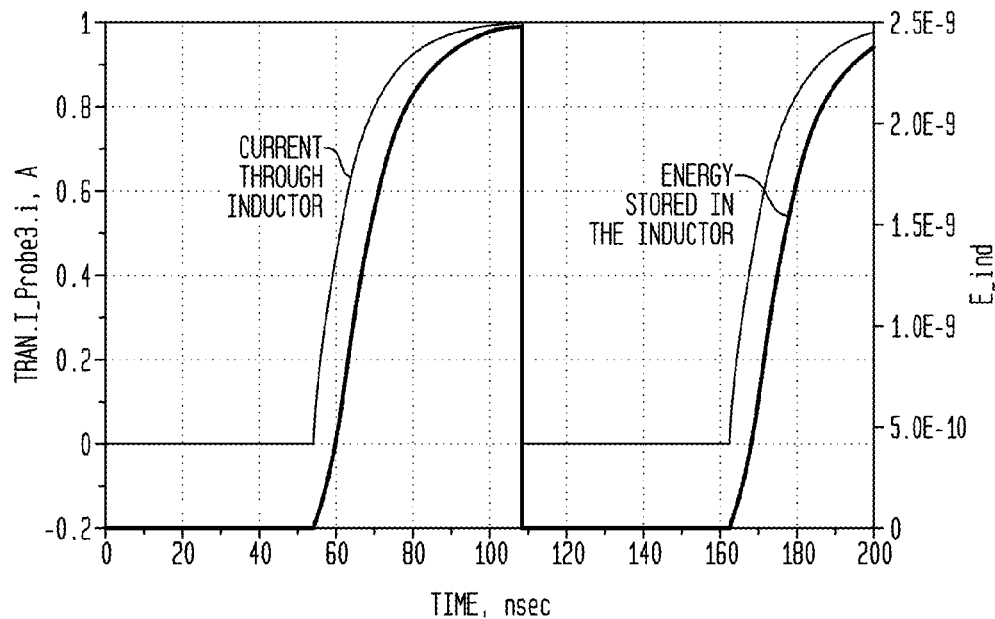
FIG. 39 illustrates the relationship between the current through the inductor and the energy stored in the inductor in the example RL circuit of FIG. 37 for a 9.225 MHz carrier rate.

FIG. 39 illustrates the relationship between the current through the inductor and the energy stored in the inductor in the example RL circuit of FIG. 37 for a 9.225 MHz carrier rate.

The circuit uses a 1 volt battery, 5 nH inductor and 1Ω resistor ($R_{SX_A}$).

FIGS. 38 and 39 are from a simulation that permits the inductor current to reach a maximum limit. This can be accomplished by controlling the duty cycle and frequency of the switch, such that the switching cycle time is virtually infinite compared to the circuit time constant.

If the switch frequency is required to operate at the carrier rate, then only a fraction of the energy may be stored in the inductor given the same circuit values, if the carrier cycle time is considerably shorter than the time constant ($R_{SX_A}/L$). For instance, consider the carrier rate of 9.225 MHz in the example illustrated in FIGS. 38 and 39 compared to the example illustrated in FIGS. 40 and 41, which uses a switch rate of 1.845 GHz, with the same circuit values.

Figure 40:
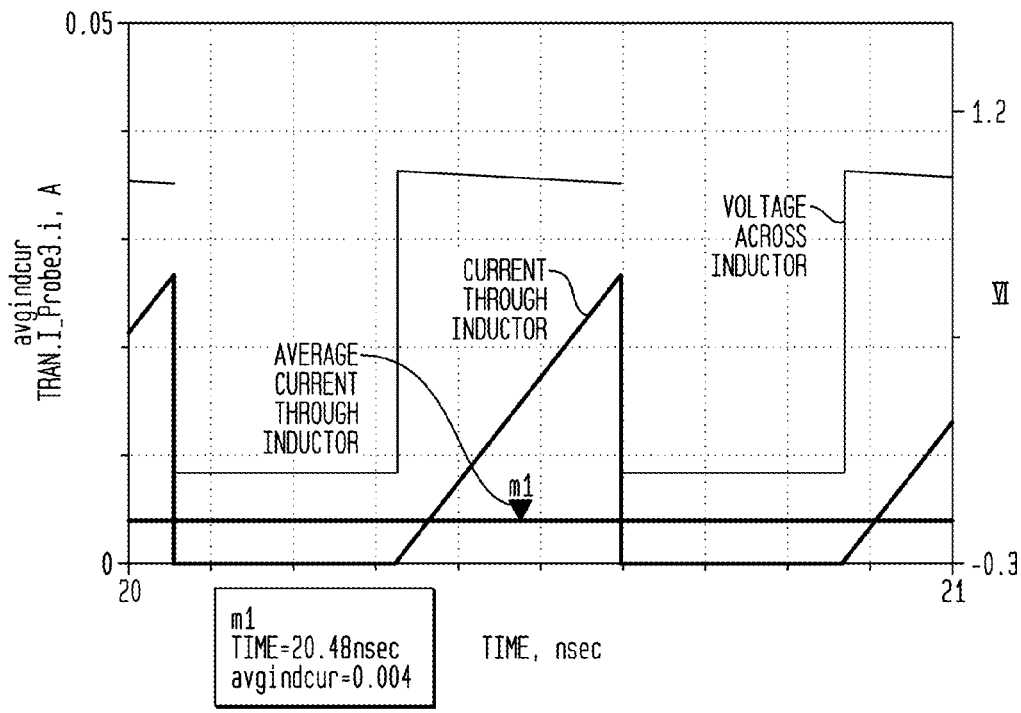
FIG. 40 illustrates the relationship between the current through the inductor and the voltage across the inductor in the example RL circuit of FIG. 37 for a 1.845 GHz MHz carrier rate.

FIG. 40 illustrates the relationship between the current through the inductor and the voltage across the inductor in the example RL circuit of FIG. 37 for a 1.845 GHz MHz carrier rate.

Figure 41:
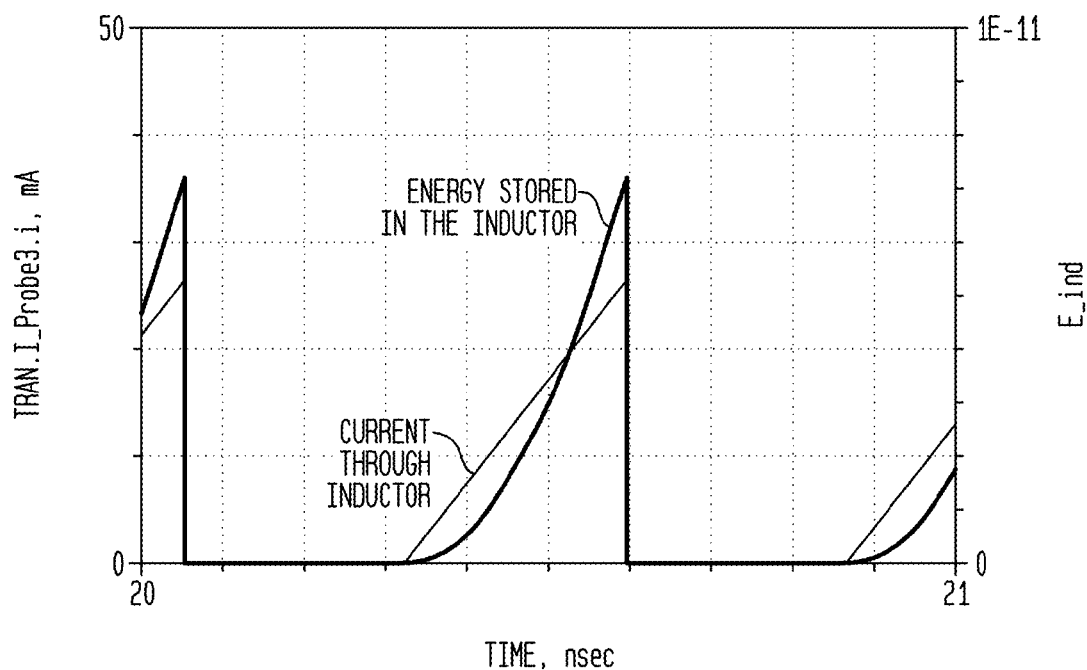
FIG. 41 illustrates the relationship between the current through the inductor and the energy stored in the inductor in the example RL circuit of FIG. 37 for a 1.845 GHz carrier rate.

FIG. 41 illustrates the relationship between the current through the inductor and the energy stored in the inductor in the example RL circuit of FIG. 37 for a 1.845 GHz carrier rate.

It is noted from FIGS. 40 and 41 that the current in this time domain range is approximately a ramp. Also, the average current in the inductor is illustrated in FIG. 40. This is an important consideration for efficiency calculations since the average current through the resistor $R_{SX_A}$ causes power to be dissipated. In this example, the resistor dissipates approximately 1.6 mW.

Figure 42:
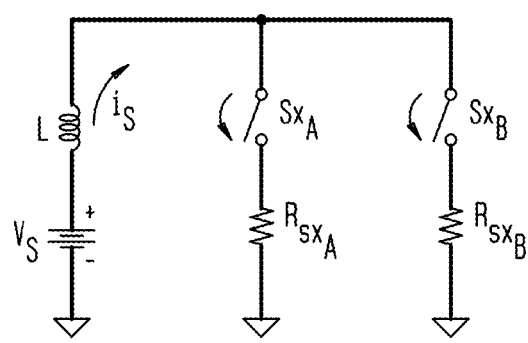
FIG. 42 illustrates another example RL circuit.

Suppose that the R-L switched circuit of FIG. 37 is augmented with another switch. Further suppose that the two switches can be outphased. The circuit is illustrated in FIG. 42.

Assuming that the time delay between pulses controlling the switches $S_{X_A}$ and $S_{X_B}$ is given by $T_M$, which is related to the outphasing angle, there are 4 equivalent resistance values which are relevant over certain segments of time. These represent 4 unique time constants given by:

$$\tau_1 = \frac{R_{SX_A}}{L}$$

$$\tau_2 = \left(\frac{R_{SX_A} \cdot R_{SX_B}}{R_{SX_A} + R_{SX_B}}\right)/L$$

$$\tau_3 = (R_{SX_B}/L)$$

$$\tau_4 = \infty$$

Taking into account an infinite pulse train, the following cyclic unit step functions are constructed and associated with each time constant:

$$U_1 = \sum_{k=0}^{\infty} [(u(t-kT_C)) - u(t-(kT_C+T_M))]$$

$$U_2 = \sum_{k=0}^{\infty} [(u(t-kT_C+T_M)) - u(t-(T_C(k+1/2)))]$$

$$U_3 = \sum_{k=0}^{\infty} [(u(t-(k+1/2)T_C) - u(t-(T_C(k+1/2)+T_M)))]$$

$$U_4 = \sum_{k=0}^{\infty} [(u(t-(T_C(k+1/2)+T_M)-ut-T_C(k+1)))]$$

$T_C \triangleq$ (Carrier Rate)$^{-1}$ $T_M \triangleq$ Time Delay associated with outphasing modulation angle.

Inspection reveals that $u_v$ do not overlap in time. Therefore the differential equation solution will take on the following form for $i_S$:

$$i_S = \frac{V_S}{L\sum_{i=1}^{4} u_i \tau_i} \left(1 - e^{-\sum_{i=1}^{4} u_i \tau_i t}\right)$$

Figure 43:
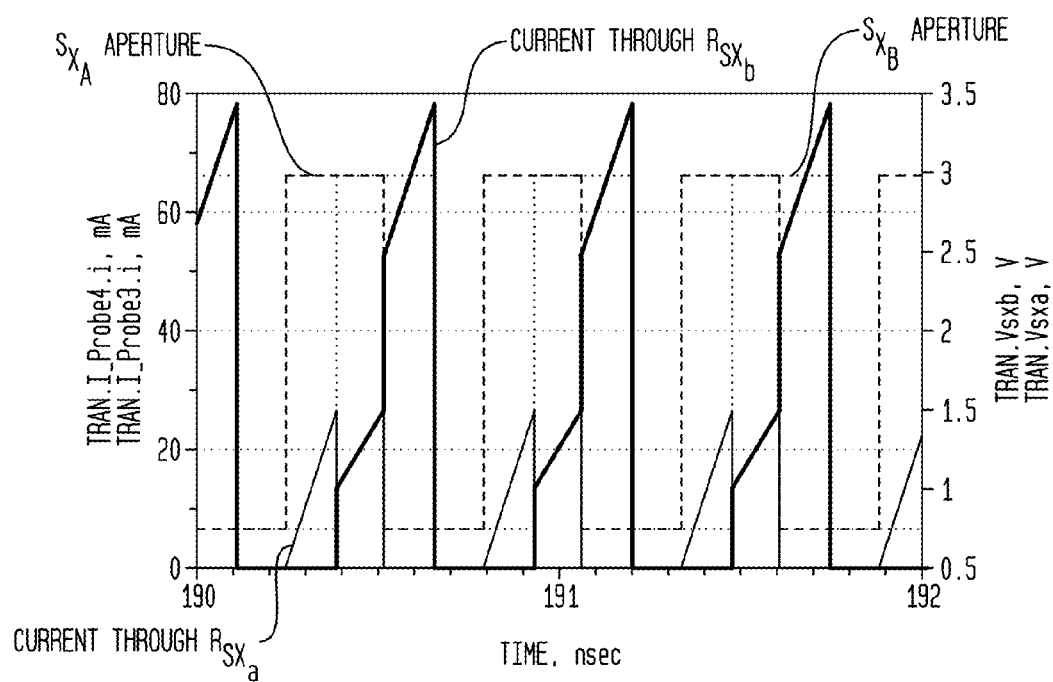
FIG. 43 illustrates the currents through the switch branches in the example RL circuit of FIG. 42 for 90 degrees of outphasing.

Currents through $R_{SX_A}$ and $R_{SX_B}$ illustrate the multiple time constant when superimposed on the same graph. The switching events are illustrated along with the switch currents in FIG. 43, which illustrates the currents through the switch branches in the example RL circuit of FIG. 42 for 90 degrees of outphasing.

Figure 44:
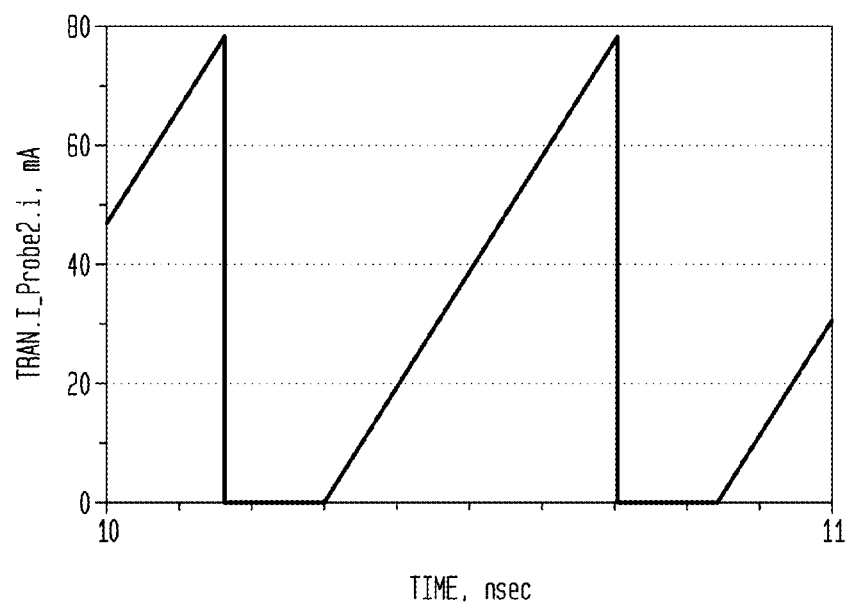
FIG. 44 illustrates the current through the inductor in the example RL circuit of FIG. 42 for 90 degrees of outphasing.

$\tau_1$, $\tau_2$, $\tau_3$, $\tau_4$ are visible for this 90 degree outphase example. The current through the inductor is the sum of both switch branches and is illustrated in FIG. 44.

Figure 45:
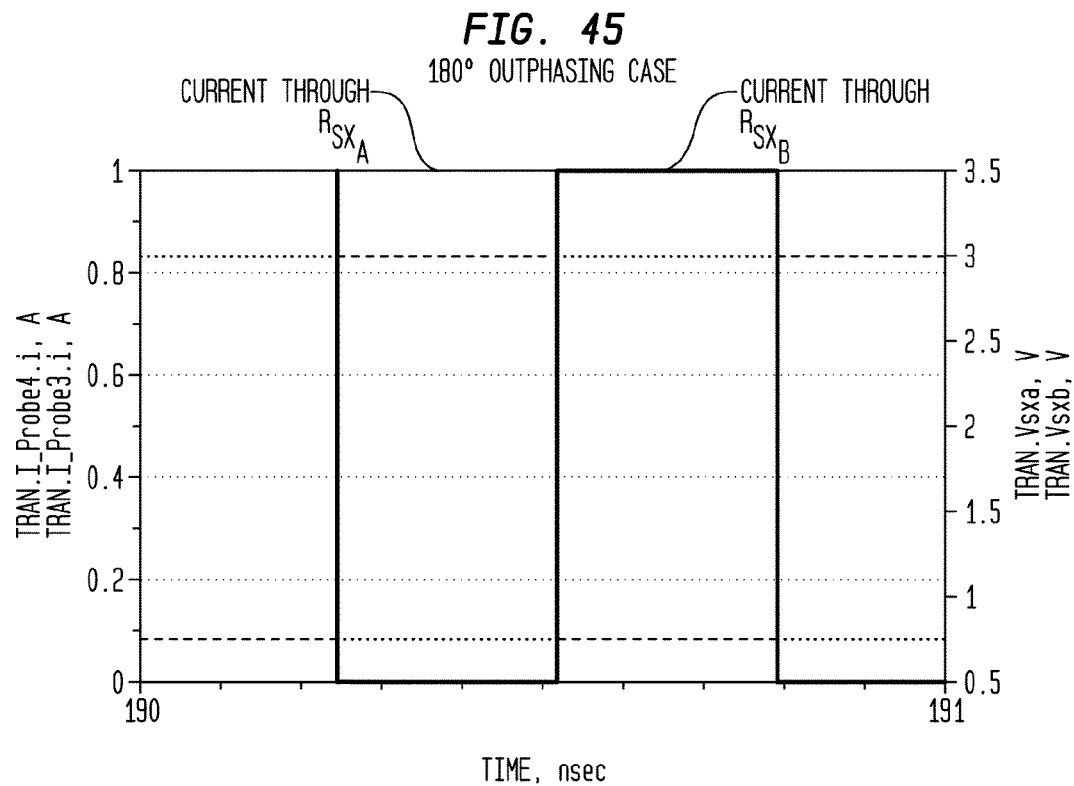
FIG. 45 illustrates the current through the switch branches in the example RL circuit of FIG. 42 for 180 degrees of outphasing.
Figure 46:
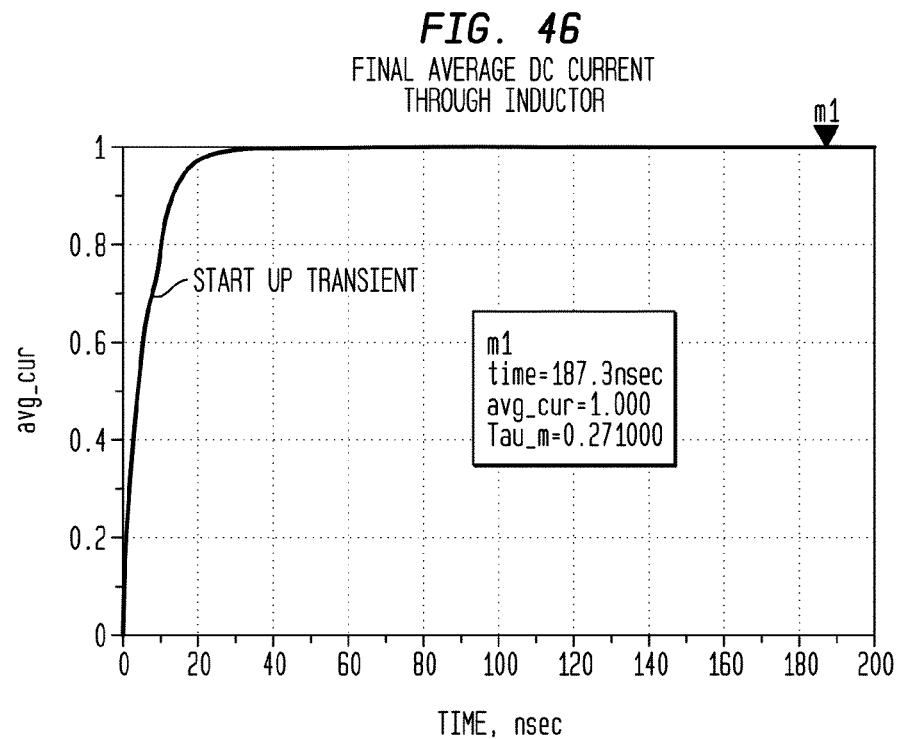
FIG. 46 illustrates the current through the inductor in the example RL circuit of FIG. 42 for 180 degrees of outphasing.

At the 180 degrees of outphasing, the power source is continually shunted through the switches to ground. This condition eliminates all harmonic currents in the inductor. Only DC currents remain, so that the fundamental is eliminated. This is illustrated in FIGS. 45 and 46. FIG. 45 illustrates the current through the switch branches in the example RL circuit of FIG. 42 for 180 degrees of outphasing. FIG. 46 illustrates the current through the inductor in the example RL circuit of FIG. 42 for 180 degrees of outphasing.

Whenever the outphasing angle <180° the current through the pull up inductor is a ramp:

$$i_A = \frac{1}{L}\int V_L dt$$

Therefore, when the switches are closed a voltage is applied across the inductor and a current ramp is generated. The outphasing angle has an effect of extending the duty cycle of the applied voltage from $T_c/2$ up to a full duty cycle, $T_c$. As illustrated above at the full duty cycle, $T_c$, the switches are completely outphased and the ramp disappears.

Three observations are gleaned from this discussion thus far: a) The current flowing through the energy storage element (inductor) is approximately a linear ramp and extends in duty cycle from $T_c/2$ to $T_c$–; b) The current ramp will grow to twice the magnitude as the duty cycle increase, in a linear manner; and c) The average current flowing in the inductor and the resistors increases as the duty cycle of the ramp increases up to the 180° outphasing angle, at which time only DC currents flow and are equal to a value of the battery voltage divided by the switch resistance.

a), b), and c) along with the prior differential equation analysis can be used to examine "purely outphased" MISO, particularly when efficiency versus power out is examined.

The circuit analyzed above does not possess a real load. Nevertheless, a pseudo-efficiency can be defined as follows:

$$\eta_{\text{eff}} \approx \frac{\text{Reactive Power in the Fundamental Harmonic}}{\text{Total DC Power Supplied to the Credit}}$$

The Fourier coefficients for the general current ramp with variable duty cycle can be written as:

$$a_n = \sum_{n=1}^{\infty} \left[\frac{A}{(n\pi)^2}\left(\cos\left(\left(\frac{1}{2}+\frac{T_M}{T_C}\right)2n\pi\right)-1\right) + \frac{2A}{n\pi}\sin\left(\left(\frac{1}{2}+\frac{T_M}{T_C}\right)2n\pi\right)\right]$$

$$b_n = \sum_{n=1}^{\infty} \left[\frac{A}{(n\pi)^2} + \frac{2\left(\frac{1}{2}+\frac{T_M}{T_C}\right)A}{n\pi}\left(1-\cos\left(\left(\frac{1}{2}+\frac{T_M}{T_C}\right)2n\pi\right)\right)\right]$$

where $T_M \triangleq$ Time Delay associated with outphasing modulation $$\phi \triangleq \text{Outphasing Angle} = \left(\frac{2T_M}{T_C}\right) \cdot 180 \text{ degrees}$$

degrees

Reactive power is calculated in the fundamental (n=1) and is found to increase as the duty cycle increased for the ramp.

Figure 47:
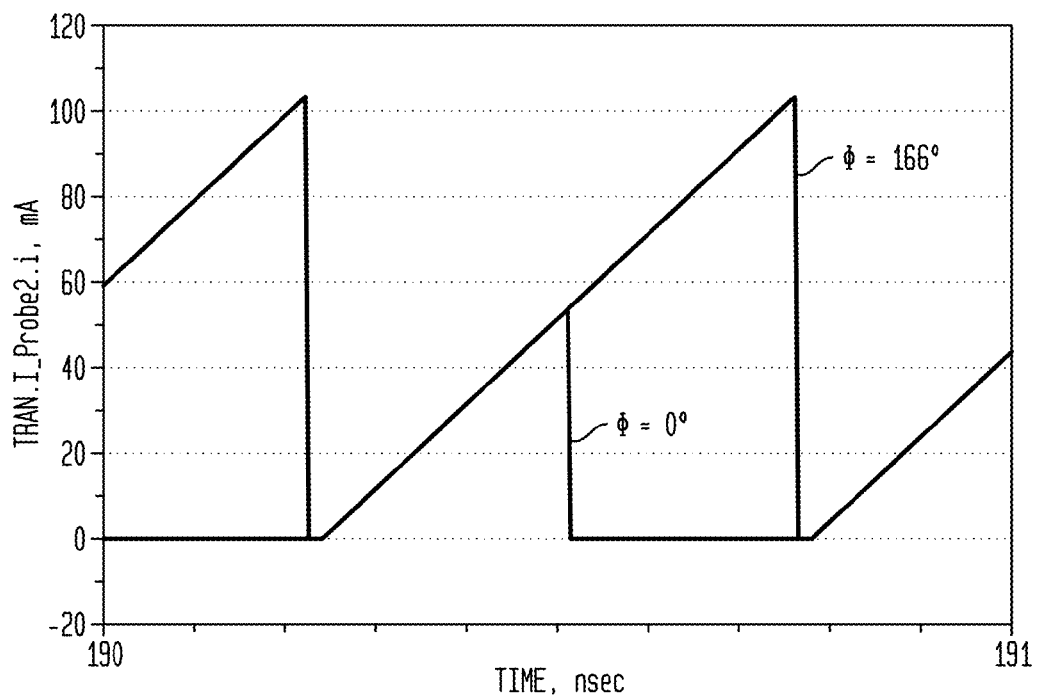
FIG. 47 illustrates the increase in the ramp amplitude of the inductor current for two outphasing angles in the example circuit of FIG. 42.

This can be explained by the ramp amplitude almost doubling, near 180 degrees outphasing. Although the harmonic energy due to the duty cycle decreases slightly, the increase in ramp amplitude over the cycle duration overcomes the Fourier losses. FIG. 47 illustrates the increase in the ramp amplitude of the inductor current for two outphasing angles in the example circuit of FIG. 42.

Figure 48:
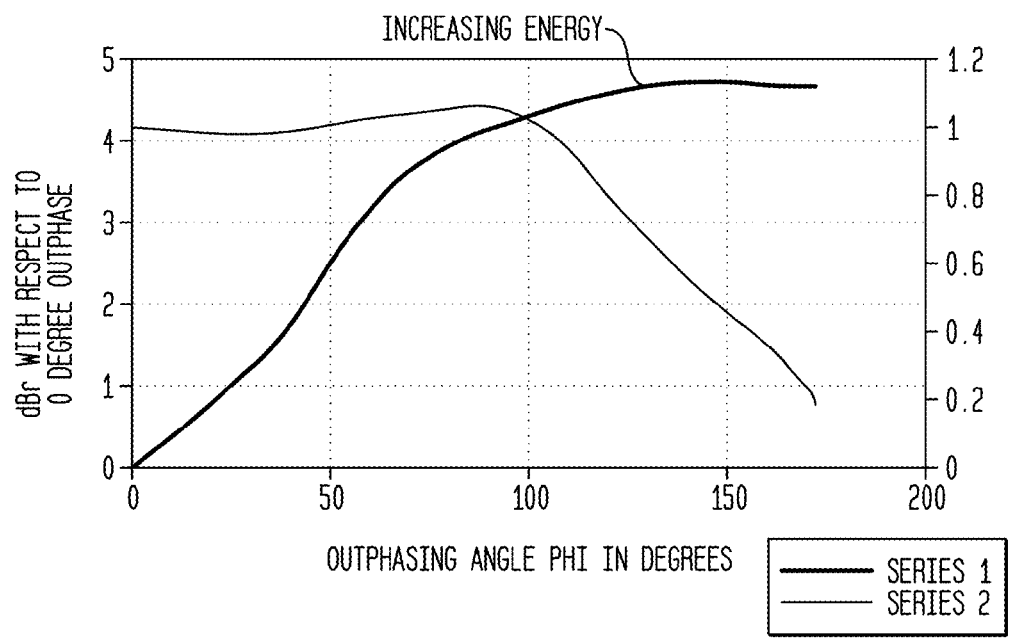
FIG. 48 illustrates the reactive power cycled in the inductor versus the outphasing angle in the example circuit of FIG. 42.

The reactive power cycled in the inductor is plotted in FIG. 48 versus $\phi$ with power in dB, using $\phi=0°$ as the reference of zero.

In addition, the pseudo efficiency is given as a function of outphasing angle relative to the efficiency at $\phi=0°$. Notice that pseudo efficiency is flat up to more than $100°$ of outphasing. This is further discussed below.

For a range of 0 degrees outphasing to nearly 180 degrees of outphasing, the reactive power in the fundamental cycled through the inductor actually increases. In other words, pure outphasing with a MISO node, and nearly ideal switching components, does not produce an attenuation of the available output energy over virtually the entire outphasing angle range. Furthermore, as the current ramp increases in duty cycle from 50% to nearly 100%, the DC average increases by 6 dB until just prior to the 100% duty cycle. Again, this is extracted from the Fourier analysis of the ramped current, revealed by the differential equation.

Although a load circuit is not included for this basic analysis, energy available in the inductor can be transferred to a load.

(b) Blended Outphasing in the R-L Case without Load

In the prior section, it was verified by mathematical analysis that the reactive energy transferred to the inductor from the battery at the fundamental frequency does not fall off rapidly as a function of outphasing angle. In classical outphasing systems, the power available would normally follow a characteristic of:

$$P_{OUT} \propto A^2 \cos^2(\phi/2)$$

In the MISO case, pure outphasing does not produce this result. Rather, the energy available in the inductor increases as was illustrated by the differential equation for the simple MISO example.

In this section, the simple example is revisited with the goal of illustrating how source impedances (more specifically resistances for this simple example) modify the energy transfer characteristic.

Figure 49:
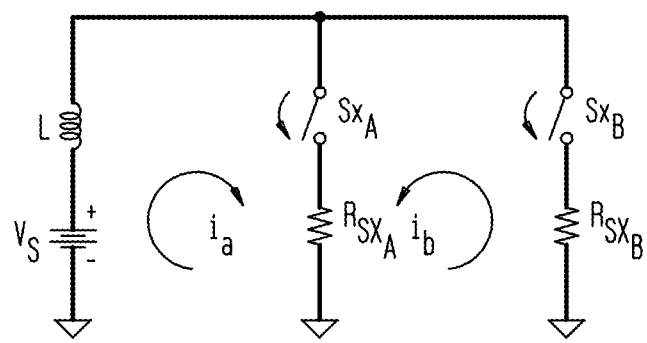
FIG. 49 illustrates an example RL circuit.

The appropriate differential equation is derived from example circuit shown in FIG. 49.

The relevant circuit equations are:

$$V_S - L\frac{di_a}{dt} + (i_b - i_a)\frac{R_a}{\sum_{k=0}^{\infty} \frac{u[(t-kT_C) - u(t-(k+1/2)T_C)]}{u_a}} = 0$$

$$(-i_b + i_a)\frac{R_a}{\sum_{k=0}^{\infty} u[(t-kT_{zc}) - u(t-(k+1/2)T_C)]} -$$

$$i_b \frac{R_b}{\sum_{k=0}^{\infty} \frac{[u(t-(kT_C+T_M)) - u(t-(k+1/2)T+T_M))]}{u_b}} = 0$$

Two system equations result:

$$\left(\frac{d}{dt} - \frac{1}{L\left(\frac{u_b}{R_b} + \frac{u_a}{R_a}\right)}\right)i_b = \frac{1}{L}\frac{u_b}{R_b}V_S$$

$$i_a = \left(1 + \frac{R_b u_a}{R_a u_b}\right)i_b$$

Hence, the general solution can be written as:

$$i_b = k_b\left(1 - e^{-\frac{\left(\frac{R_a}{U_a} + \frac{R_b}{U_b}\right)}{L\left(1 + \frac{R_b R_a}{U_b U_a}\right)}t}\right), t \geq 0$$

$$i_a = \left(1 + \frac{R_b u_a}{R_a u_b}\right)(k_b(1 - e^{-\lambda t})), t \geq 0$$

Initial and final conditions are:

$$@t = 0 \quad i_b = 0$$
$$@t = 0+ \quad \frac{di}{dt} = \frac{V_S}{L}$$
$$@t = \infty \quad i_b = 0$$

$$\therefore k_b = \frac{V_S}{\left(\frac{R_a}{u_a} + \frac{R_b}{u_b}\right)} \text{ for } R_a = R_b$$

and finally, $$i_a = \left(1 + \frac{u_a}{u_b}\right)\left(\frac{V_S}{\left(\frac{R_a}{u_a} + \frac{R_b}{u_b}\right)}\right)(1 - e^{-\lambda t})$$

This result is similar to the result presented in the previous section yet with a slightly different form. Switch resistances are given by:

$$R_{SX_a} = \frac{R_a}{u_a}$$

$$R_{SX_b} = \frac{R_b}{u_b}$$

These resistances are time variant functions. They are also functions of $T_M$.

It was shown in the previous section that unrestrained current in the switches produces an undesirable outphasing result if the goal is to mimic a classical outphasing transfer characteristic. The available reactive power in the first harmonic cycled through the inductor can be obtained from:

$$P_{X_L} = (0.707 i_{a_1})^2 x_L$$

$x_L \triangleq$ Inductor Reactance

The first harmonic of the current was calculated previously from the Fourier analysis in the previous section and is given as:

$$i_{a_1} = A\left(a_1 \cos\left(\frac{2\pi t}{T_C}\right) + b_1 \sin\left(\frac{2\pi t}{T_C}\right)\right)$$

$a_1$, $b_1$ are the Fourier coefficients and A is an amplitude function associated with the gain of the differential equation, given above.

$P_{x_L}$ can therefore be tailored to produce an appropriate transfer characteristic as a function of $T_M$ by recognizing that $i_a$ is a function of $T_M$. Therefore, the following constraining equation is invoked:

$$P_{X_L}(T_M) = K\cos^2\left(\frac{2T_M}{T_C} \cdot \pi\right) = (.707 \cdot i_{a_1}(T_M))^2 x_L$$

This equation constrains the energy per unit time cycled through the inductor to vary as a function of $T_M$ (outphasing delay time) according to the "ideal" classical outphasing transfer characteristic. The equation may be solved in terms of $V_S(T_M)$, $R_{SX_a}(T_M)$, $R_{SX_b}(T_M)$, etc. That is, if the power source and/or the resistances are permitted a degree of freedom to vary as a function of $T_M$, then the constraining equation possesses at least one solution.

These equations can be reduced considerably by rewriting and rearranging terms, using the local time span ramp approximation and associated Fourier analysis:

$$A^2\{R_{SX_a}(T_M), R_{SX_b}(T_M)\} = \frac{K\cos^2\left(\frac{2T_M}{T_C} \cdot \pi\right)}{\left(a_1(T_M)\cos\frac{2\pi t}{T_C} + b_1(T_M)\sin\frac{2\pi t}{T_C}\right)^2}$$

The left hand side is the portion which must be solved and is related to the Differential Equation Characteristic.

According to embodiments of the present invention, a numerical solution technique can be applied to obtain $R_{SX_a}(T_M)$, $R_{SX_b}(T_M)$. The denominator is a function of the energy of the ramped current pulses cycled in the inductor. $\alpha_1$ and $b_1$ are the first harmonic terms of the Fourier component of these pulses. If the properties of the current pulse slope and amplitude can be controlled, then the available energy per unit time stored by the inductor can be tailored as well.

Examination of the differential equation for $i_a(t)$ gives the following slope calculation:

$$\frac{d}{dt}i_a\bigg|_{t=0} = E(t) \cdot \frac{d}{dt}(1-e^{-\lambda t})\bigg|_{t=0} + (1-e^{-\lambda t}) \cdot \frac{d}{dt}E(t)\bigg|_{t=0} \therefore$$

$$\frac{d}{dt}i_a\bigg|_{t=0} = \left(1 + \frac{u_a R_b}{u_b R_b}\right)\frac{V_S}{\left(\frac{R_a}{u_a} + \frac{R_b}{u_b}\right)}\lambda e^{-\lambda t}\bigg|_{t=0} +$$

$$\frac{d}{dt}\left(\left(1 + \frac{u_a R_b}{u_b R_b}\right)\left(\frac{V_S}{\frac{R_a}{u_a} + \frac{R_b}{u_b}}\right)(1-e^{-\lambda t})\right)\bigg|_{t=0} \quad \frac{d}{dt}i_a(t) = \frac{V_S}{L} @ t = 0$$

Hence, the slope is easy to calculate for the short duration of a single carrier cycle time. However, though the slope at $t=0$ is always constant, the slope at $T_C/2 < t < T_C$ can be modified by significant changes in the time constant $\tau_{eff} = R_{eff}/L$, where $R_{eff}$ is the effective resistance during the cycle. $R_{eff}$ can change as a function of the desired modulation angle. Unfortunately, the calculation of the Fourier coefficients for the exponential pulse, though available in closed form, are very tedious expressions to write down and therefore will not be described. The coefficients $a_1(T_M)$ and $b_1(T_M)$ can be numerically evaluated.

Figure 50:
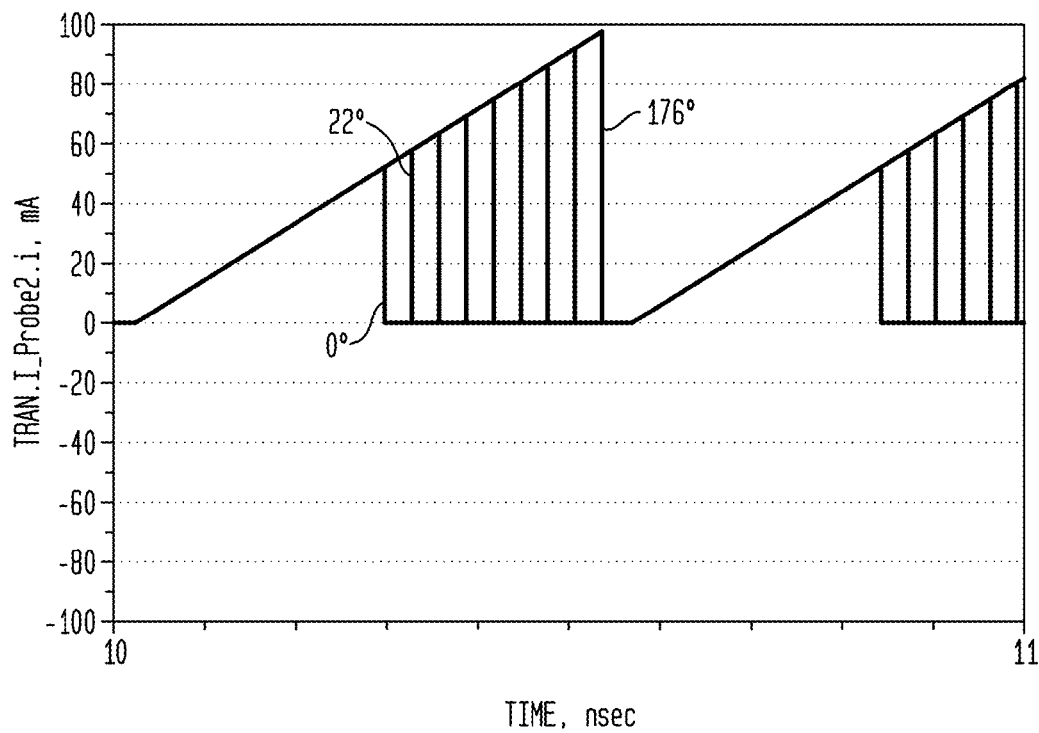
FIG. 50 illustrates current through the inductor of the example RL circuit of FIG. 49 for various outphasing angles.
Figure 51:
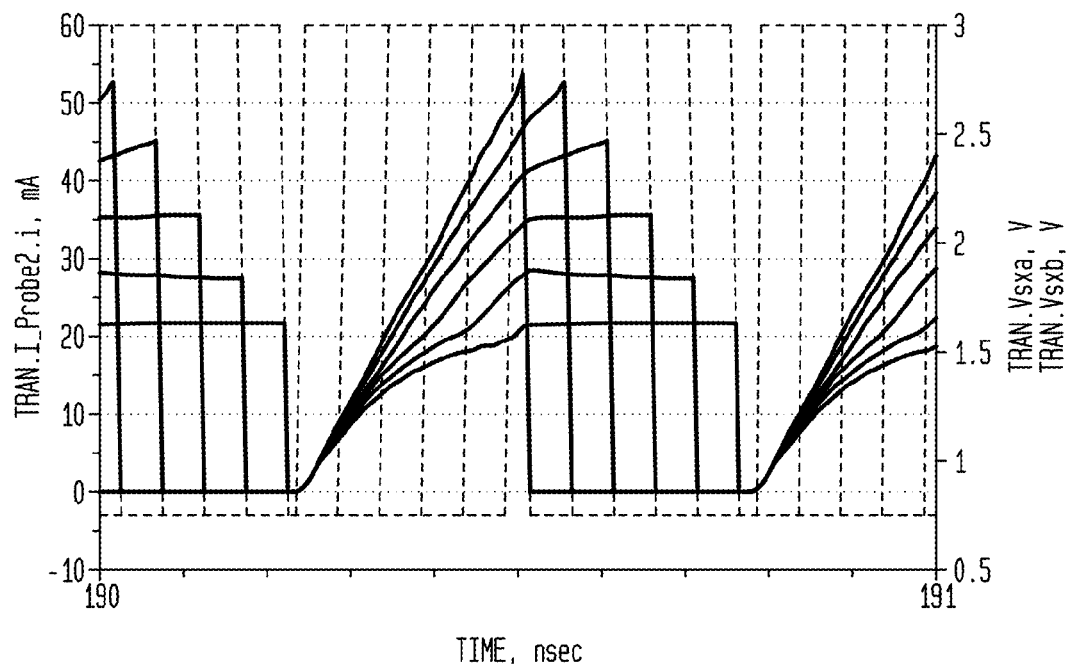
FIG. 51 illustrates current pulses through the inductor of the example RL circuit of FIG. 49 for various outphasing angles with switch resistance varied.

FIGS. 50 and 51 illustrate how the pulse shape of the current changes as the switch resistance is permitted to vary significantly for increasing values of $T_M$. In particular, FIG. 50 illustrates the case of fixed resistance in the switches of 0.1Ω. FIG. 51 provides a control which steps the resistance in 1052 increments from 0.1Ω to 50.1Ω. As can be noted from FIGS. 50 and 51, energy cycling through the inductor decreases according to a true outphasing system when resistance is varied. The switch resistance or impedance increases with outphasing angle. Both duty cycle and current pulse amplitude vary. This blended control can be precisely tailored to obtain the ideal outphasing characteristic and in fact overcome any other non-linear or parasitic phenomena.

(c) Equations Related to Outphasing with a Load

Figure 52:
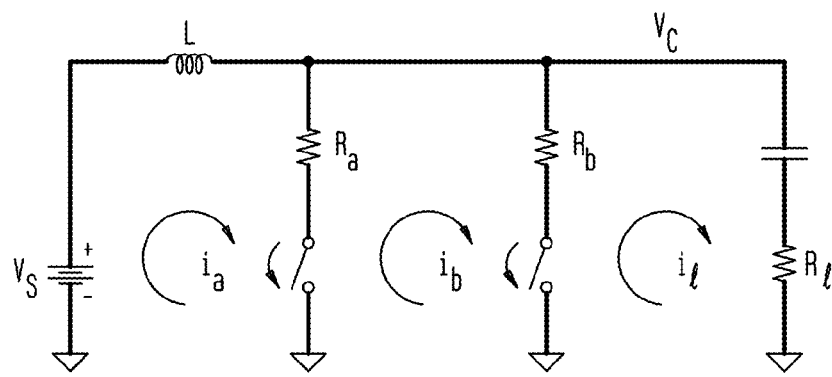
FIG. 52 illustrates an example circuit having a load coupled by a capacitor.

The previous section dealt with available energy in an inductor cycled by outphased switches possessing internal real valued time varying impedances. This section examines a load circuit which is coupled by a capacitor. An example of such circuit is illustrated in FIG. 52.

The detailed transient solution is based on the solution of the following differential equation:

$$\frac{d^2}{dt^2}il + \frac{\gamma_2}{\gamma_1} \cdot \frac{d}{dt}il - \frac{\gamma}{\gamma_1}il = \frac{d}{dt}V_S$$

$$\gamma_0 = \left(\frac{R_{SX_a}}{R_{SX_b}}(R_{SX_b} + R_l) + R_l\right)$$

$$\gamma_1 = \frac{L}{R_{SX_a}}\gamma_0$$

$$\gamma_2 = \frac{L}{R_{SX_a}}\left(\frac{1}{C}\left(\frac{R_{SX_a}}{R_{SX_b}} + 1\right)\right) - \frac{R_{SX_a}}{R_{SX_b}}(R_{SX_b} + R_l) + \gamma_0$$

$$\gamma_3 = \frac{1}{C}\left(\frac{R_{SX_a}}{R_{SX_b}}\right)$$

$$R_{SX_a} = \frac{R_a}{u_a}$$

$$R_{SX_b} = \frac{R_b}{u_b}$$

$u_a$ and $u_b$ were defined previously as the cyclic unit step functions, which are also functions of the outphasing angle (as well as time).

Whenever $R_a$ and $R_b$ are constant, the differential equation can be solved in a piecewise manner for specific domains of time. The roots are calculated from:

$$\beta_1, \beta_2 = \frac{-\gamma_2}{2\gamma_1} \pm \sqrt{\frac{1}{4}\left(\frac{\gamma_2}{\gamma_1}\right)^2 - \frac{\gamma_3}{\gamma_1}}$$

where $R^a$, $R^b$ are constant.

The current through the inductor can be written as:

$$i_a = \frac{\gamma_0}{R_{SX_a}}il + \frac{d}{dt}\left(\frac{1}{C}\left(\frac{R_{SX_a}}{R_{SX_b}} + 1\right)\right)il$$

The classical solution occurs whenever both switches are open, which yields:

$$i_l = \frac{V_S}{L(\alpha_1 - \alpha_2)}(e^{-\alpha_2 t}e^{-\alpha_1 t}) + \text{initial conditions}$$

$$\alpha_1, \alpha_2 = \frac{-R_l}{2L} \pm \sqrt{\left(\frac{R}{L}\right)^2 \frac{1}{4} - \frac{1}{LC}}$$

Whenever the outphasing angles are small and both switches possess low values for $R_a$, $R_b$ then the previous analysis for cycling energy through the inductor applies for the times when switches are closed. When the switches open, the energy from the inductor is released and the load current becomes dominant as indicated by the classical solution.

The analysis is interesting when $\gamma_0$, $\gamma_1$, $\gamma_2$, $\gamma$ are time variant. It is best to treat them as quasi-constant over a single charge and discharge cycle. This is reasonable if the values of $R_a$ and $R_b$ vary according to $T_M$, the outphasing angle time delay. Fortunately, the envelope modulation rate is much less than the carrier rate for all practical scenarios of interest. With this, the first harmonics of the currents, $i_l$ and $i_a$ can be constrained such that;

$$\frac{i_{l_1}^2(T_M)}{2R_l} = A^2 \cos^2\left(\frac{\phi}{2}\right)$$

$i_{l_t}^2 \triangleq$ peak of the 1st harmonic (fundamental) flowing through $R_l$ This is the identical constraint placed on the inductor current given in the previous section. In that example, the load branch was non existent. The collapsing magnetic field of the inductor transfers energy in this example via the capacitor to $R_l$. Furthermore, the RLC circuit sets up a resonator with Q. The Q of the circuit in the R-L circuit example is lowered to attain the transfer characteristic. As the resistances $R_a(T_M)$, $R_b(T_M)$ are increased to lower the Q on the charging cycle the Fourier coefficient $a_1$, $b_1$ are modified in $i_a$ and $i_l$ to lower the power transferred to the load.

Figure 53:
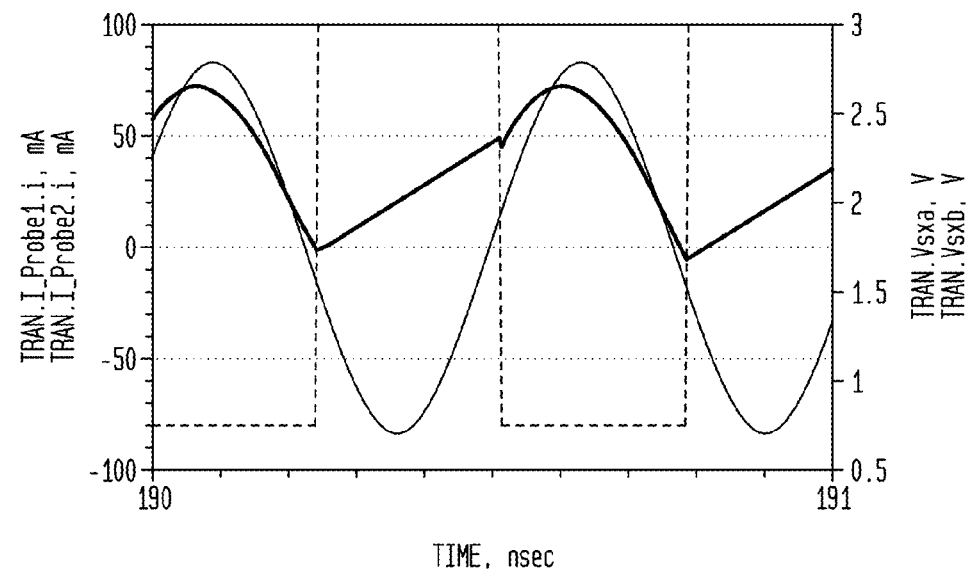
FIG. 53 illustrates the currents through the inductor and the load in the example circuit of FIG. 52.

FIG. 53 illustrates the currents through the inductor and the load in the example circuit of FIG. 52. FIG. 53 illustrates the cycles involved for storing energy in the inductor and the discharge into the load. Note that the current flowing in the load is filtered considerably by the tuned circuit.

Figure 54:
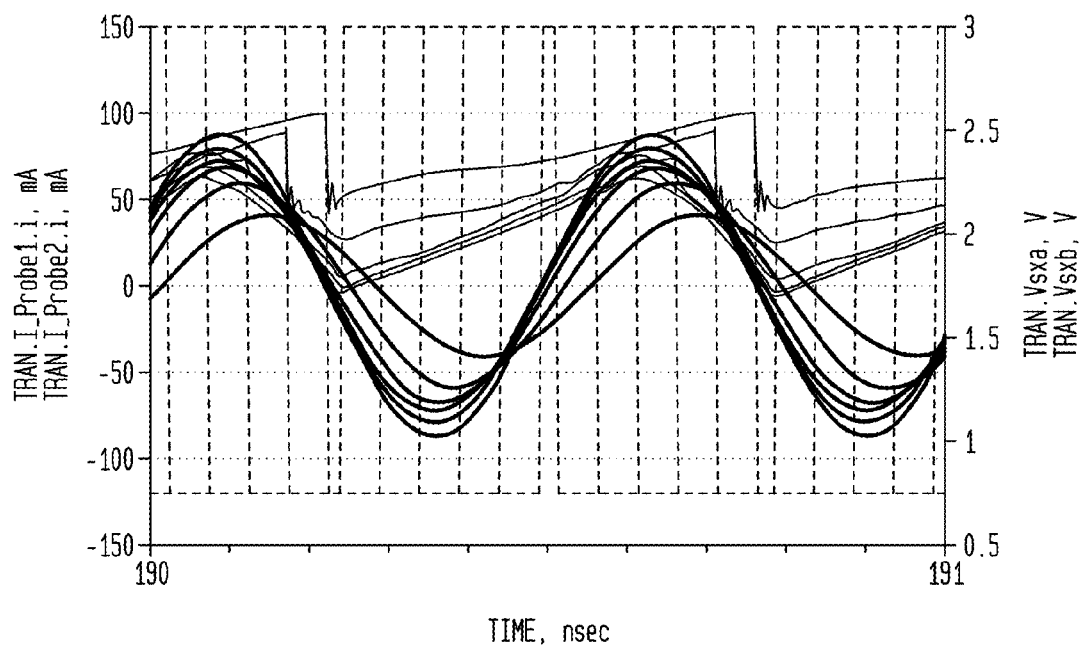
FIG. 54 illustrates the effect of varying the switch source resistances on the currents through the inductor and the load in the example circuit of FIG. 52.
Figure 55:
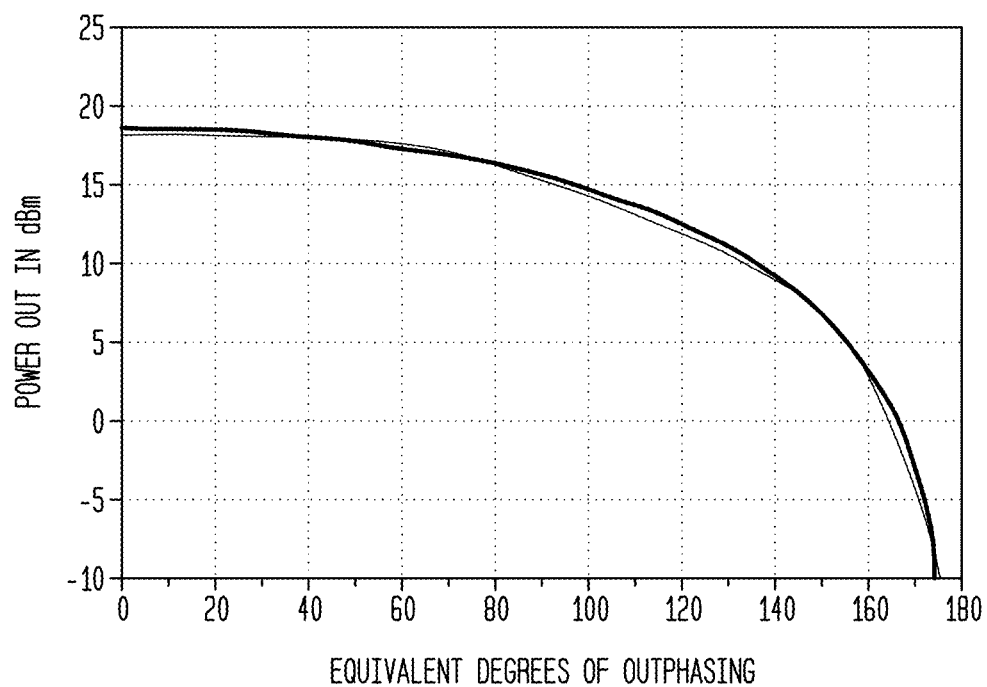
FIG. 55 illustrates an example plot of power output versus outphasing angle for a blended outphasing approach.

When the switch source resistances vary, outphasing produces the desired attenuation effect for large angles of $\phi$ as illustrated by FIG. 54. FIG. 54 illustrates the effect of varying the switch source resistances on the currents through the inductor and the load in the example circuit of FIG. 52.

(i) Blended Outphasing Efficiency

This section provides a heuristic explanation for the efficiency performance of blended outphasing, as presented in sections 7 and 8.

Using blended outphasing, in every case where modified switching impedances are utilized, the minimum switch resistance is selected for the operating points requiring maximum efficiency. Furthermore, maximum efficiency is tailored according to the waveform envelope statistic. Typically, the probability of low power levels on the signal envelope is low. Therefore, the low efficiency circumstances for the circuit are minimal.

Figure 56:
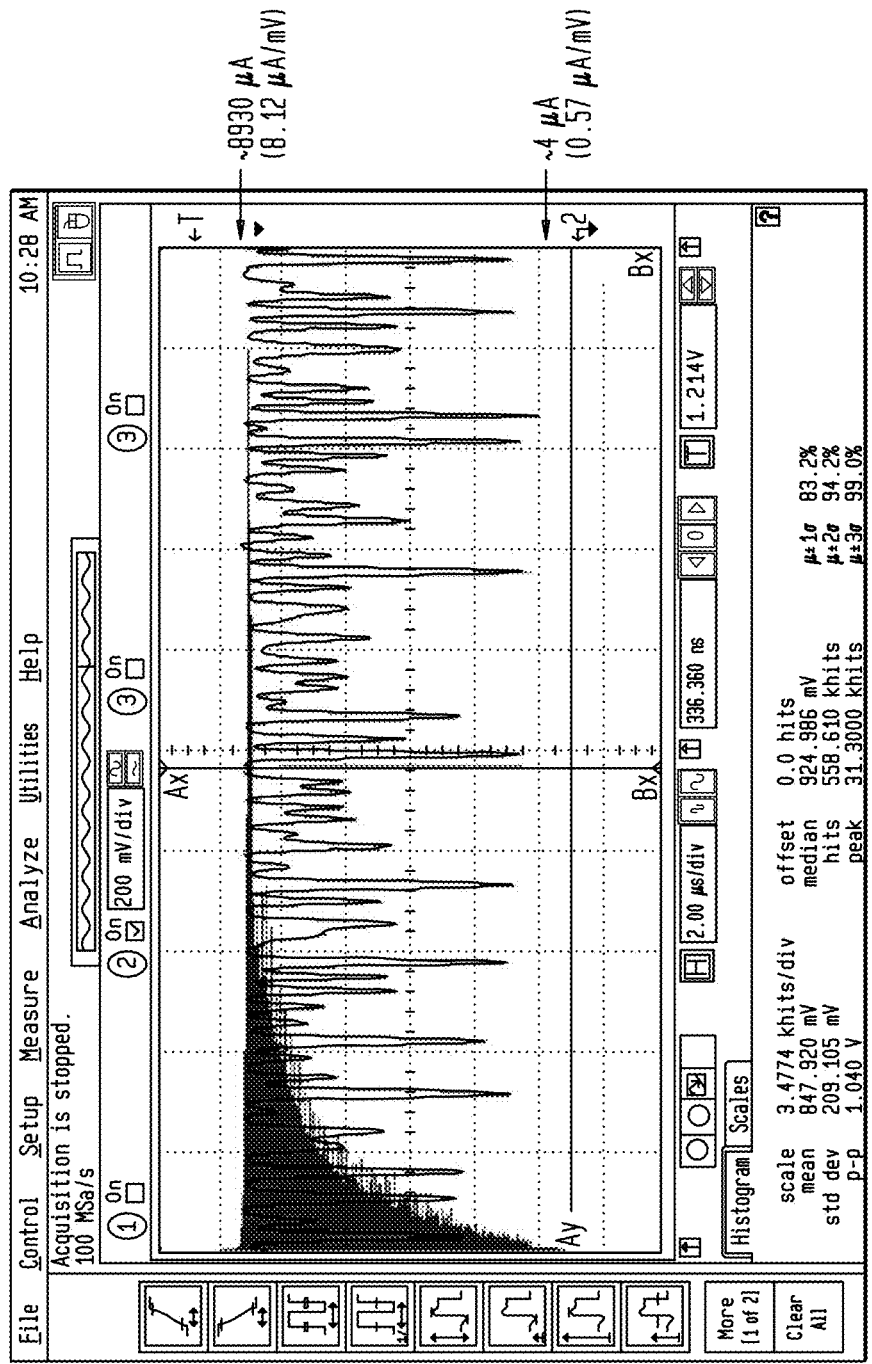
FIG. 56 illustrates a histogram associated with a WCDMA waveform.

FIG. 56 illustrates a histogram associated with the WCDMA waveform. As shown, the greatest average probabilities are associated with slight back off from the peaks. At these high levels, the switch resistances are low and therefore possess relatively small I-R losses. The inductive tank has very high Q's for these low outphasing angles. Occasionally the envelopes make large excursions or even experience zero crossings. While efficiency drops as outphasing increases, these events occur infrequently.

Efficiency is calculated from the power in the $1^{st}$ harmonic dissipated by the load divided by the total battery power required to supply the circuit. The previous section developed the expressions for $i_l$ and $i_0$ which permit the calculation. However, as pointed out in earlier analysis this calculation is not practical in closed form. Therefore, numerical analysis is typically preferred.

Thus, efficiency is usually optimized numerically according to:

$$\eta = \frac{\left(\frac{i_{l_1}^2}{2R_l}\right)}{(\bar{i}_{l_a} \cdot V_S)}$$

Figure 57:
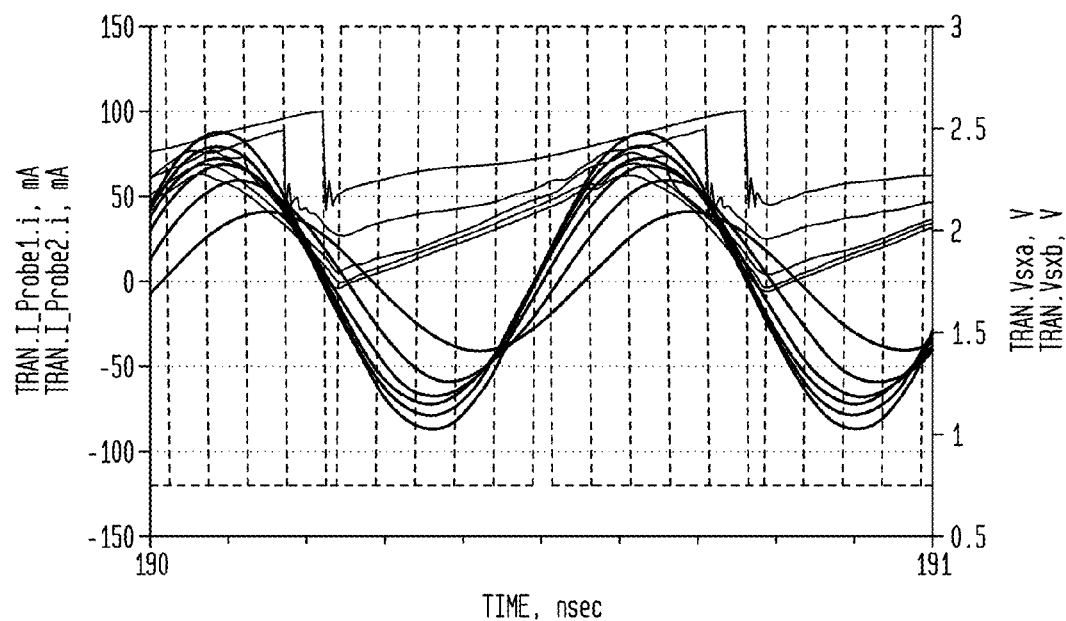
FIG. 57 illustrates the power output to the load in the example circuit of FIG. 52.

FIG. 57 illustrates the power output to the load as $T_M$ varies in the example circuit of FIG. 52.

Figure 58:
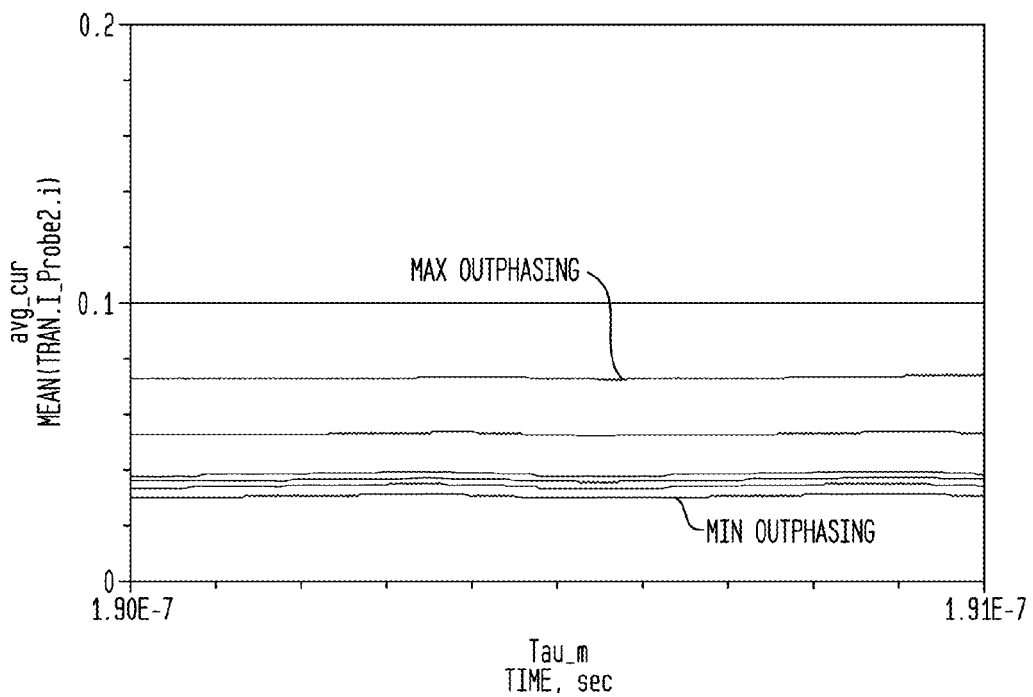
FIG. 58 illustrates the average DC current from battery in the example circuit of FIG. 52

FIG. 58 illustrates the average DC current from battery in the example circuit of FIG. 52

11. Summary

According to embodiments of the present invention, MISO amplifier/combiner circuits driven by VPA control algorithms outperform conventional outphasing amplifiers, including cascades of separate branch amplifiers and conventional power combiner technologies. Moreover, these circuits can be operated at enhanced efficiencies over the entire output power dynamic range by blending the control of the power source, source impedances, bias levels, outphasing, and branch amplitudes. These blending constituents are combined to provide an optimized transfer characteristic function, where optimization includes several aspects, including a well-behaved power transfer characteristic, overall efficiency on a per waveform basis, waveform specification performance such as enhanced EVM, ACPR, and unified architecture for all waveforms, i.e., universal waveform processor.

According to embodiments of the invention, VPA principles include the following.
  a. Power is transferred from the power source to the load with the greatest expediency. The number of levels of intermediate processing between the power source and the load is minimized.
  b. Consistent with a), power is not transferred through a power combiner.
  c. MISO inputs are controlled to direct the power flow from the power source directly to the load, while modifying the spectral content of the energy as it flows through the node. from the power supply branch to the output or load branch.
  d. Various controls are designed to optimize efficiency while maintaining performance specifications of signals by operating on the components of the complex envelope.
  e. The physical structure of the MISO is significantly different than traditional combiners in terms of impedance, frequency response, and time delay. These properties permit the effective application of the principles a) through d). Traditional combiners cannot easily accommodate principles a), b) or c).

Simulation, mathematical analysis, and lab data agree and indicate that the MISO, when combined with the blended control algorithms, outperforms today's complex technologies and approaches efficiencies far greater than any available technology, while accommodating the ever increasing complex waveforms demanded by the cell phone market.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for generating a radio frequency (RF) signal, the method comprising:
    generating, with a plurality of analog-to-digital converters, analog control signals;
    generating, with a modulator, a modulated control signal based on the analog control signals;
    generating, with an amplifier, a biased modulated control signal based on the modulated control signal and a first bias control signal; and
    generating the RF signal, with a multiple-input-single-output (MISO) device, based on the biased modulated control signal and a second bias control signal.

2. The method of claim 1, further comprising:
    generating, with another modulator, another modulated control signal; and
    generating, with another amplifier, another biased modulated control signal based on the another modulated control signal and a third bias control signal.

3. The method of claim 2, wherein the generating the RF signal comprises generating the RF signal based on the biased modulated control signal, the second bias control signal, and the another biased modulated control signal.

4. The method of claim 1, wherein the generating the biased modulated control signal comprises controlling an input drive of the amplifier with the first bias control signal.

5. The method of claim 1, wherein the generating the RF signal comprises controlling an input drive of the MISO device as a function of an envelope of the RF signal.

6. The method of claim 5, wherein the input drive of the MISO device approaches zero when the envelope of the RF signal undergoes a change in phase.

7. The method of claim 6, wherein the change in phase approaches 180 degrees.

8. The method of claim 1, wherein the generating the RF signal comprises compensating for an asymmetry in at least one of an amplitude and a phase in the modulated control signal and the biased modulated control signal.

9. The method of claim 1, wherein the generating the RF signal comprises concurrently adjusting the control signals, the first bias signal, and the second bias signal to change a phase in an envelope of the RF signal.

10. The method of claim 1, wherein the RF signal conforms to the EDGE, GSM, CDMA2000, WCDMA, OFDM, or WLAN communication standard.

11. An apparatus for generating a radio frequency (RF) signal, the apparatus comprising:
    a plurality of digital-to-analog converters (ADCs), wherein each of the ADCs is configured to generate an analog control signal;
    a modulator configured to generate a modulated control signal based on the analog control signals from the plurality of ADCs;
    an amplifier configured to generate a biased modulated control signal based on the modulated control signal and a first bias control signal and;
    a multiple-input-single-output (MISO) device configured to generate the RF signal based on the biased modulated control signal and a second bias control signal.

12. The apparatus of claim 11, further comprising:
    another modulator configured to generate another modulated control signal; and
    another amplifier configured to generate another biased modulated control signal based on the another modulated control signal and a third bias control signal.

13. The apparatus of claim 12, wherein the MISO device is configured to generate the RF signal based on the biased modulated control signal, the second bias control signal, and the another biased modulated control signal.

14. The apparatus of claim 11, wherein the first bias control signal is configured to control an input drive of the amplifier.

15. The apparatus of claim 11, wherein the second bias control signal is configured to control an input drive of the MISO device as a function of an envelope of the RF signal.

16. The apparatus of claim 15, wherein the input drive of the MISO device approaches zero when the envelope of the RF signal undergoes a change in phase.

17. The apparatus of claim 16, wherein the change in phase approaches 180 degrees.

18. The apparatus of claim 11, wherein the first and second bias control signals are configured to compensate for an asymmetry in at least one of an amplitude and a phase in the modulated control signal and the biased modulated control signal.

19. The apparatus of claim 11, wherein the control signals received by the ADCs, the first bias signal, and the second bias signal are adjusted concurrently to change a phase in an envelope of the RF signal.

20. The apparatus of claim 11, wherein the RF signal conforms to the EDGE, GSM, CDMA2000, WCDMA, OFDM, or WLAN communication standard.

* * * * *